US012666868B2

(12) United States Patent
Niikura et al.

(10) Patent No.: US 12,666,868 B2
(45) Date of Patent: Jun. 23, 2026

(54) METHOD FOR MANUFACTURING ORGANIC EL DEVICE

(71) Applicant: SEMICONDUCTOR ENERGY LABORATORY CO., LTD., Atsugi (JP)

(72) Inventors: Yasuhiro Niikura, Tokyo (JP); Sachiko Kawakami, Atsugi (JP); Naoaki Hashimoto, Sagamihara (JP); Yui Yoshiyasu, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 510 days.

(21) Appl. No.: 18/305,772

(22) Filed: Apr. 24, 2023

(65) Prior Publication Data

US 2023/0354704 A1 Nov. 2, 2023

(30) Foreign Application Priority Data

Apr. 29, 2022 (JP) ................................ 2022-075595
Dec. 7, 2022 (JP) ................................ 2022-195407

(51) Int. Cl.
*H10K 50/16* (2023.01)
*H05B 33/10* (2006.01)
(Continued)

(52) U.S. Cl.
CPC ......... *H10K 85/6572* (2023.02); *H05B 33/10* (2013.01); *H10K 50/13* (2023.02);
(Continued)

(58) Field of Classification Search
CPC .... H10K 85/6572; H10K 50/13; H10K 50/16; H10K 59/805; H10K 71/231; H05B 33/10
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-036385 A 2/2000
JP 2003-059663 A 2/2003
(Continued)

OTHER PUBLICATIONS

Sasaki.T et al., "Unravelling the electron injection/transport mechanism in organic light-emitting diodes", Nature Communications, May 11, 2021, vol. 12, pp. 2706-1-2706-8.
(Continued)

*Primary Examiner* — Victor A Mandala
*Assistant Examiner* — Colleen E Snow
(74) *Attorney, Agent, or Firm* — Fish & Richardson P.C.

(57) ABSTRACT

An increase in voltage of a light-emitting device manufactured through a step of forming an aluminum oxide film in contact with an organic compound layer is inhibited. An organic compound film is formed over a first electrode. An organic mask film containing an organic compound which has low solubility to water or a chemical solution including water as a solvent is formed over the organic compound film. An inorganic mask layer is formed over the organic mask film. Shapes of the organic mask film and the organic compound film are processed with the use of the inorganic mask layer, whereby an organic mask layer and an organic compound layer are formed. At least parts of the inorganic mask layer and the organic mask layer are removed with the use of water or a liquid including water as a solvent.

16 Claims, 25 Drawing Sheets

(51) Int. Cl.
*H10K 50/13* (2023.01)
*H10K 59/80* (2023.01)
*H10K 71/20* (2023.01)
*H10K 85/60* (2023.01)

(52) U.S. Cl.
CPC .......... *H10K 50/16* (2023.02); *H10K 59/805* (2023.02); *H10K 71/231* (2023.02)

(56) References Cited

U.S. PATENT DOCUMENTS

| | | | |
|---|---|---|---|
| 10,862,036 | B2 | 12/2020 | Ke et al. |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2023/0200104 | A1 | 6/2023 | Yamazaki et al. |

FOREIGN PATENT DOCUMENTS

| | | | |
|---|---|---|---|
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Before immersion: Sample 2A

After immersion: Sample 2A

Before immersion: Sample 2B

After immersion: Sample 2B

METHOD FOR MANUFACTURING ORGANIC EL DEVICE

BACKGROUND OF THE INVENTION

1. Field of the Invention

One embodiment of the present invention relates to an organic compound, an organic EL device, a display module, a lighting module, a display apparatus, a light-emitting apparatus, an electronic apparatus, a lighting device, and an electronic device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

2. Description of the Related Art

Organic electroluminescence (EL) devices containing organic compounds and utilizing EL have been put into practical use. In the basic structure of such organic EL devices, an organic compound layer containing a light-emitting material (an EL layer) is interposed between a pair of electrodes. Carriers are injected by application of voltage to the device, and recombination energy of the carriers is used, whereby light emission can be obtained from the light-emitting material.

Such organic EL devices are of self-luminous type and thus have advantages over liquid crystal displays, such as high visibility and no need for backlight when used as pixels of a display, and are particularly suitable for flat panel displays. Displays including such organic EL devices are also highly advantageous in that they can be thin and lightweight. Moreover, such light-emitting devices also have a feature that response speed is extremely fast.

Since light-emitting layers of such organic EL devices can be successively formed two-dimensionally, planar light emission can be achieved. This feature is difficult to achieve with point light sources typified by incandescent lamps and LEDs or linear light sources typified by fluorescent lamps; thus, the light-emitting devices also have great potential as planar light sources, which can be used for lighting devices and the like.

Light-emitting apparatuses including organic EL devices can be used suitably for a variety of electronic apparatuses as described above, and research and development of organic EL devices have progressed for more favorable characteristics.

In order to obtain a higher-resolution light-emitting apparatus using an organic EL device, patterning an organic layer by a photolithography method using a photoresist or the like, instead of an evaporation method using a metal mask, has been studied. By using the photolithography method, a high-resolution light-emitting apparatus in which a distance between EL layers is several micrometers can be obtained (see Patent Document 1, for example).

REFERENCE

Patent Document

[Patent Document 1] Japanese Translation of PCT International Application No. 2018-521459

SUMMARY OF THE INVENTION

As a method for forming an organic compound film in a predetermined shape, a vacuum evaporation method with a metal mask (mask vapor deposition) is widely used. However, in these days of higher density and higher resolution, mask vapor deposition has come close to the limit of increasing the resolution for various reasons such as the alignment accuracy and the distance between the mask and the substrate. By contrast, a finer pattern can be formed by shape processing of an organic compound film by a photolithography method. In particular, finer processing is possible with the use of a hard mask layer formed of an inorganic film made of a metal or a metal compound in processing an organic compound film. Moreover, because of the easiness of large-area processing, processing of an organic compound film by a photolithography method is being researched.

However, it is necessary to solve many problems in order that the shape of the organic compound film can be processed by the photolithography method. Specific problems are an effect of exposure of the organic compound film to the air, an effect of light irradiation in light exposure of a photosensitive resin, an effect of a chemical solution such as a developer used in developing the exposed photosensitive resin, and the like. Furthermore, the use of an inorganic film as a hard mask layer brings problems such as an effect of a step of forming an inorganic film, and an effect of a chemical solution or a cleaning solution used in removing the inorganic film.

That is, because of light exposure, an effect at the time of formation of a film to be a hard mask, or a chemical solution used in a step of removing a resist mask or a hard mask layer, an organic compound might deteriorate, an organic compound film might disappear, or the surface of the organic compound film might be damaged, leading to great deterioration of the characteristics of a device to be manufactured later. In particular, in the case where a film to be a hard mask is formed by a sputtering method, layers thereunder might be damaged.

In view of the above, an object of one embodiment of the present invention is to inhibit an increase in voltage of an organic EL device manufactured through a step of processing an organic compound film by a photolithography method. Another object of one embodiment of the present invention is to provide an organic EL device having favorable characteristics, which is manufactured through a step of processing an organic compound film with the use of a hard mask layer.

Another object of one embodiment of the present invention is to provide a novel organic compound that is highly convenient, useful, or reliable. Another object of one embodiment of the present invention is to provide a semiconductor device with high design flexibility. Another object of one embodiment of the present invention is to provide an organic EL device with high design flexibility in a manufacturing process. Another object of one embodiment of the present invention is to provide a highly reliable organic EL device.

Note that the description of these objects does not preclude the existence of other objects. In one embodiment of the present invention, there is no need to achieve all these objects. Other objects will be apparent from and can be derived from the description of the specification, the drawings, the claims, and the like.

Thus, in one embodiment of the present invention, an organic compound film is formed over a first electrode; an organic mask film containing an organic compound represented by General Formula (G1) below is formed over the organic compound film; an inorganic mask layer is formed over the organic mask film; an organic mask layer and an organic compound layer are formed by processing the shapes of the organic mask film and the organic compound film with the use of the inorganic mask layer; and at least parts of the inorganic mask layer and the organic mask layer are removed with the use of water or a liquid including water as a solvent.

[Chemical Formula 1]

(G1)

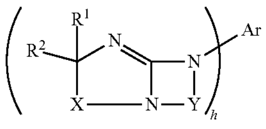

In the organic compound represented by General Formula (G1) above, X represents a group represented by General Formula (X1-1) below, and Y represents a group represented by General Formula (Y1-1) below. In addition, each of $R^1$ and $R^2$ independently represents hydrogen (including deuterium), h represents an integer of 1 to 6, and Ar represents a substituted or unsubstituted aryl group having 6 to 75 carbon atoms in a ring or a substituted or unsubstituted heteroaryl group having 6 to 75 carbon atoms in a ring.

[Chemical Formula 2]

(X1-1)

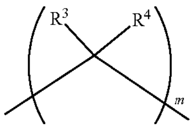

(Y1-1)

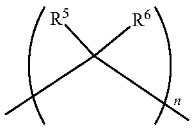

In General Formulae (X1-1) and (Y1-1) above, each of $R^3$ to $R^6$ independently represents hydrogen (including deuterium), m represents an integer of 0 to 4, and n represents an integer of 1 to 5. In the case where m or n is 2 or more, $R^3$s may be the same or different from each other, and the same applies to $R^4$, $R^5$, and $R^6$.

In one embodiment of the present invention, an organic compound film is formed over a first electrode; an organic mask film containing an organic compound represented by any one of General Formulae (GT-1) to (GT-9) below is formed over the organic compound film; an inorganic mask layer is formed over the organic mask film; an organic mask layer and an organic compound layer are formed by processing the shapes of the organic mask film and the organic compound film with the use of the inorganic mask layer; and at least parts of the inorganic mask layer and the organic mask layer are removed with the use of water or a liquid including water as a solvent.

[Chemical Formula 3]

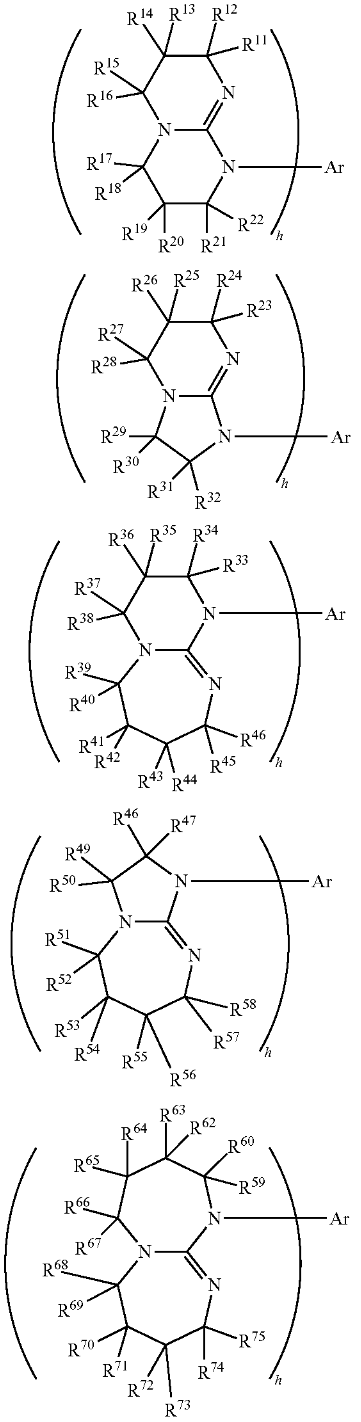

-continued

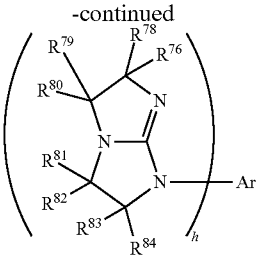

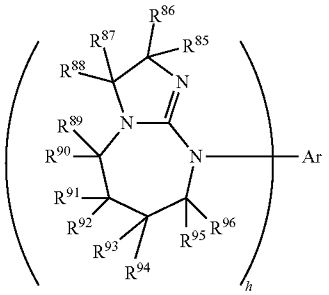

In the organic compounds represented by General Formulae (G1-1) to (G1-9) above, each of $R^{11}$ to $R^{120}$ independently represents hydrogen (including deuterium), h represents an integer of 1 to 6, and Ar represents a substituted or unsubstituted aryl group having 6 to 75 carbon atoms in a ring or a substituted or unsubstituted heteroaryl group having 1 to 75 carbon atoms in a ring.

In one embodiment of the present invention, an organic compound film is formed over a first electrode; an organic mask film containing an organic compound represented by General Formula (G2) below is formed over the organic compound film; an inorganic mask layer is formed over the organic mask film; an organic mask layer and an organic compound layer are formed by processing the shapes of the organic mask film and the organic compound film with the use of the inorganic mask layer; and at least parts of the inorganic mask layer and the organic mask layer are removed with the use of water or a liquid including water as a solvent.

[Chemical Formula 4]

(G2)

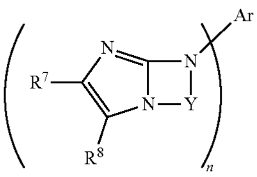

In the organic compound represented by General Formula (G2) above, Ar represents a substituted or unsubstituted aryl group having 6 to 30 carbon atoms in a ring or a substituted or unsubstituted heteroaryl group having 2 to 30 carbon atoms in a ring, each of $R^7$ and $R^8$ independently represents hydrogen (including deuterium), a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, and n represents an integer of 1 to 6. In the case where n is 2 or more, $R^7$s may be the same or different from each other, and the same applies to $R^8$. Furthermore, L represents a group represented by General Formula (L1-1) below.

[Chemical Formula 5]

(L1-1)

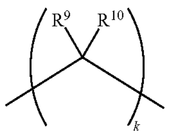

In General Formula (L1-1) above, each of $R^9$ and $R^{10}$ independently represents hydrogen (including deuterium) or a substituted or unsubstituted alkyl group having 1 to 6 carbon atoms, and k represents an integer of 1 to 5. In the case where k is 2 or more, $R^9$s may be the same or different from each other, and the same applies to $R^{10}$ .

In one embodiment of the present invention, an organic compound film is formed over a first electrode; an organic mask film containing an organic compound represented by any one of General Formulae (G2-1) to (G2-3) below is formed over the organic compound film; an inorganic mask layer is formed over the organic mask film; an organic mask layer and an organic compound layer are formed by processing the shapes of the organic mask film and the organic compound film with the use of the inorganic mask layer; and at least parts of the inorganic mask layer and the organic mask layer are removed with the use of water or a liquid including water as a solvent.

[Chemical Formula 6]

(G2-1)

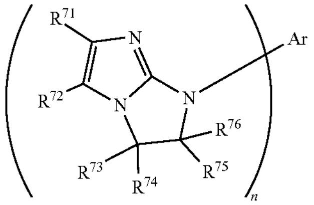

(G2-2)

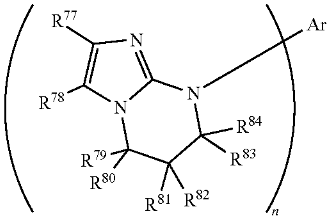

(G2-3)

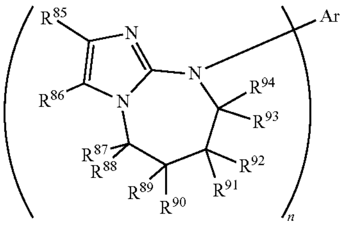

In the organic compounds represented by General Formulae (G2-1) to (G2-3) above, Ar represents a substituted or unsubstituted aryl group having 6 to 30 carbon atoms in a ring or a substituted or unsubstituted heteroaryl group having 2 to 30 carbon atoms in a ring, each of $R^{71}$ to $R^{94}$ independently represents hydrogen (including deuterium) or a substituted or unsubstituted alkyl group having 1 to 6 carbon atoms, and n represents an integer of 1 to 6. In the case where n is 2 or more, $R^{71}$s may be the same or different from each other, and the same applies to $R^{72}$ to $R^{94}$.

In one embodiment of the present invention, an organic compound film is formed over a first electrode; an organic mask film containing an organic compound represented by General Formula (G1) below is formed over the organic compound film; an inorganic mask film is formed over the organic mask film; a hard mask film is formed over the inorganic mask film; a hard mask layer and an inorganic mask layer are formed by processing the shape of the hard mask film by a lithography method; an organic compound layer is formed by processing the shapes of the organic mask film and the organic compound film with the use of the hard mask layer and the inorganic mask layer; at least part of the inorganic mask layer and the hard mask layer are removed; the organic compound layer is exposed by removing at least parts of the organic mask layer and the inorganic mask layer with the use of water or a liquid including water as a solvent; and a second electrode is formed over the organic compound layer.

[Chemical Formula 7]

(G1)

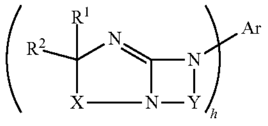

In the organic compound represented by General Formula (G1) above, X represents a group represented by General Formula (X1-1) below, and Y represents a group represented by General Formula (Y1-1) below. In addition, each of $R^1$ and $R^2$ independently represents hydrogen (including deuterium), h represents an integer of 1 to 6, and Ar represents a substituted or unsubstituted heteroaryl group having 1 to 75 carbon atoms in a ring or a substituted or unsubstituted aryl group having 6 to 75 carbon atoms in a ring. In the case where h is 2 or more, $R^1$s may be the same or different from each other, and the same applies to $R^2$.

[Chemical Formula 8]

(X1-1)

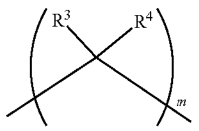

(Y1-1)

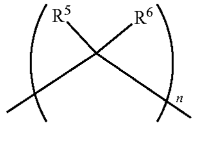

In General Formulae (X1-1) and (Y1-1) above, each of $R^3$ to $R^6$ independently represents hydrogen (including deuterium), m represents an integer of 0 to 4, and n represents an integer of 1 to 5. In the case where m or n is 2 or more, $R^3$s may be the same or different from each other, and the same applies to $R^4$, $R^5$, and $R^6$.

In one embodiment of the present invention, an organic compound film is formed over a first electrode; an organic mask film containing an organic compound represented by General Formula (G2) below is formed over the organic compound film; an inorganic mask film is formed over the organic mask film; a hard mask film is formed over the inorganic mask film; a hard mask layer and an inorganic mask layer are formed by processing the shape of the hard mask film by a lithography method; an organic compound layer is formed by processing the shapes of the organic mask film and the organic compound film with the use of the hard mask layer and the inorganic mask layer; at least part of the inorganic mask layer and the hard mask layer are removed; the organic compound layer is exposed by removing at least parts of the organic mask layer and the inorganic mask layer with the use of water or a liquid including water as a solvent; and a second electrode is formed over the organic compound layer.

[Chemical Formula 9]

(G2)

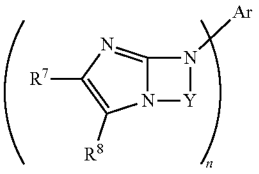

In the organic compound represented by General Formula (G2) above, Ar represents a substituted or unsubstituted aryl group having 6 to 30 carbon atoms in a ring or a substituted or unsubstituted heteroaryl group having 2 to 30 carbon atoms in a ring, each of $R^7$ and $R^8$ independently represents hydrogen (including deuterium), a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, and n represents an integer of 1 to 6. In the case where n is 2 or more, $R^7$s may be the same or different from each other, and the same applies to $R^8$. Furthermore, L represents a group represented by General Formula (L1-1) below.

[Chemical Formula 10]

(L1-1)

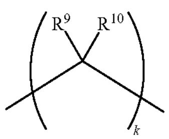

In General Formula (L1-1) above, each of $R^9$ and $R^{10}$ independently represents hydrogen (including deuterium) or a substituted or unsubstituted alkyl group having 1 to 6 carbon atoms, and k represents an integer of 1 to 5. In the case where k is 2 or more, $R^9$s may be the same or different from each other, and the same applies to $R^{10}$ .

In the present invention, the hard mask layer is formed by a sputtering method.

In the present invention, the inorganic mask layer is formed by an atomic layer deposition (ALD) method.

In the present invention, the organic mask layer is formed by a vacuum evaporation method.

In the present invention, the organic compound layer has a stacked-layer structure and includes a hole-injection layer, a hole-transport layer, a light-emitting layer, and an electron-transport layer in this order from the first electrode side.

In one embodiment of the present invention, a first electrode, a second electrode, a first organic compound layer, and an organic mask layer containing an organic compound represented by General Formula (G1) below are included. The first organic compound layer is positioned between the first electrode and the second electrode. The organic mask layer is positioned between the first organic compound layer and the second electrode. A side surface of the first organic compound layer and a side surface of the organic mask layer are substantially aligned with each other.

[Chemical Formula 11]

(G2)

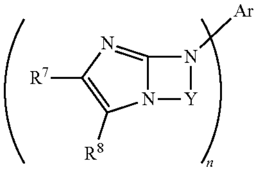

In the organic compound represented by General Formula (G2) above, Ar represents a substituted or unsubstituted aryl group having 6 to 30 carbon atoms in a ring or a substituted or unsubstituted heteroaryl group having 2 to 30 carbon atoms in a ring, each of $R^7$ and $R^8$ independently represents hydrogen (including deuterium), a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, and n represents an integer of 1 to 6. In the case where n is 2 or more, $R^7$s may be the same or different from each other, and the same applies to $R^8$. Furthermore, L represents a group represented by General Formula (L1-1) below.

[Chemical Formula 12]

(L1-1)

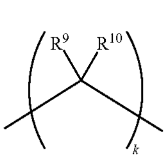

In General Formula (L1-1) above, each of $R^9$ and $R^{10}$ independently represents hydrogen (including deuterium) or a substituted or unsubstituted alkyl group having 1 to 6 carbon atoms, and k represents an integer of 1 to 5. In the case where k is 2 or more, $R^9$s may be the same or different from each other, and the same applies to $R^{10}$ .

One embodiment of the present invention is an organic EL device including a first electrode, a second electrode, a first organic compound layer, an organic mask layer containing an organic compound represented by General Formula (G1) below, and a second organic compound layer. The first organic compound layer is positioned between the first electrode and the second electrode. The organic mask layer is positioned between the first organic compound layer and the second electrode. The second organic compound layer is positioned between the organic mask layer and the second electrode. A side surface of the first organic compound layer and a side surface of the organic mask layer are substantially aligned with each other. A side surface of the second organic compound layer is aligned with neither the side surface of the first organic compound layer nor the side surface of the organic mask layer.

[Chemical Formula 13]

(G2)

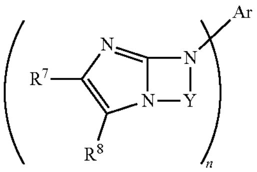

In the organic compound represented by General Formula (G2) above, Ar represents a substituted or unsubstituted aryl group having 6 to 30 carbon atoms in a ring or a substituted or unsubstituted heteroaryl group having 2 to 30 carbon atoms in a ring, each of $R^7$ and $R^8$ independently represents hydrogen (including deuterium), a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, and n represents an integer of 1 to 6. In the case where n is 2 or more, $R^7$s may be the same or different from each other, and the same applies to $R^8$. Furthermore, L represents a group represented by General Formula (L1-1) below.

[Chemical Formula 14]

(L1-1)

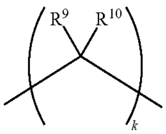

In General Formula (L1-1) above, each of $R^9$ and $R^{10}$ independently represents hydrogen (including deuterium) or a substituted or unsubstituted alkyl group having 1 to 6 carbon atoms, and k represents an integer of 1 to 5. In the case where k is 2 or more, $R^9$s may be the same or different from each other, and the same applies to $R^{10}$ .

In the present invention, the first organic compound layer includes a light-emitting layer.

Note that the light-emitting apparatus in this specification includes, in its category, an image display device that uses an organic EL device. The light-emitting apparatus may also include a module in which an organic EL device is provided with a connector such as an anisotropic conductive film or a tape carrier package (TCP), a module in which a printed wiring board is provided at the end of a TCP, and a module in which an integrated circuit (IC) is directly mounted on an organic EL device by a chip on glass (COG) method. Furthermore, a lighting device or the like may include the light-emitting apparatus.

In one embodiment of the present invention, the organic compound film can be protected from a light exposure step and air exposure. In another embodiment of the present invention, an increase in voltage of an organic EL device manufactured through a step of processing an organic compound film by a photolithography method can be inhibited. In another embodiment of the present invention, an organic EL device having favorable characteristics, which is manufactured through a step of processing an organic compound film with the use of a hard mask layer, can be provided.

In another embodiment of the present invention, a novel organic compound that is highly convenient, useful, or reliable can be provided. In another embodiment of the present invention, a semiconductor device with high design flexibility can be provided. In another embodiment of the present invention, an organic EL device with high design flexibility in a manufacturing process can be provided. In another embodiment of the present invention, a highly reliable organic EL device can be provided.

Note that the description of these effects does not preclude the existence of other effects. One embodiment of the present invention does not necessarily have all the effects. Other effects will be apparent from and can be derived from the description of the specification, the drawings, the claims, and the like.

BRIEF DESCRIPTION OF THE DRAWINGS

In the accompanying drawings:

FIGS. 14A, 14B1, 14B2, and 14C illustrate electronic apparatuses;

DETAILED DESCRIPTION OF THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

In this specification and the like, a film that is not processed into any shape after being formed is referred to as a "film", and a film that is processed into a shape after being formed is referred to as a "layer" in many cases. However, they are distinguished mainly for easy understanding of the progress of the process, and there is no big difference between them, whereby a "film" can be read as a "layer", and a "layer" can be read as a "film". In particular, both of them have the same meaning in a description that does not refer to a processing step.

Embodiment 1

Figure 2A:
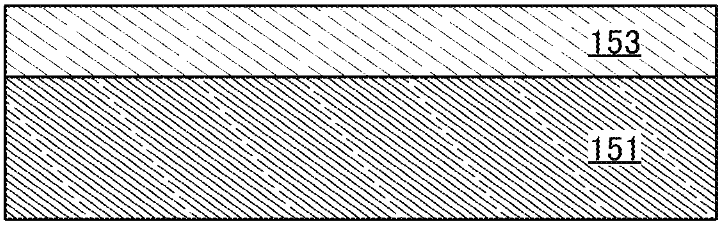
FIGS. 2A to 2C illustrate a conventional structure.

As illustrated in FIG. 2A, an inorganic mask film 153 is preferably provided over and in contact with an organic compound film 151 as a protective film as one means of protecting the organic compound film from a light exposure step and air exposure. For example, an inorganic mask film can be formed to be dense and is highly capable of blocking a liquid and a gas, and thus the adverse effects caused by the step can be inhibited.

An aluminum oxide film can be used as the inorganic mask film 153. The aluminum oxide film can be formed by a method that enables a dense film and less damage to lower layers, such as an atomic layer deposition (ALD) method, and is extremely suitable as the protective film for the organic compound film 151.

Figure 2B:
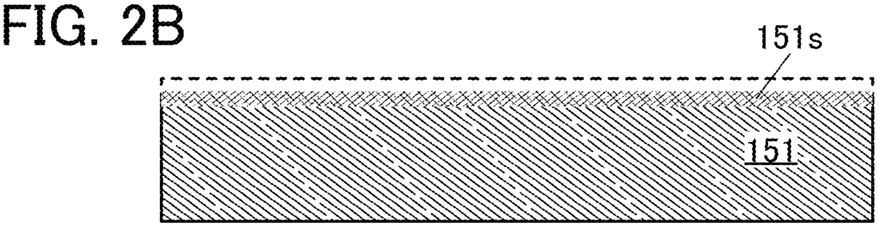

Meanwhile, the inorganic mask film needs to be removed. When the surface of the organic compound film is exposed excessively to a chemical solution, a cleaning solution, or the like used in the step of removing the inorganic mask film, a surface 151*s* of the organic compound film 151 is damaged as illustrated in FIG. 2B, which might result in deterioration of characteristics of the organic compound.

Figure 2C:
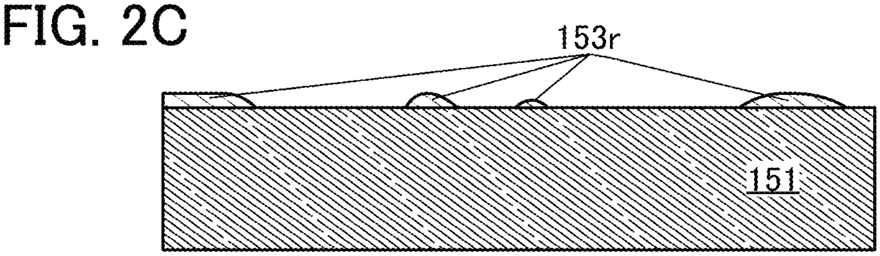

In the case where the inorganic mask film is not completely removed and part thereof remains as illustrated in FIG. 2C, defects such as rise in drive voltage are highly likely to be caused in a completed device.

Thus, in one embodiment of the present invention, an organic mask film 152 containing an organic compound having a specific structure is provided between the organic compound film 151 and the inorganic mask film 153 as illustrated in FIG. TA.

Note that a material that has heat resistance or stability can be used for the organic mask film (hereinafter also referred to as a mask film). That is, providing the organic mask film 152 can inhibit an adverse effect on the organic compound film 151 in formation of a film to be a hard mask and the inorganic mask film 153. Accordingly, without limitation on a material or a formation method of the hard mask or the inorganic mask film 153, the design flexibility of an organic EL device can be improved.

Furthermore, the organic mask film 152 can be removed more easily than the inorganic mask film 153 and sometimes functions as a separation layer. Thus, the organic mask film 152 and the inorganic mask film 153 can be removed without an adverse effect on the organic compound film 151.

The organic mask film 152 is preferably formed using a material that does not greatly deteriorate the device characteristics (e.g., a material that does not increase voltage). In particular, a film that functions as an electron-injection layer or an electron-transport layer may be used as the organic mask film 152. In the case where a material that does not greatly deteriorate the device characteristics or a film that functions as an electron-injection layer or an electron-transport layer is used, the organic mask film 152 is not necessarily completely removed and part or the whole of the organic mask film 152 may remain as illustrated in FIG. 1C.

An organic compound represented by General Formula (G1) below can be used for the organic mask layer.

[Chemical Formula 15]

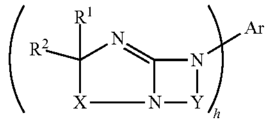

(G1)

In the organic compound represented by General Formula (G1) above, X represents a group represented by General Formula (X1-1) below, and Y represents a group represented by General Formula (Y1-1) below. In addition, each of $R^1$ and $R^2$ independently represents hydrogen (including deuterium), and h represents an integer of 1 to 6. In the case where h is 2 or more, $R^1$s may be the same or different from each other, and the same applies to $R^2$. Furthermore, Ar represents a substituted or unsubstituted aryl group having 6 to 75 carbon atoms in a ring or a substituted or unsubstituted heteroaryl group having 1 to 75 carbon atoms in a ring.

Examples of the aryl group represented by Ar include a phenyl group, a biphenyl group, a naphthyl group, a fluorenyl group, a phenanthrenyl group, and an anthryl group.

Examples of the heteroaryl group represented by Ar include a pyridine ring, a pyrimidine ring, a triazine ring, a phenanthroline ring, a carbazole ring, a pyrrole ring, a thiophene ring, a furan ring, an imidazole ring, a bipyridine ring, a bipyrimidine ring, a pyrazine ring, a bipyrazine ring, a quinoline ring, an isoquinoline ring, a benzoquinoline ring, a quinoxaline ring, a benzoquinoxaline ring, a dibenzoquinoxaline ring, an azofluorene ring, a diazofluorene ring, a benzocarbazole ring, a dibenzocarbazole ring, a dibenzofuran ring, a benzonaphthofuran ring, a dinaphthofuran ring, a dibenzothiophene ring, a benzonaphthothiophene ring, a dinaphthothiophene ring, a benzofuropyridine ring, a benzofuropyrimidine ring, a benzothiopyridine ring, a benzothiopyrimidine ring, a naphthofuropyridine ring, a naphthofuropyrimidine ring, a naphthothiopyridine ring, a naphthothiopyrimidine ring, a dibenzoquinoxaline ring, an acridine ring, a xanthene ring, a phenothiazine ring, a phenoxazine ring, a phenazine ring, a triazole ring, an oxazole ring, an oxadiazole ring, a thiazole ring, a thiadiazole ring, a benzimidazole ring, and a pyrazole ring.

[Chemical Formula 16]

(X1-1)

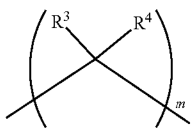

(Y1-1)

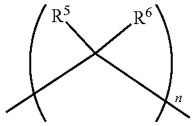

In General Formulae (X1-1) and (Y1-1) above, each of $R^3$ to $R^6$ independently represents hydrogen (including deuterium), m represents an integer of 0 to 4, and n represents an integer of 1 to 5. In the case where m or n is 2 or more, $R^3$s may be the same or different from each other, and the same applies to $R^4$, $R^5$, and $R^6$.

For example, the organic compound represented by General Formula (G1) above is preferably any one of compounds represented by General Formulae (GT-1) to (GT-9) below.

[Chemical Formula 17]

(G1-1)

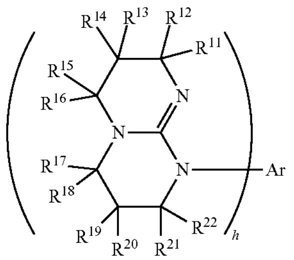

(G1-2)

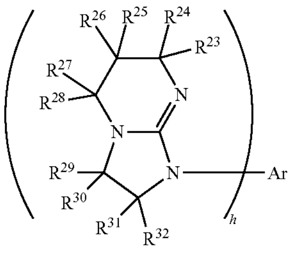

(G1-3)

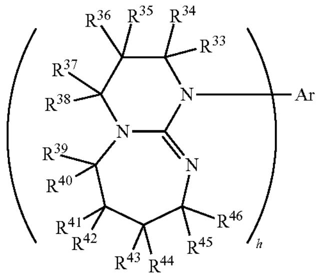

-continued (G1-4)

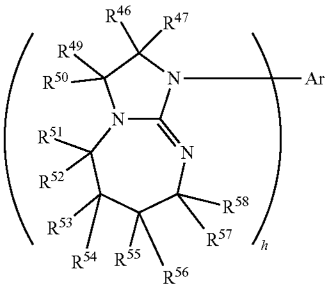

(G1-5)

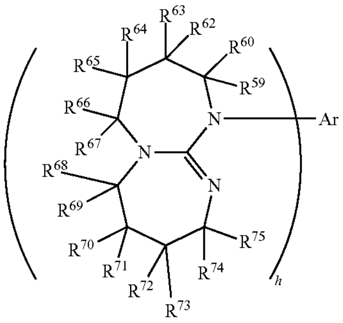

(G1-6)

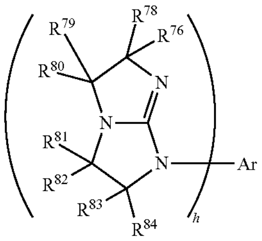

(G1-7)

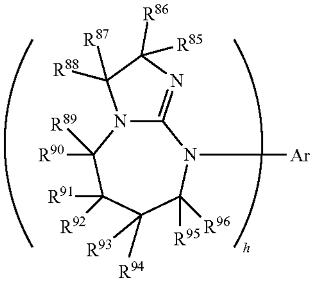

(G1-8)

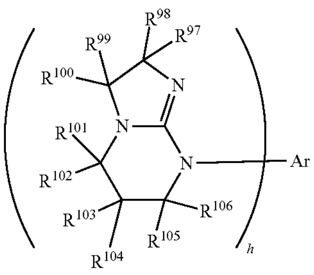

-continued (G1-9)

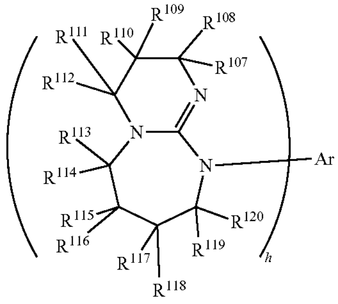

In the organic compounds represented by General Formulae (GT-1) to (GT-9) above, each of $R^{11}$ to $R^{120}$ independently represents hydrogen (including deuterium), and h represents an integer of 1 to 6. In the case where h is 2 or more, $R^{11}$s may be the same or different from each other, and the same applies to $R^{12}$ to $R^{120}$. Furthermore, Ar represents a substituted or unsubstituted aryl group having 6 to 75 carbon atoms in a ring or a substituted or unsubstituted heteroaryl group having 1 to 75 carbon atoms in a ring.

Note that the description of the substituent used for Ar in General Formula (G1) above can be referred to for the substituent that can be used for Ar in any of General Formulae (G1-1) to (G1-9).

An organic compound represented by General Formula (G2) below can be used for the organic mask layer.

[Chemical Formula 18]

(G2)

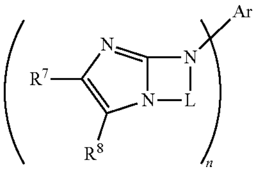

In the organic compound represented by General Formula (G2) above, Ar represents a substituted or unsubstituted aryl group having 6 to 30 carbon atoms in a ring or a substituted or unsubstituted heteroaryl group having 2 to 30 carbon atoms in a ring, each of $R^7$ and $R^8$ independently represents hydrogen (including deuterium), a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, and n represents an integer of 1 to 6. In the case where n is 2 or more, $R^7$s may be the same or different from each other, and the same applies to $R^8$. Furthermore, L represents a group represented by General Formula (L1-1) below.

[Chemical Formula 19]

(L1-1)

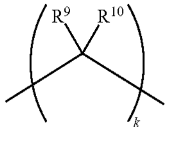

In General Formula (L1-1) above, each of $R^9$ and $R^{10}$ independently represents hydrogen (including deuterium) or a substituted or unsubstituted alkyl group having 1 to 6 carbon atoms, and k represents an integer of 1 to 5. In the case where k is 2 or more, $R^9$s may be the same or different from each other, and the same applies to $R^{10}$.

For example, the organic compound represented by General Formula (G2) above is preferably any one of compounds represented by General Formulae (G2-1) to (G2-3) below.

[Chemical Formula 20]

(G2-1)

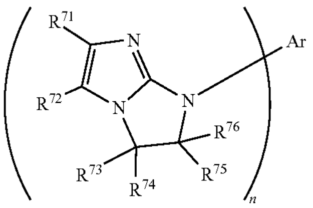

(G2-2)

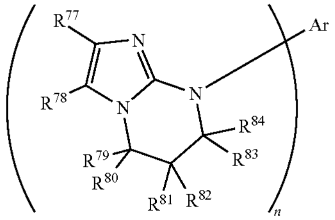

(G2-3)

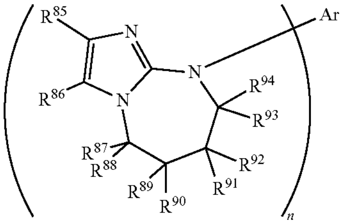

In the organic compounds represented by General Formulae (G2-1) to (G2-3) above, Ar represents a substituted or unsubstituted aryl group having 6 to 30 carbon atoms in a ring or a substituted or unsubstituted heteroaryl group having 2 to 30 carbon atoms in a ring, each of $R^{71}$ to $R^{94}$ independently represents hydrogen (including deuterium) or a substituted or unsubstituted alkyl group having 1 to 6 carbon atoms, and n represents an integer of 1 to 6. In the case where n is 2 or more, $R^{71}$s may be the same or different from each other, and the same applies to $R^{72}$ to $R^{94}$.

Note that the description of the substituent used for Ar in General Formula (G1) above can be referred to for the substituent that can be used for Ar in any of General Formulae (G2) and (G2-1) to (G2-3).

Specific examples of the organic compound represented by General Formula (G1) above include organic compounds represented by Structure Formulae (100) to (118) below.

[Chemical Formula 21]

(100)

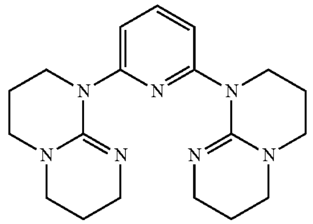

(101)

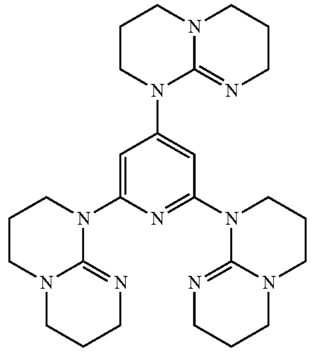

(102)

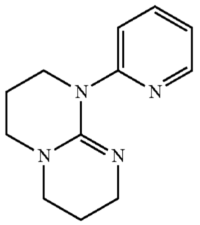

(103)

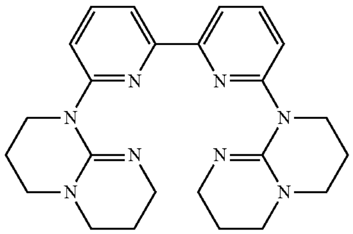

(104)

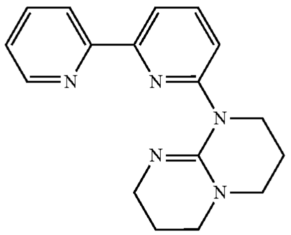

(105)

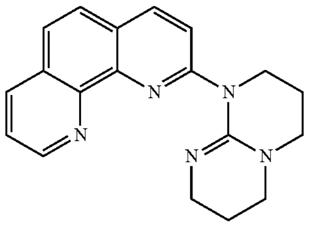

-continued
(106)
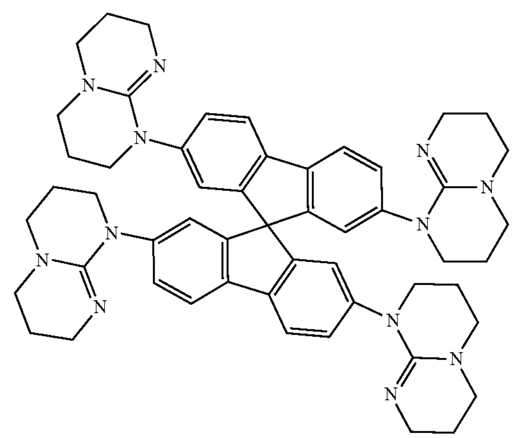
(107)
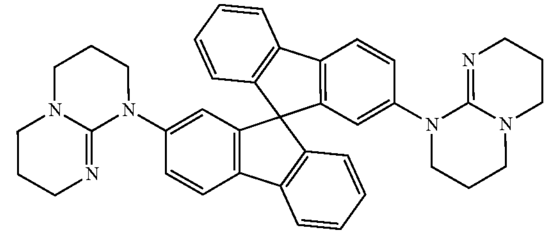
(108)
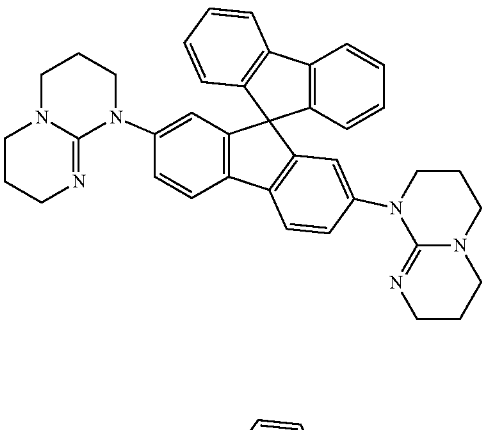
(109)
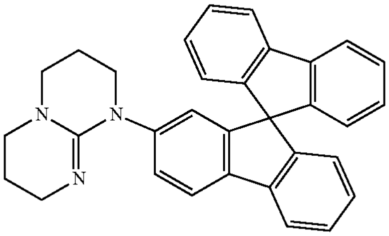
-continued
(110)
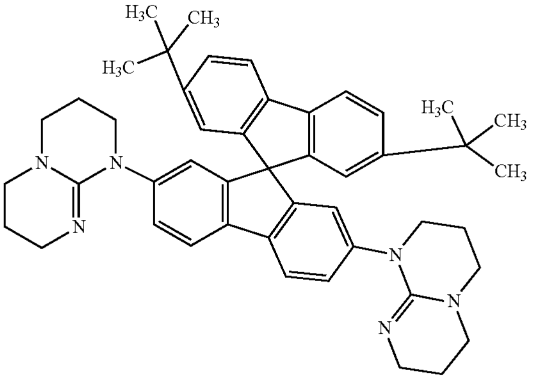
(111)
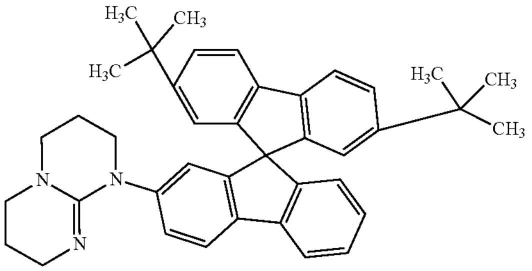
(112)
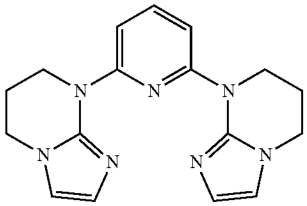
(113)
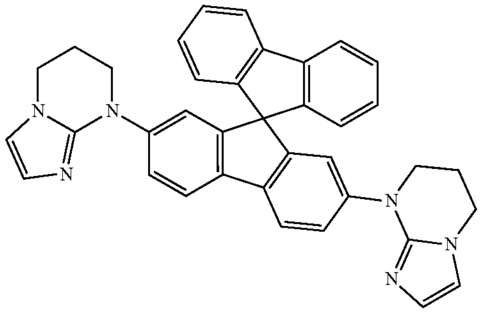
(114)
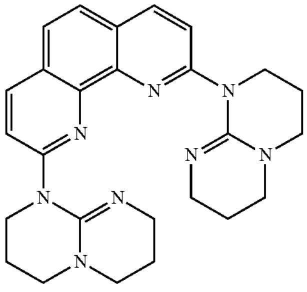

-continued (115)

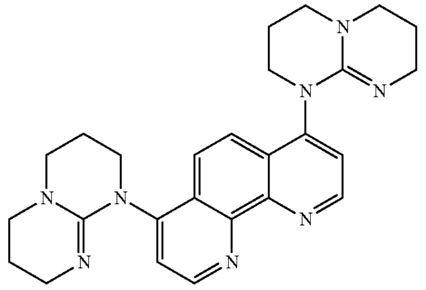

(116)

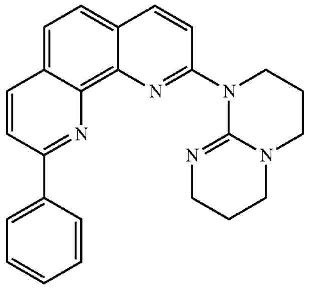

(117)

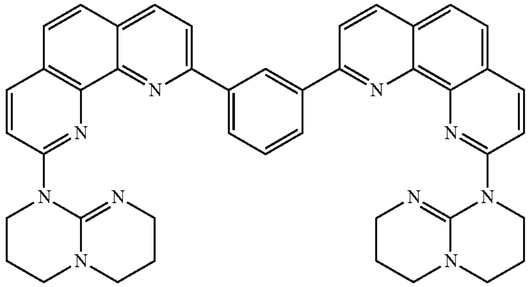

(118)

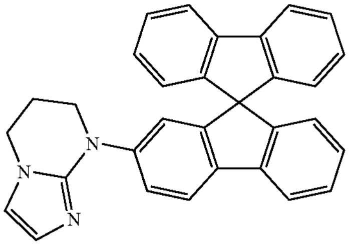

When the organic mask film 152 containing any of the above organic compounds of embodiments of the present invention is provided between the organic compound film 151 and the inorganic mask film 153, the inorganic mask film 153 can be easily removed while damage to the organic compound film 151 and an increase in voltage are inhibited. As a result, an ultra-high-resolution device having favorable characteristics, which has gone through processing by a photolithography method, can be provided.

The structure of this embodiment can be used in combination with any of the other structures as appropriate.

Embodiment 2

In this embodiment, a method for processing an organic compound film of one embodiment of the present invention is described with reference to FIGS. 3A to 3E and FIGS. 4A to 4E.

Figure 3A:
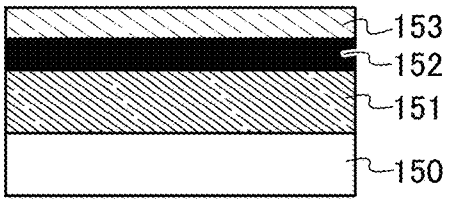
FIGS. 3A to 3E illustrate a method for processing a film.

First, the organic compound film 151 is formed over abase film 150 (FIG. 3A). The base film may be either an insulating film or a conductive film depending on a device manufactured later. The organic compound film 151 may be formed by a dry method such as an evaporation method or a wet method such as a spin coating method.

Next, the organic mask film 152 containing the organic compound represented by General Formula (G1) or (G2) described in Embodiment 1 is formed over the organic compound film 151 (FIG. 3A). The organic mask film 152 is preferably formed by a vacuum evaporation method.

Next, the inorganic mask film 153 is formed over the organic mask film 152 (FIG. 3A). The inorganic mask film 153 is preferably formed by a method that causes less damage to the film in contact with the organic compound film 151.

Figure 3B:
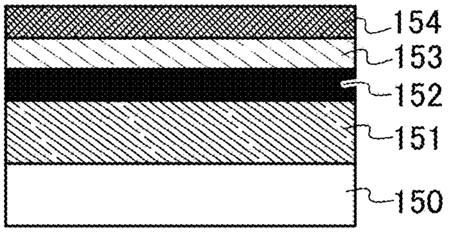

A film 154 to be a hard mask formed of a metal film or a metal compound film is preferably formed over the inorganic mask film 153 (FIG. 3B). Since damage to the organic compound film 151 can be reduced by the inorganic mask film 153, the film 154 to be a hard mask can be formed by a formation method that causes relatively great damage to a formation surface, such as a sputtering method.

Examples of a material for the film 154 to be a hard mask include silicon, silicon nitride, silicon oxide, tungsten, titanium, molybdenum, tantalum, tantalum nitride, an alloy containing molybdenum and niobium, an alloy metal oxide containing molybdenum and tungsten, and a metal oxide such as an indium gallium zinc oxide (also denoted as In—Ga—Zn oxide or IGZO). It is also possible to use indium oxide, indium zinc oxide (In-Zn oxide), indium tin oxide (In-Sn oxide), indium titanium oxide (In-Ti oxide), indium tin zinc oxide (In—Sn-Zn oxide), indium titanium zinc oxide (In-Ti-Zn oxide), indium gallium tin zinc oxide (In-Ga —Sn-Zn oxide), or the like. Alternatively, indium tin oxide containing silicon can also be used, for example.

Figure 3C:
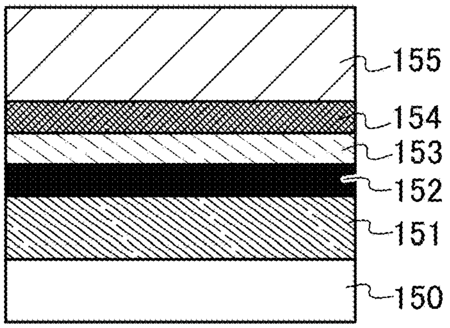
Figure 3D:
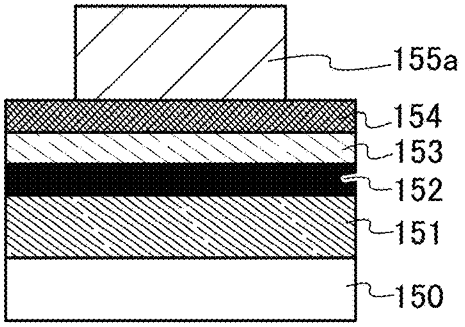

Then, a photosensitive resin is applied to the film 154 to be a hard mask, so that a resin film 155 is formed (FIG. 3C). The photosensitive resin may be either a positive type resist or a negative type resist.

Figure 3E:
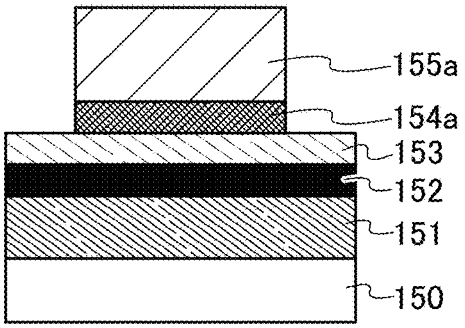

Next, a photomask layer 155*a* is formed by performing light exposure in accordance with the photosensitivity of the resin and performing development (FIG. 3D), and the film 154 to be a hard mask is etched with the use of the photomask layer 155*a*, whereby a hard mask layer 154*a* is formed (FIG. 3E).

The film 154 to be a hard mask may be etched by either wet etching or dry etching. This etching is preferably performed under the condition where the film 154 to be a hard mask has a high selectivity with respect to the inorganic mask film 153.

Figure 4A:
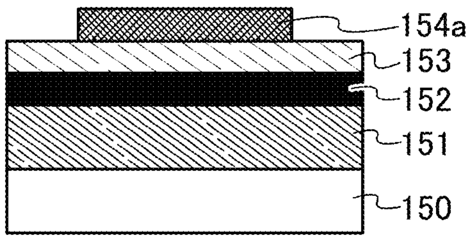
FIGS. 4A to 4E illustrate the method for processing a film.

After the hard mask layer 154*a* is formed, the photomask layer 155*a* is removed (FIG. 4A). Owing to the film 154 to be a hard mask and the inorganic mask film 153, the organic compound film 151 is prevented from being adversely affected, for example, being eliminated or being damaged, by treatment in forming and removing the photomask layer 155*a*, and thus, an organic EL device having favorable characteristics can be manufactured.

Figure 4B:
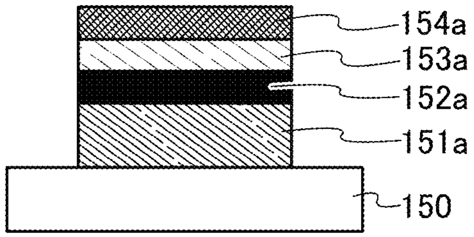

After that, etching is performed with the use of the hard mask layer 154*a* as a mask, whereby an organic compound layer 151*a*, an organic mask layer 152*a*, and an inorganic mask layer 153*a* are formed (FIG. 4B). This etching may be either wet etching or dry etching, but dry etching is preferable.

Figure 4C:
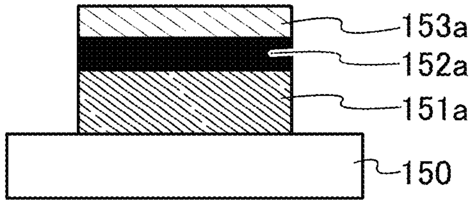

After processing the organic compound layer 151*a* is completed, the hard mask layer 154*a* is removed (FIG. 4C).

The hard mask layer 154*a* is removed by etching. Either wet etching or dry etching can be performed, but dry etching is preferable. This etching is preferably performed under the condition where the hard mask layer 154*a* has a high selectivity with respect to the inorganic mask layer 153*a*.

Figure 4D:
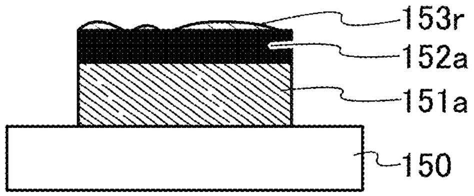
Figure 4E:
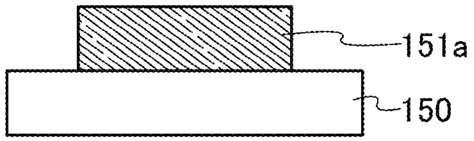

Lastly, the inorganic mask layer 153*a* and the organic mask layer 152*a* are treated with water or a liquid including water as a solvent to be removed at once (FIG. 4E).

As the removing method, the inorganic mask layer 153*a* and the organic mask layer 152*a* are immersed in water or the liquid including water as a solvent for a predetermined time, and then showered with pure water. The hard mask layer 154*a* and the organic mask layer 152*a* can be removed in only this step. The liquid for removing is preferably water because of less damage to the organic compound layer 151*a*.

Note that after the hard mask layer 154*a* is removed, the inorganic mask layer 153*a* may be removed to some extent before the organic mask layer 152*a* is treated with water or the liquid including water as a solvent (FIG. 4D). The organic mask layer 153*a* is removed by etching. Although either wet etching or dry etching can be performed, wet etching using an alkaline solution or an acid solution is preferable, and wet etching using an alkaline solution is further preferable. The surface of the organic compound layer 151*a* is prevented from being exposed to the alkaline solution or the acid solution owing to the organic mask layer 152*a* thereover, whereby deterioration of characteristics can be prevented. Furthermore, treatment is performed such that a residue 153*r* of the inorganic mask remains over the organic mask layer 152*a* to some extent, whereby the next step of removing the organic mask layer 152*a* can be performed more smoothly.

In the case where a material that does not greatly deteriorate the device characteristics (e.g., a material that does not increase voltage), or a film that functions as an electron-injection layer is used for the organic mask layer 152*a*, the organic mask film 152 is not necessarily completely removed and part or the whole of the organic mask film 152 may remain.

The organic compound layer 151*a* processed through the above steps has less processing damage, so that an organic EL device can have favorable characteristics. Furthermore, the residue 153*r* of the inorganic mask is inhibited from remaining on the surface of the organic compound layer 151*a*, whereby an increase in voltage of an organic EL device to be manufactured later can be prevented.

Figure 5A:
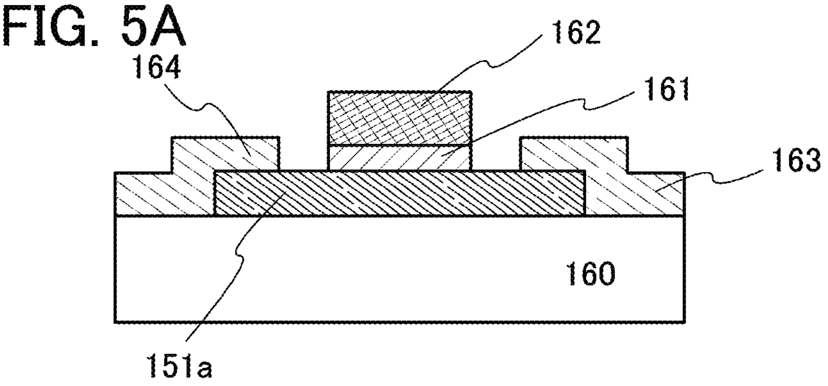
FIGS. 5A to 5C illustrate an organic TFT, an organic EL device, and a photoelectric conversion device.
Figure 5B:
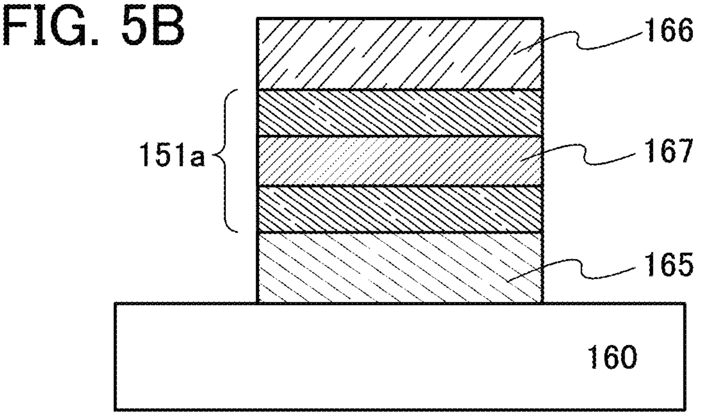
Figure 5C:
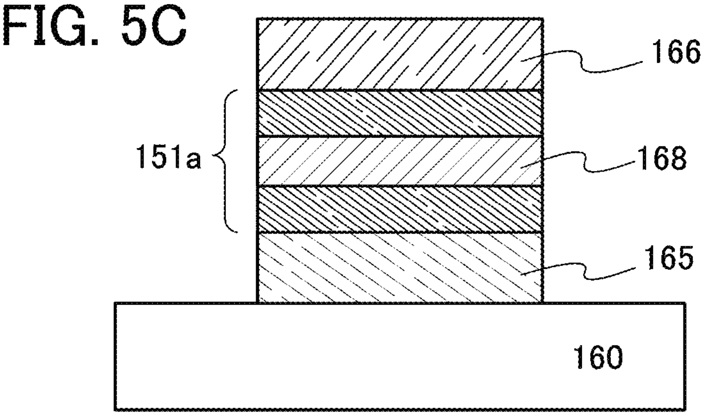

Note that the organic compound layer 151*a* can be used for an organic thin film transistor (TFT) including, over an insulating layer 160, the organic compound layer 151*a*, a gate insulating layer 161, a gate electrode 162, a source electrode 163, and a drain electrode 164 as illustrated in FIG. 5A; a photoelectric conversion device such as a solar cell or a photosensor, including, over the insulating layer 160, a first electrode 165, a second electrode 166, and a photoelectric conversion layer 167 as illustrated in FIG. 5B; or an organic EL device including, over the insulating layer 160, the first electrode 165, the second electrode 166, and a light-emitting layer 168 as illustrated in FIG. 5C.

The structure of this embodiment can be used in combination with any of the other structures as appropriate.

Embodiment 3

In this embodiment, a method for manufacturing a light-emitting device that is an example of the organic EL device of one embodiment of the present invention is described with reference to drawings. Here, description is made with the use of a light-emitting apparatus 450 illustrated in FIGS. 6A to 6D as an example. In the light-emitting apparatus 450, an organic EL device includes the organic compound layer in Embodiment 1 or 2 that is an EL layer. That is, a layer denoted as an EL layer below corresponds to the organic compound layer. Note that when an organic compound layer including a photoelectric conversion layer is used instead of an EL layer, a photosensor can be manufactured. A light-emitting apparatus may include both a photosensor and an organic EL device.

[Light-Emitting Apparatus 450]

Figure 6A:
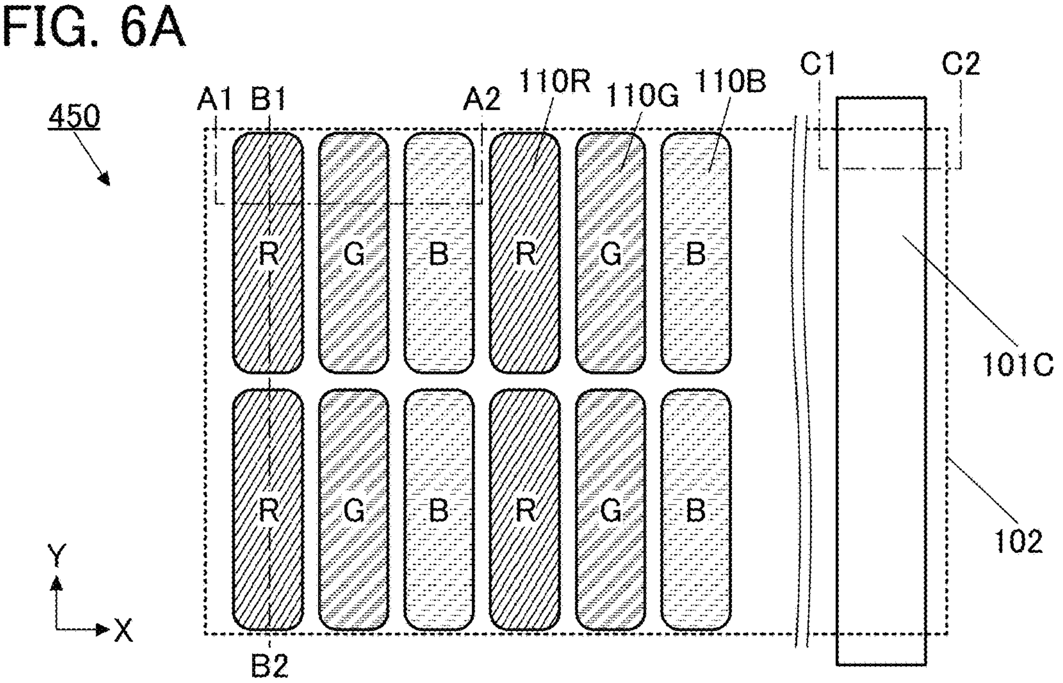
FIGS. 6A to 6D illustrate a light-emitting apparatus.

FIG. 6A is a schematic top view of the light-emitting apparatus 450. The light-emitting apparatus 450 includes a plurality of organic EL devices 110B emitting blue light, a plurality of organic EL devices 110G emitting green light, and a plurality of organic EL devices 110R emitting red light. In FIG. 6A, light-emitting regions of the organic EL devices are denoted by R, G, and B to easily differentiate the organic EL devices.

The organic EL devices 110B, the organic EL devices 110G, and the organic EL devices 110R are arranged in a matrix. FIG. 6A illustrates what is called a stripe arrangement, in which the organic EL devices of the same color are arranged in one direction. Note that the arrangement of the organic EL devices is not limited thereto; another arrangement such as a delta, zigzag, or PenTile pattern may also be used.

The organic EL devices 110B, 110G, and 110R are arranged in the X direction. The organic EL devices of the same color are arranged in the Y direction intersecting with the X direction.

The organic EL devices 110B, 110G, and 110R each have the structure described in the above embodiments.

Figure 6B:
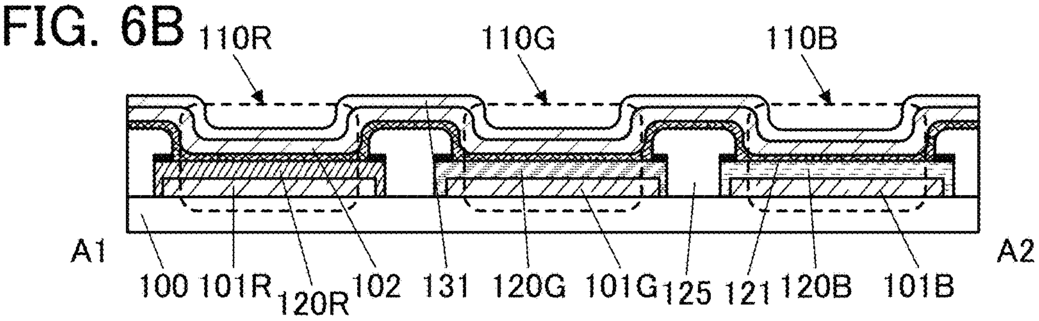
Figure 6C:
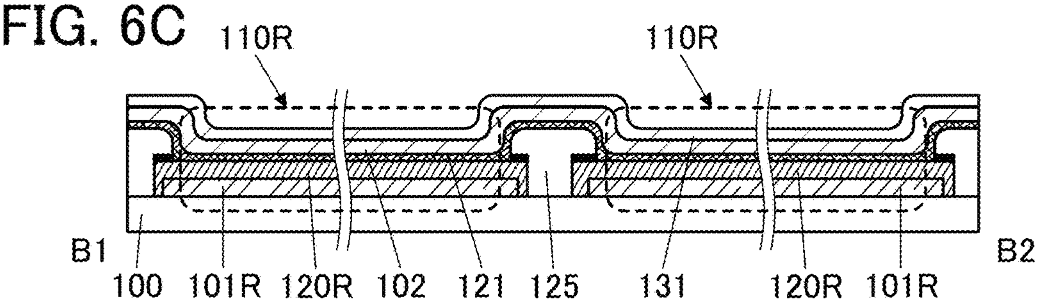

FIG. 6B is a cross-sectional schematic view taken along the dashed-dotted line A1-A2 in FIG. 6A, and FIG. 6C is a cross-sectional schematic view taken along the dashed-dotted line B1-B2 in FIG. 6A.

FIG. 6B illustrates cross sections of the organic EL devices 110B, 110G, and 110R. The organic EL device 110B includes a first electrode (pixel electrode) 101B, a first EL layer 120B, a second EL layer 121, and a second electrode 102. The organic EL device HOG includes a first electrode (pixel electrode) 111G, a first EL layer 120G, the second EL layer (electron-injection layer) 121, and the second electrode 102. The organic EL device 110R includes a first electrode (pixel electrode) 101R, a first EL layer 120R, the second EL layer 121, and the second electrode (common electrode) 102. The second EL layer 121 and the second electrode 102 are provided in common to the organic EL devices 110B, 110G, and 110R. The second EL layer 121 can also be referred to as a common layer. Note that a case where the first electrode 101 is an anode and the second electrode 102 is a cathode is described as an example in this embodiment.

The first EL layer 120B included in the organic EL device 110B contains at least a light-emitting organic compound that emits light with intensity in a blue wavelength range. The first EL layer 120G included in the organic EL device 110G contains at least a light-emitting organic compound that emits light with intensity in a green wavelength range. The first EL layer 120R included in the organic EL device 110R contains at least a light-emitting organic compound that emits light with intensity in a red wavelength range.

Each of the first EL layers 120B, 120G, and 120R includes at least a light-emitting layer, and may further include one or more of a hole-blocking layer, an electron-injection layer, an electron-transport layer, a hole-transport layer, a hole-injection layer, an electron-blocking layer, an exciton-blocking layer, and the like. The second EL layer 121 does not include the light-emitting layer. The second EL layer 121 is preferably the electron-injection layer. In the case where the second-electrode-side surfaces of the first EL layers 120B, 120G, and 120R also function as the electron-injection layers, the second EL layer 121 is not necessarily provided.

The first electrodes (anodes) 101B, 111G, and 101R are provided for the respective organic EL devices. The second electrode 102 and the second EL layer 121 are each preferably provided as a layer common to the organic EL devices.

A conductive film that transmits visible light is used for either the first electrode 101 or the second electrode 102, and a reflective conductive film is used for the other. When the respective first electrodes 101 are light-transmitting electrodes and the second electrode 102 is a reflective electrode, a bottom-emission display apparatus is obtained. When the respective first electrodes 101 are reflective electrodes and the second electrode 102 is a light-transmitting electrode, a top-emission display apparatus is obtained. Note that when both the respective first electrodes 101 and the second electrode 102 transmit light, a dual-emission display apparatus can be obtained. The organic EL device of one embodiment of the present invention is suitable for a top-emission organic EL device.

The first EL layers 120B, 120G, and 120R are provided to cover end portions of the first electrodes 101B, 111G, and 101R, respectively. The insulating layer 125 is provided to cover end portions of the first EL layers 120B, 120G, and 120R. In other words, the insulating layer 125 includes opening portions overlapping with the first electrodes 101B, 111G, and 101R and the first EL layers 120B, 120G, and 120R. End portions of the insulating layer 125 in the opening portions are preferably tapered. Note that the end portions of the first electrodes 101B, 111G, and 101R are not necessarily covered with the first EL layers 120B, 120G, and 120R, respectively.

The first EL layers 120B, 120G, and 120R include regions in contact with top surfaces of the first electrodes 101B, 111G, and 101R, respectively. The end portions of the first EL layers 120B, 120G, and 120R are positioned below the insulating layer 125. Each of top surfaces of the first EL layers 120B, 120G, and 120R includes a region in contact with the insulating layer 125 and a region in contact with the second EL layer 121 (the second electrode 102 in the case where the second EL layer is not provided).

Figure 7:
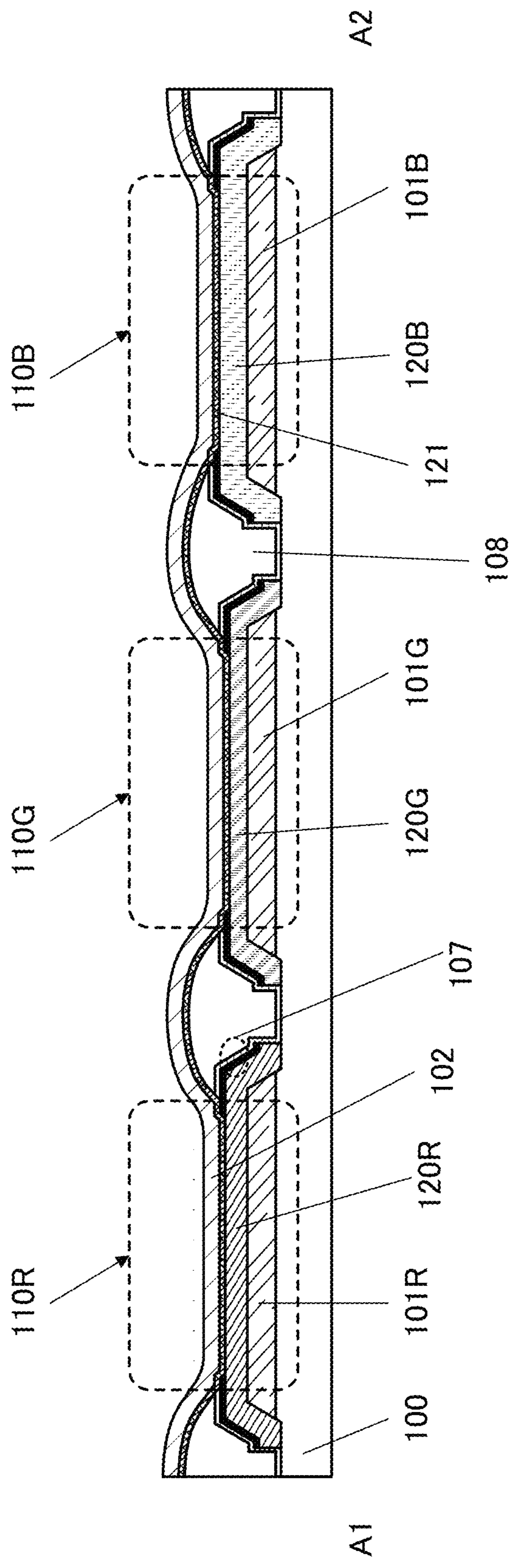
FIG. 7 illustrates a light-emitting apparatus.

FIG. 7 is a variation example of FIG. 6B. In FIG. 7, the end portions of the first electrodes 101B, 111G, and 101R each have a tapered shape that gradually becomes wider toward the substrate, which improves the coverage with a film formed thereover. The end portions of the first electrodes 101B, 101G, and 10R are covered with the first EL layers 120B, 120G, and 120R, respectively. A mask layer 107 is formed to cover the EL layers. This inhibits the EL layers from being damaged at the time of etching by a photolithography method.

An insulating layer 108 is provided in regions between the organic EL devices 110B, 110G, and 110R. End portions of the insulating layer 108 have a gentle tapered shape, thereby inhibiting disconnection of the second EL layer 121 and the second electrode 102, which are formed later.

As illustrated in FIGS. 6B and 7, there is a gap between two EL layers of the organic EL devices with different colors. The first EL layers 120B, 120G, and 120R are thus preferably provided so as not to be in contact with each other. This effectively prevents unintentional light emission from being caused by current flowing through two adjacent EL layers. As a result, the contrast can be increased to achieve a display apparatus with high display quality. A distance between facing end portions of EL layers of adjacent organic EL devices (e.g., the organic EL devices 110B and 110G) can be set greater than or equal to 2 μm and less than or equal to 5 m by manufacturing the organic EL devices by a photolithography method. Note that the distance can also be referred to as a distance between the light-emitting layers included in the EL layers. It is difficult to set the distance less than 10 μm by a manufacturing method using a metal mask.

As described above, manufacturing the light-emitting apparatus by a photolithography method can greatly reduce a non-light-emitting area between two adjacent organic EL devices, thereby significantly increasing the aperture ratio. For example, the display apparatus of one embodiment of the present invention can achieve an aperture ratio higher than or equal to 40%, higher than or equal to 50%, higher than or equal to 60%, higher than or equal to 70%, higher than or equal to 80%, or higher than or equal to 90%; that is, an aperture ratio lower than 100%.

Increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, two times the aperture ratio of the reference) has a lifetime approximately 3.25 times as long as that of the reference, and a display apparatus having an aperture ratio of 40% (that is, four times the aperture ratio of the reference) has a lifetime approximately 10.6 times as long as that of the reference. Thus, the density of current flowing to the organic EL device can be reduced with increasing aperture ratio, and accordingly the lifetime of the display apparatus can be increased. The display apparatus described in this embodiment can have a higher aperture ratio and thus can have higher display quality. Furthermore, the display apparatus of one embodiment of the present invention has excellent effect that the reliability (especially the lifetime) can be significantly improved with increasing aperture ratio.

FIG. 6C illustrates an example in which the first EL layer 120R is provided individually for each organic EL device in the Y direction. FIG. 6C illustrates the cross section of the organic EL device 110R as an example; the organic EL devices 110G and 110B can have a similar shape. Note that the EL layer is continuous in the Y direction and the first EL layer 120R may be formed in a band shape. When the first EL layer 120R and the like are formed in a band shape, no space for dividing the layer is needed and thus a non-light-emitting area between the organic EL devices is reduced, resulting in a higher aperture ratio.

A barrier layer 131 is provided over the second electrode 102 so as to cover the organic EL devices 110B, 110G, and 110R. The barrier layer 131 has a function of preventing diffusion of impurities that adversely affect the organic EL devices from the above.

The barrier layer 131 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the barrier layer 131.

As the barrier layer 131, a stacked film of an inorganic insulating film and an organic insulating film can be used. For example, a structure in which an organic insulating film is interposed between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, since a top surface of the barrier layer 131 is flat, a preferable effect can be obtained; when a component (e.g., a color filter, an electrode of a touch sensor, or a lens array) is provided above the barrier layer 131, the component is less affected by an uneven shape caused by the lower structure.

In FIG. 6A, a connection electrode 101C electrically connected to the second electrode 102 is illustrated. The connection electrode 101C is supplied with a potential (e.g., an anode potential or a cathode potential) that is to be supplied to the second electrode 102. The connection electrode 101C is provided outside a display region where the organic EL devices 110B and the like are arranged. In FIG. 6A, the second electrode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface, a top surface of the connection electrode 101C can have a band shape, an L shape, a square bracket shape, a quadrangular shape, or the like.

Figure 6D:
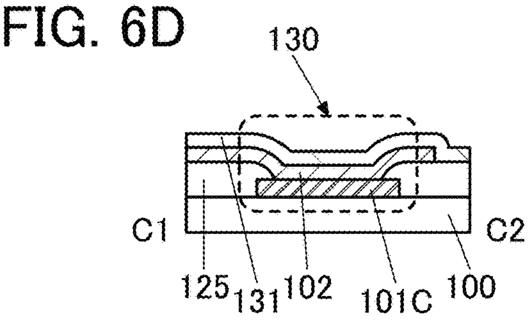

FIG. 6D is a cross-sectional schematic view taken along the dashed-dotted line C1-C2 in FIG. 6A. FIG. 6D illustrates a connection portion 130 at which the connection electrode 101C is electrically connected to the second electrode 102. In the connection portion 130, the second electrode 102 is provided on and in contact with the connection electrode 101C and the barrier layer 131 is provided to cover the second electrode 102. In addition, the insulating layer 125 is provided to cover end portions of the connection electrode 101C.

Manufacturing Method Example

FIGS. 8A to 8F and FIGS. 9A to 9F are cross-sectional schematic views of steps in the method for manufacturing the light-emitting apparatus 450 described above. In these drawings, cross-sectional schematic views of the connection portion 130 and the periphery thereof are also illustrated on the right side.

Note that thin films included in the display apparatus (e.g., insulating films, semiconductor films, and conductive films) can be formed by any of a sputtering method, a chemical vapor deposition (CVD) method, a vacuum evaporation method, a pulsed laser deposition (PLD) method, an ALD method, and the like. Examples of the CVD method include a plasma-enhanced chemical vapor deposition (PECVD) method and a thermal CVD method. An example of the thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Thin films included in the display apparatus can be processed by a photolithography method or the like.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by a liquid immersion exposure technique. As the light for exposure, extreme ultraviolet (EUV) light or X-rays may also be used. Furthermore, instead of the light used for the exposure, an electron beam can also be used. It is preferable to use EUV, X-rays, or an electron beam because extremely minute processing can be performed. Note that a photomask is not needed when light exposure is performed by scanning with a beam such as an electron beam.

For etching of thin films, a dry etching method, a wet etching method, a sandblast method, or the like can be used.

In this specification and the like, a device formed using a metal mask or a fine metal mask (FMM) is sometimes referred to as a device having a metal mask (MM) structure. In this specification and the like, a device formed without using a metal mask or an FMM is sometimes referred to as a device having a metal maskless (MML) structure.

[Preparation for Substrate 100]

A substrate that has heat resistance high enough to withstand at least heat treatment performed later can be used as a substrate 100. When an insulating substrate is used as the substrate 100, a glass substrate, a quartz substrate, a sapphire substrate, a ceramic substrate, an organic resin substrate, or the like can be used. Alternatively, a semiconductor substrate can be used. For example, a single crystal semiconductor substrate or a polycrystalline semiconductor substrate of silicon, silicon carbide, or the like; a compound semiconductor substrate of silicon germanium or the like; an SOI substrate; or the like can be used.

As the substrate 100, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of First Electrodes 101B, 111G, and 101R and Connection Electrode 101C]

Figure 8A:
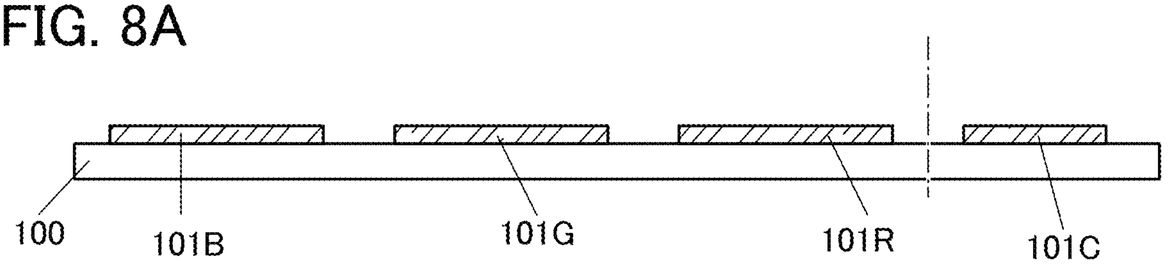
FIGS. 8A to 8F illustrate a method for manufacturing organic EL devices and a light-emitting apparatus.

Next, the first electrodes 101B, 111G, and 101R and the connection electrode 101C are formed over the substrate 100 (FIG. 8A). First, a conductive film to be a pixel electrode (first electrode) is formed, a resist mask is formed by a photolithography method, and an unnecessary portion of the conductive film is removed by etching. After that, the resist mask is removed. In this manner, the first electrodes 101B, 111G, and 101R and the connection electrode 101C can be formed.

In the case where a conductive film that reflects visible light is used as each pixel electrode, it is preferable to use a material (e.g., silver or aluminum) having reflectance as high as possible in the whole wavelength range of visible light. This can increase both light extraction efficiency of the organic EL devices and color reproducibility. In the case where a conductive film that reflects visible light is used as each pixel electrode, what is called a top-emission light-emitting apparatus in which light is extracted in the direction opposite to the substrate can be obtained. In the case where a conductive film that transmits light is used as each pixel electrode, what is called a bottom-emission light-emitting apparatus in which light is extracted in the direction of the substrate can be obtained.

[Formation of EL Film 120Bb]

Figure 8B:
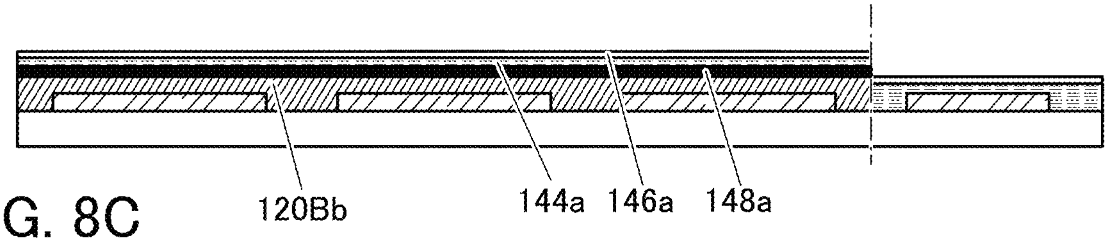

Next, an EL film 120Bb that is to be the first EL layer 120B is formed over the first electrodes 101B, 111G, and 101R (FIG. 8B).

The EL film 120Bb includes at least a light-emitting layer containing a light-emitting material. In addition to this, one or more films functioning as an electron-injection layer, an electron-transport layer, a charge-generation layer, a hole-transport layer, and a hole-injection layer may be stacked. The EL film 120Bb can be formed by, for example, an evaporation method, a sputtering method, an inkjet method, or the like. Without limitation to this, a known film formation method can be used as appropriate.

For example, the EL film 120Bb is preferably a stacked film in which a hole-injection layer, a hole-transport layer, a light-emitting layer, and an electron-transport layer are stacked in this order. In that case, a film including an electron-injection layer can be used as the second EL layer 121 formed later.

The EL film 120Bb is preferably formed so as not to overlap with the connection electrode 101C. For example, in the case where the EL film 120Bb is formed by an evaporation method (or a sputtering method), it is preferable that the EL film 120Bb be formed using a shielding mask so as not to be formed over the connection electrode 101C, or the EL film 120Bb over the connection electrode 101C be removed in a later etching step.

[Formation of Organic Mask Film 148*a*]

Figure 8C:
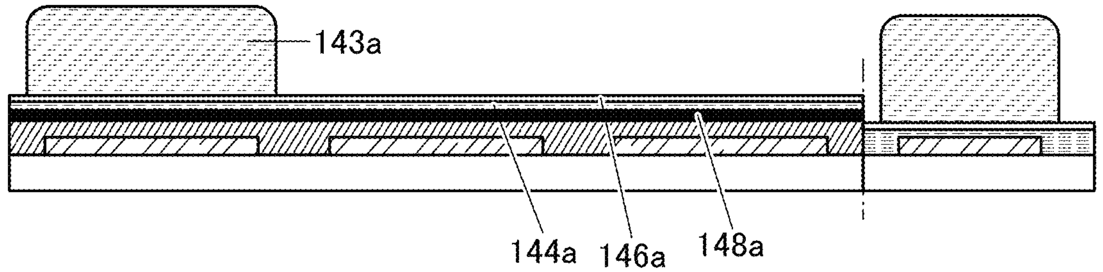

Next, an organic mask film 148*a* is formed to cover the EL film 120Bb (FIG. 8C). It is preferable that the organic mask film 148*a* be formed using a shielding mask so as not to be formed over the connection electrode 101C, or the organic mask film 148*a* over the connection electrode 101C be removed in a later etching step.

The organic mask film 148*a* is formed using the organic compound represented by General Formula (G1) or (G2) described in Embodiment 1. The organic compound that is one embodiment of the present invention is used for the organic mask film 148*a*, whereby the EL film 120Bb is protected and an inorganic mask layer 145 (an inorganic mask layer 145*a*, an inorganic mask layer 145*b*, and an inorganic mask layer 145*c*) to be formed later is easily removed. When the organic compound is used as a material of the organic mask film 148*a*, the inorganic mask layer 145 to be formed later or the residue thereof (left in the etching process) can be removed easily by water or a liquid including water as a solvent and thus an increase in voltage of the organic EL device can be prevented. It is possible to inhibit deterioration of the organic EL device characteristics.

[Formation of Inorganic Mask Film 144*a*]

Next, an inorganic mask film 144*a* is formed to cover the EL film 120Bb (FIG. 8B). It is preferable that the inorganic mask film 144*a* be formed using a shielding mask so as not to be formed over the connection electrode 101C, or the inorganic mask film 144*a* over the connection electrode 101C be removed in a later etching step.

As the inorganic mask film 144*a*, it is possible to use a film highly resistant to etching treatment performed on various EL films such as the EL film 120Bb, i.e., a film having a high etching selectivity with respect to the EL films. Furthermore, as the inorganic mask film 144*a*, it is possible to use a film having a high etching selectivity with respect to a protective film such as a film 146*a* to be a hard mask described later. Moreover, as the inorganic mask film 144*a*, it is possible to use a film that can be removed by a wet etching method, which is less likely to cause damage to the EL films.

The inorganic mask film 144*a* can be formed by a variety of film formation methods such as a sputtering method, an evaporation method, a CVD method, and an ALD method, and the ALD method is preferable to obtain a dense film having a high barrier property against an atmospheric component such as oxygen or water, or a liquid such as water.

[Formation of Film 146*a* to be Hard Mask]

Next, the film 146*a* to be a hard mask is formed over the inorganic mask film 144*a* (FIG. 8B).

The film 146*a* to be a hard mask is a film used as a hard mask when the inorganic mask film 144*a* is etched later. In a later step of processing the film 146*a* to be a hard mask, the inorganic mask film 144*a* is exposed. Hence, a combination of films having greatly different etching rates is selected for the inorganic mask film 144*a* and the film 146*a* to be a hard mask. It is thus possible to select a film that can be used as the film 146*a* to be a hard mask in accordance with etching conditions of the inorganic mask film 144*a* and the film 146*a* to be a hard mask.

For example, in the case where dry etching using a gas containing fluorine (also referred to as a fluorine-based gas) is performed as etching of the film 146*a* to be a hard mask, the film 146*a* to be a hard mask can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film can be given as a film having a high etching selectivity (that is, having a lower etching rate) in dry etching using the fluorine-based gas.

A metal oxide such as indium gallium zinc oxide (In—Ga—Zn oxide, also referred to as IGZO) can be used for the metal oxide film. It is also possible to use indium oxide, indium zinc oxide (In—Zn oxide), indium tin oxide (In-Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon can also be used, for example.

An element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, Mis preferably one or more of gallium, aluminum, and yttrium.

Without being limited to the above, a material of the film 146*a* to be a hard mask can be selected from a variety of materials in accordance with etching conditions of the inorganic mask film 144*a* and the film 146*a* to be a hard mask. For example, any of the films that can be used as the inorganic mask film 144*a* can be used.

As the film 146*a* to be a hard mask, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the film 146*a* to be a hard mask, an oxide film can also be used. Typically, it is possible to use a film of an oxide or an oxynitride such as silicon oxide, silicon oxynitride, aluminum oxynitride, hafnium oxide, or hafnium oxynitride.

Alternatively, as the film 146*a* to be a hard mask, an organic film that can be used as the EL film 120Bb or the like may be used. For example, the film 146*a* to be a hard mask can be formed using the organic film that is used as the EL film 120Bb, an EL film 120Gb, or an EL film 120Rb. Use of such an organic film is preferable because the same film formation apparatus can be used for formation of the EL film 120Bb or the like.

[Formation of Resist Mask 143*a*]

Then, resist masks 143*a* are formed at positions over the film 146*a* to be a hard mask, which overlap with the first electrode 101B and the connection electrode 101C (FIG. 8C).

For the resist mask 143*a*, a resist material containing a photosensitive resin such as a positive type resist material or a negative type resist material can be used.

On the assumption that the resist mask 143*a* is formed over the inorganic mask film 144*a* without the film 146*a* to be a hard mask therebetween, there is a risk of dissolving the EL film 120Bb due to a solvent of the resist material if a defect such as a pinhole exists in the inorganic mask film 144*a*. Such a problem can be prevented by using the film 146*a* to be a hard mask.

In the case where a film that is less likely to cause a defect such as a pinhole is used as the inorganic mask film 144*a*, the resist mask 143*a* may be formed directly on the inorganic mask film 144*a* without the film 146*a* to be a hard mask therebetween.

[Etching of Film 146*a* to be Hard Mask]

Next, part of the film 146*a* to be a hard mask that is not covered with the resist masks 143*a* is removed by etching, so that a band-shaped or island-shaped hard mask layer 147*a* is formed. At this time, the hard mask layer 147*a* is formed also over the connection electrode 101C.

In the etching of the film 146*a* to be a hard mask, an etching condition with a high selectively is preferably employed so that the inorganic mask film 144*a* is not removed by the etching. Either wet etching or dry etching can be performed for the etching of the film 146*a* to be a hard mask. With the use of dry etching, a reduction in a processing pattern of the film 146*a* to be a hard mask can be inhibited.

[Removal of Resist Mask 143*a*]

Figure 8D:
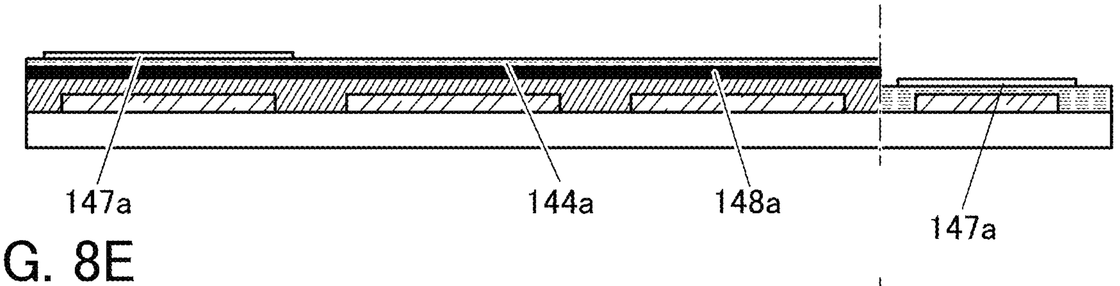

Then, the resist masks 143*a* are removed (FIG. 8D).

The resist masks 143*a* can be removed by wet etching or dry etching. It is particularly preferable to remove the resist mask 143*a* by dry etching using an oxygen gas as an etching gas (also referred to as plasma ashing).

At this time, the removal of the resist masks 143*a* is performed in a state where the EL film 120Bb is covered with the inorganic mask film 144*a*; thus, the EL film 120Bb is less likely to be affected by the removal. In particular, when the EL film 120Bb is exposed to oxygen, the electrical characteristics of the light-emitting device are adversely affected in some cases. Therefore, it is preferable that the EL film 120Bb be covered by the inorganic mask film 144*a* when etching using an oxygen gas, such as plasma ashing, is performed.

[Etching of Inorganic Mask Film 144*a*]

Figure 8E:
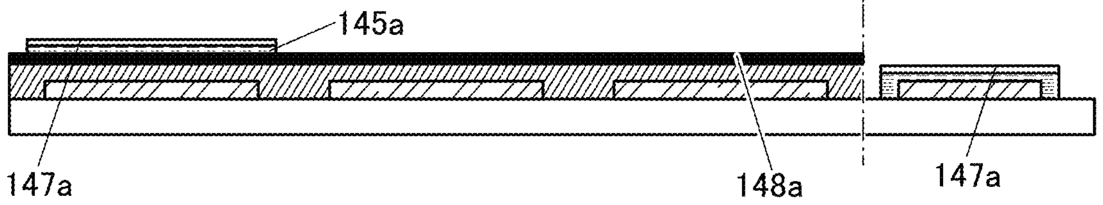

Next, part of the inorganic mask film 144*a* that is not covered with the hard mask layer 147*a* is removed by etching with the use of the hard mask layer 147*a* as a mask, so that the band-shaped inorganic mask layer 145*a* is formed (FIG. 8E). At this time, the inorganic mask layer 145*a* is formed also over the connection electrode 101C.

Either wet etching or dry etching can be performed for the etching of the inorganic mask film 144*a*. With the use of dry etching, a reduction in a processing pattern can be inhibited.

[Etching of EL Film 120Bb, Organic Mask Film 148*a*, and Hard Mask Layer 147*a*]

Figure 8F:
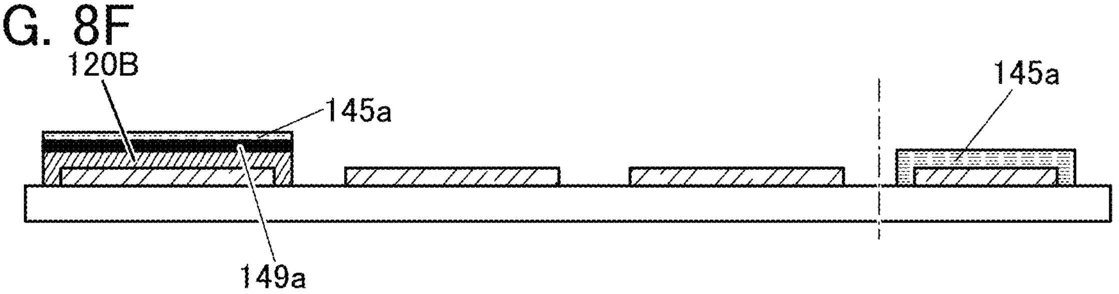

Next, the hard mask layer 147*a* is etched and at the same time, parts of the organic mask film 148*a* and the EL film 120Bb that are not covered with the inorganic mask layer 145*a* are removed by etching, so that an organic mask layer 149*a* and the band-shaped EL layer 120B are formed (FIG. 8F). At this time, the hard mask layer 147*a* over the connection electrode 101C is also removed.

The organic mask film 148*a*, the EL film 120Bb, and the hard mask layer 147*a* are preferably etched by the same treatment so that the process can be simplified to reduce the manufacturing cost of the display apparatus.

For the etching of the EL film 120Bb, it is particularly preferable to perform dry etching using an etching gas that does not contain oxygen as its main component. This is because the alteration of the EL film 120Bb is inhibited, and a highly reliable display apparatus can be achieved. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas such as He. Alternatively, a mixed gas of the above gas and a dilute gas that does not contain oxygen can be used as the etching gas.

Note that etching of the organic mask film 148*a* and the EL film 120Bb and etching of the hard mask layer 147*a* may be performed separately. In that case, either etching of the organic mask film 148*a* and the EL film 120Bb or etching of the hard mask layer 147*a* may be performed first.

At this step, the organic mask layer 149*a*, the first EL layer 120B, and the connection electrode 101C are covered with the inorganic mask layer 145*a*.

[Formation of First EL Layers 120G and 120R]

Figure 9A:
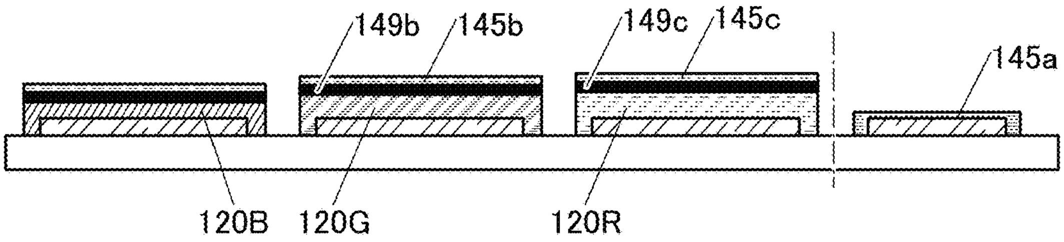
FIGS. 9A to 9F illustrate the method for manufacturing organic EL devices and a light-emitting apparatus.

By repeating similar steps, island-shaped organic mask layers 149*b* and 149*c*, the island-shaped first EL layers 120G and 120R, and the island-shaped inorganic mask layers 145*b* and 145*c* can be formed (FIG. 9A).

[Formation of Insulating Layer 126*b*]

Figure 9B:
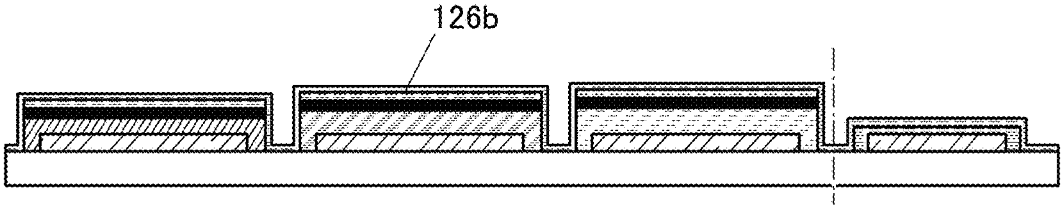

Next, an insulating layer 126*b* is formed over the inorganic mask layers 145*a*, 145*b*, and 145*c* (FIG. 9B). The insulating layer 126*b* can be formed in a manner similar to that of the inorganic mask layers 145*a*, 145*b*, and 145*c*.

Figure 9C:
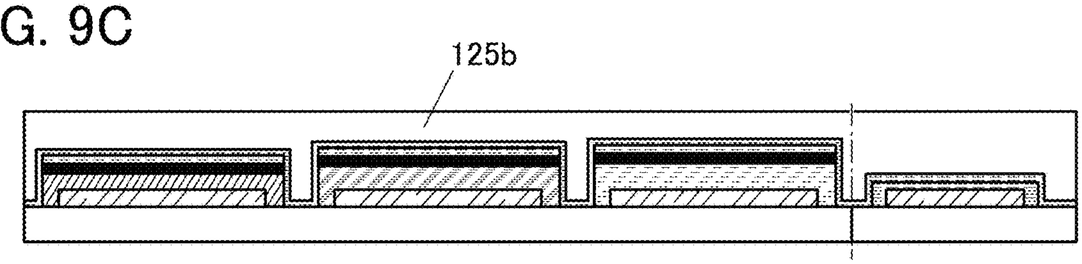

Then, an insulating layer 125*b* is formed to cover the insulating layer 126*b* (FIG. 9C). The insulating layer 125*b* is formed using a photosensitive organic resin. Examples of the organic material include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. As an organic material used for the insulating layer 125*b*, polyvinyl alcohol (PVA), polyvinylbutyral, polyvinylpyrrolidone, polyethylene glycol, polyglycerin, pullulan, water-soluble cellulose, an alcohol-soluble polyamide resin, or the like can be used in some cases. As the photosensitive resin, a photoresist can be used in some cases. As the photosensitive resin, a positive photosensitive material or a negative photosensitive material can be used in some cases.

The insulating layer 125*b* is preferably subjected to heat treatment after application. The heat treatment is performed at a temperature lower than the upper temperature limit of the EL layer. The substrate temperature in the heat treatment is higher than or equal to 50° C. and lower than or equal to 200° C., preferably higher than or equal to 60° C. and lower than or equal to 150° C., and further preferably higher than or equal to 70° C. and lower than or equal to 120° C. Accordingly, a solvent contained in the insulating layer 125*b* can be removed.

Figure 9D:
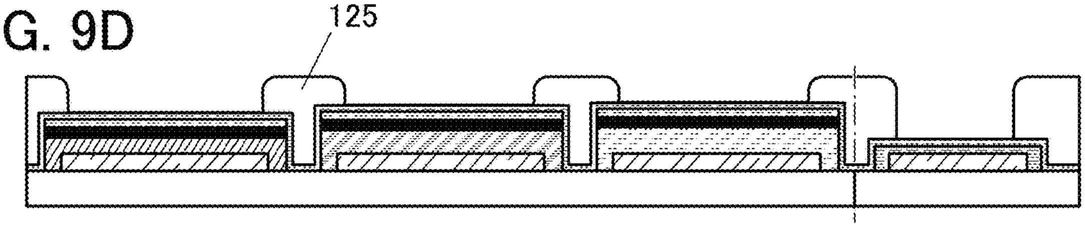

Next, opening portions are formed in regions of the insulating layer 125*b* overlapping with the first EL layers that are over the first electrodes by performing light exposure and development, and the insulating layer 125 is formed (FIG. 9D). In the case where a positive acrylic resin is used for the insulating layer 125*b*, a region where the insulating layer 125*b* is removed is irradiated with visible light or ultraviolet rays using a mask.

In the case where visible light is used for exposure, the visible light preferably includes the i-line (wavelength: 365 nm). Furthermore, visible light including the g-line (wavelength: 436 nm), the h-line (wavelength: 405 nm), or the like may be used.

In the case where an acrylic resin is used for the insulating layer 125*b*, an alkaline solution is preferably used as a developer in the development, and for example, a tetramethyl ammonium hydroxide (TMAH) solution is used.

Then, light exposure is preferably performed on the entire substrate so that the insulating layer 125 is irradiated with visible light or ultraviolet rays. The energy density for the light exposure is greater than 0 $mJ/cm^2$ and less than or equal to 800 $mJ/cm^2$, preferably greater than 0 $mJ/cm^2$ and less than or equal to 500 $mJ/cm^2$. Performing such light exposure after the development can sometimes increase the degree of transparency of the insulating layer 125. In addition, it is sometimes possible to lower the substrate temperature required for subsequent heat treatment for changing the shape of end portions of the insulating layer 125 to a tapered shape.

Next, the heat treatment is performed to change the insulating layer 125*b* into the insulating layer 125 with a tapered side surface. The heat treatment is performed at a temperature lower than the upper temperature limit of the EL layer. The substrate temperature in the heat treatment is higher than or equal to 50° C. and lower than or equal to 200° C., preferably higher than or equal to 60° C. and lower than or equal to 150° C., further preferably higher than or equal to 70° C. and lower than or equal to 130° C. The substrate temperature in the heat treatment of this step is preferably higher than that in the heat treatment after the application of the insulating layer 125. Accordingly, corrosion resistance of the insulating layer 125 can be improved.

[Removal of Mask Layer]

Figure 9E:
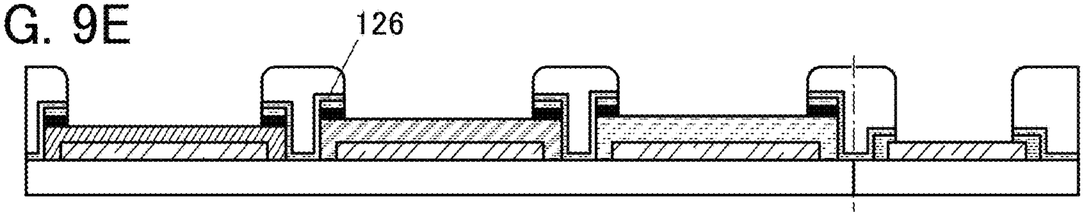

The exposed inorganic mask layers 145*a*, 145*b*, and 145*c* and the organic mask layers 149*a*, 149*b*, and 149*c* are removed by water or a liquid including water as a solvent (FIG. 9E).

The inorganic mask layers 145*a*, 145*b*, and 145*c* and the organic mask layers 149*a*, 149*b*, and 149*c* are removed by immersion in water or a liquid including water as a solvent. Washing with a pure-water shower may be performed after that. By this treatment, the inorganic mask layers can be removed together with the organic mask layers.

In the case where a material that does not greatly deteriorate the device characteristics (e.g., a material that does not increase voltage), or a layer that functions as an electron-injection layer is used for the organic mask layers 149*a*, 149*b*, and 149*c*, the organic mask layers 149*a*, 149*b*, and 149*c* are not necessarily completely removed and part or the whole thereof may remain.

Note that it is preferable that the inorganic mask layers 145*a*, 145*b*, and 145*c* be removed to some extent by wet etching or dry etching before the treatment with water or the liquid including water as a solvent. At this time, since the inorganic mask layers 145*a*, 145*b*, and 145*c* are not necessarily completely removed and the organic mask layers cover the EL layers, the EL layers are hardly damaged in removing the inorganic mask layers 145*a*, 145*b*, and 145*c*.

Note that a wet etching method is particularly preferably used at this time. For example, wet etching using a tetramethyl ammonium hydroxide (TMAH) solution, diluted hydrofluoric acid, oxalic acid, phosphoric acid, acetic acid, nitric acid, or a mixed solution thereof is preferably performed.

Alternatively, the inorganic mask layers 145*a*, 145*b*, and 145*c* are preferably removed by being dissolved in a solvent such as water or alcohol. Examples of the alcohol in which the inorganic mask layers 145*a*, 145*b*, and 145*c* can be dissolved include ethyl alcohol, methyl alcohol, isopropyl alcohol (IPA), and glycerin.

After the inorganic mask layers 145*a*, 145*b*, and 145*c* and the organic mask layers 149*a*, 149*b*, and 149*c* are removed, drying treatment is preferably performed in order to remove water contained in the first EL layers 120B, 120G, and 120R and water adsorbed on the surfaces of the first EL layers 120R, 120G, and 120B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

In the above manner, the first EL layers 120B, 120G, and 120R can be separately formed.

[Formation of Second EL Layer 121]

Figure 9F:
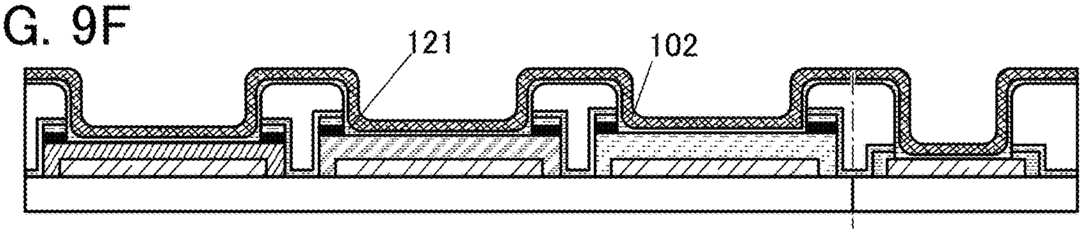

Then, the second EL layer 121 is formed to cover the first EL layers 120B, 120G, and 120R and the insulating layer 125 (FIG. 9F).

The second EL layer 121 can be formed in a manner similar to that of the EL film 120Bb or the like. In the case where the second EL layer 121 is formed by an evaporation method, the second EL layer 121 is preferably formed using a shielding mask so as not to be formed over the connection electrode 101C.

[Formation of Second Electrode 102]

Next, the second electrode 102 is formed to cover the second EL layer 121 and the connection electrode 101C (FIG. 9F).

The second electrode 102 can be formed by a film formation method such as an evaporation method or a sputtering method. Alternatively, a film formed by an evaporation method and a film formed by a sputtering method may be stacked. In that case, the second electrode 102 is preferably formed so as to cover a region where an electron-injection layer 115 is formed. That is, a structure in which end portions of the electron-injection layer 115 overlap with the second electrode 102 can be obtained. The second electrode 102 is preferably formed using a shielding mask.

The second electrode 102 is electrically connected to the connection electrode 101C outside the display region.

[Formation of Barrier Layer]

Then, a barrier layer is formed over the second electrode 102. An inorganic insulating film used as the barrier layer is preferably formed by a sputtering method, a PECVD method, or an ALD method. In particular, an ALD method is preferable because a film deposited by ALD has good step coverage and is less likely to cause a defect such as a pinhole. An organic insulating film is preferably formed by an inkjet method because a uniform film can be formed in a desired area.

In the above manner, the light-emitting apparatus can be manufactured.

Although the second electrode 102 and the second EL layer 121 are formed to have similar top surface shapes in the above, they may be formed to have different top surface shapes.

The structure of this embodiment can be used in combination with any of the other structures as appropriate.

Embodiment 4

Figure 10:
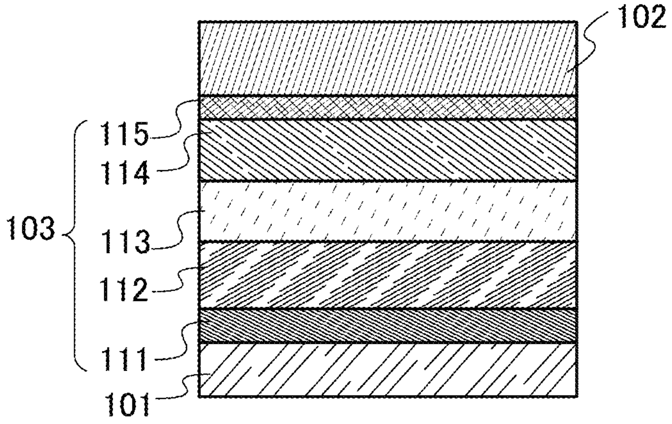
FIG. 10 illustrates an organic EL device.

In this embodiment, a structure of an organic EL device, which is a light-emitting device including an EL layer as an organic compound layer, is described with reference to FIG. 10. The organic EL device is a light-emitting device that includes an EL layer including a light-emitting layer between the first electrode 101 and the second electrode 102.

One of the first electrode 101 and the second electrode 102 functions as an anode and the other functions as a cathode. A case where the first electrode 101 is an anode is illustrated as an example in FIG. 10.

The anode is preferably formed using any of metals, alloys, and conductive compounds with a high work function (specifically, higher than or equal to 4.0 eV), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, a film of indium oxide-zinc oxide is formed by a sputtering method using a target in which 1 wt % to 20 wt % zinc oxide is added to indium oxide. Furthermore, a film of indium oxide containing tungsten oxide and zinc oxide (IWZO) can be formed by a sputtering method using a target in which 0.5 wt % to 5 wt % tungsten oxide and 0.1 wt % to 1 wt % zinc oxide are added to indium oxide. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used for the anode. Graphene can also be used for the anode. Note that when a composite material described later is used for a layer that is in contact with the anode in an EL layer 103, an electrode material can be selected regardless of its work function.

Although the EL layer 103 preferably has a stacked-layer structure, there is no particular limitation on the stacked-layer structure, and various layers such as a hole-injection layer, a hole-transport layer, a light-emitting layer, an electron-transport layer, an electron-injection layer, a carrier-blocking layer (a hole-blocking layer and an electron-blocking layer), an exciton-blocking layer, and a charge-generation layer can be employed. Note that one or more of the above layers are not necessarily provided. This embodiment specifically describes below a structure including a hole-injection layer 111, a hole-transport layer 112, a light-emitting layer 113, an electron-transport layer 114, and the electron-injection layer 115, as illustrated in FIG. 10.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based compound such as phthalocyanine (abbreviation: $H_2Pc$), a phthalocyanine-based complex compound such as copper phthalocyanine (abbreviation: CuPc), an aromatic amine compound such as 4,4'-bis[N-(4-diphenylaminophenyl)-N-phenylamino]biphenyl (abbreviation: DPAB) or N,N'-bis[4-bis(3-methylphenyl)aminophenyl]-N,N'-diphenyl-4,4'-diaminobiphenyl (abbreviation: DNTPD), or a high molecular compound such as poly(3,4-ethylenedioxythiophene)/poly(styrenesulfonic acid) (abbreviation: PEDOT/PSS). The substance having an acceptor property can extract electrons from an adjacent hole-transport layer (or hole-transport material) by application of an electric field.

Among substances having an acceptor property, the organic compound having an acceptor property is easy to use because it is easily deposited by vapor deposition.

Alternatively, a composite material in which a material having a hole-transport property contains any of the aforementioned substances having an acceptor property can be used for the hole-injection layer 111. By using a composite material in which a material having a hole-transport property contains an acceptor substance, a material used to form an electrode can be selected regardless of its work function. In other words, besides a material having a high work function, a material having a low work function can be used for the anode.

As the material having a hole-transport property used for the composite material, any of a variety of organic compounds such as aromatic amine compounds, carbazole derivatives, aromatic hydrocarbons, and high molecular compounds (e.g., oligomers, dendrimers, or polymers) can be used. Note that the material having a hole-transport property used for the composite material preferably has a hole mobility of $1\times10^{-6}$ $cm^2/Vs$ or higher. Organic compounds that can be used as the material having a hole-transport property in the composite material are specifically given below.

Examples of the aromatic amine compound that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N-bis[4-bis(3-methylphenyl)aminophenyl]-N,N'-diphenyl-4,4'-diaminobiphenyl (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon including a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

Other examples include high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino} phenyl)methacrylamide](abbreviation: PTPDMA), and poly[N,N'-bis(4-butylphenyl)-N,N'-bis(phenyl)benzidine](abbreviation: poly-TPD).

The material having a hole-transport property used for the composite material further preferably has any of a carbazole skeleton, a dibenzofuran skeleton, a dibenzothiophene skeleton, and an anthracene skeleton. In particular, an aromatic amine including a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the organic compound including an N,N'-bis(4-biphenyl)amino group is preferable because an organic EL device having a long lifetime can be manufactured. Specific examples of the organic compound include N-(4-biphenyl)-6,N-diphenylbenzo[b]naphtho[1,2-d]furan-8-amine (abbreviation: BnfABP), N,N'-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N'-bis(4-biphenyl)benzo[b]naphtho[1,2-d]furan-6-amine (abbreviation: BBABnf(6)), N,N'-bis(4-biphenyl)benzo[b]naphtho[1,2-d]furan-8-amine (abbreviation: BBABnf(8)), N,N'-bis(4-biphenyl)benzo[b]naphtho[2,3-d]furan-4-amine (abbreviation: BBABnf(II)(4)), N,N'-bis[4-(dibenzofuran-4-yl)phenyl]-4-amino-p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N'-bis(biphenyl-4-yl)-9,9'-spirobi[9H-fluoren]-2-amine (abbreviation: BBASF), N,N'-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N'-bis(9,9-dimethyl-9H-fluoren-2-yl)-9,9'-spirobi-9H-fluoren-3-amine, N,N'-bis(9,9-dimethyl- 9H-fluoren-2-yl)-9,9'-spirobi-9H-fluoren-2-amine, and N,N'-bis(9,9-dimethyl-9H-fluoren-2-yl)-9,9'-spirobi-9H-fluoren-1-amine.

Note that it is further preferable that the material having a hole-transport property used for the composite material have a relatively deep highest occupied molecular orbital (HOMO) level higher than or equal to −5.7 eV and lower than or equal to −5.4 eV. Using the material with a hole-transport property which has a relatively deep HOMO level for the composite material makes it easy to inject holes into the hole-transport layer 112 and to obtain an organic EL device having a long lifetime. In addition, when the material having a hole-transport property used for the composite material has a relatively deep HOMO level, induction of holes can be inhibited properly and thus the organic EL device can have a longer lifetime.

Note that mixing the above composite material with a fluoride of an alkali metal or an alkaline earth metal (the proportion of fluorine atoms in a layer using the mixed material is preferably higher than or equal to 20%) can lower the refractive index of the layer. This also enables a layer with a low refractive index to be formed in the EL layer 103, leading to higher external quantum efficiency of the organic EL device.

The formation of the hole-injection layer 111 can improve the hole-injection property, which allows the organic EL device to be driven at a low voltage.

The hole-transport layer 112 is formed using a material having a hole-transport property. The material having a hole-transport property preferably has a hole mobility of $1\times10^{-6}$ $cm^2/Vs$ or higher.

Examples of the material having a hole-transport property include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(biphenyl-3-yl)-9'-(biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: PNCCP), 9-(3-biphenyl)-9'-(2-naphthyl)-3,3'-bi-9H-carbazole (abbreviation: PNCCmBP), 9-(4-biphenyl)-9'-(2-naphthyl)-3,3'-bi-9H-carbazole (abbreviation: PNCCBP), 9,9'-di-2-naphthyl-3,3'-9H,9'H-bicarbazole (abbreviation: BisPNCz), 9-(2-naphthyl)-9'-[1,1': 4', 1"-terphenyl]-3-yl-3,3'-9H,9'H-bicarbazole, 9-(2-naphthyl)-9'-[1,1': 3', 1"-terphenyl]-3-yl-3,3'-9H,9'H-bicarbazole, 9-(2-naphthyl)-9'-[1,1': 3', 1"-terphenyl]-5'-yl-3,3'-9H,9'H-bicarbazole, 9-(2-naphthyl)-9'-[1,1': 4', 1"-terphenyl]-4-yl-3,3'-9H,9'H-bicarbazole, 9-(2-naphthyl)-9'-[1,1': 3', 1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-9H,9'H-bicarbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, and 9-(triphenylen-2-yl)-9'-[1,1': 3', 1"-terphenyl]-4-yl-3,3'-9H,9'H-bicarbazole; compounds having a thiophene skeleton, such as 4,4', 4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBT-FLP-III), and 4-[4-(9-phenyl-9H-fluoren-9-yl)phenyl]-6-phenyldibenzothiophene (abbreviation: DBTFLP-IV); and compounds having a furan skeleton, such as 4,4', 4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the material having a hole-transport property used for the composite material for the hole-injection layer 111 can also be suitably used as the material contained in the hole-transport layer 112.

The light-emitting layer 113 preferably contains a light-emitting substance and a first organic compound. The second organic compound may be further contained. The light-emitting layer 113 may additionally contain other materials. Alternatively, the light-emitting layer 113 may be a stack of two layers with different compositions. The first organic compound preferably has an electron-transport property, and the second organic compound preferably has a hole-transport property.

The light-emitting substance may be any of fluorescent substances, phosphorescent substances, and substances exhibiting thermally activated delayed fluorescence (TADF).

Examples of the material that can be used as a fluorescent substance in the light-emitting layer 113 are as follows. Any other fluorescent substance can also be used.

The examples include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPm), N,N'-bis(3-methylphenyl)-N,N-bis[3-(9-phenyl-9H-fluoren-9-yl)phenyl]pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), N,N,N',N',N",N",N",N"-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine](abbreviation: 1,6BnfAPm-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPm-03 are particularly preferable because of their high hole-trapping properties, high emission efficiency, and high reliability.

Examples of the material that can be used when a phosphorescent substance is used as the light-emitting substance in the light-emitting layer 113 are as follows.

The examples include organometallic iridium complexes having a pyrimidine skeleton, such as (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), and bis[4,6-di(naphthalen-1-yl)pyrimidinato](dipivaloylmethanato)iridium(III) (abbreviation: $[Ir(dlnpm)_2(dpm)]$); organometallic iridium complexes having a pyrazine skeleton, such as (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), and (acetylacetonato)bis[2,3-bis(4-fluorophenyl)quinoxalinato]iridium(III) (abbreviation: $[Ir(Fdpq)_2(acac)]$); organometallic iridium complexes having a pyridine skeleton, such as tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), (3,7-diethyl-4,6-nonanedionato-κ$O^4$,κ$O^6$)bis[2,4-dimethyl-6-[7-(1-methylethyl)-1-isoquinolinyl-κN]phenyl-κC]iridium(III), and (3,7-diethyl-4,6-nonanedionato-κ$O^4$,κ$O^6$)bis[2,4-dimethyl-6-[5-(1-methylethyl)-2-quinolinyl-κN]phenyl-κC]iridium(III); platinum complexes such as 2,3,7,8,12,13,17,18-octaethyl-21H,23H-porphyrinplatinum(II) (abbreviation: PtOEP); and rare earth metal complexes such as tris(1,3-diphenyl-1,3-propanedionato)(monophenanthroline)europium(III) (abbreviation: $[Eu(DBM)_3(Phen)]$) and tris[1-(2-thenoyl)-3,3,3-trifluoroacetonato](monophenanthroline)europium(III) (abbreviation: $[Eu(TTA)_3(Phen)]$). These compounds have an emission peak in the wavelength range from 600 nm to 700 nm. Furthermore, the organometallic iridium complexes having a pyrazine skeleton can provide red light emission with favorable chromaticity. Note that other known red phosphorescent substances can also be used.

The examples include organometallic iridium complexes having a 4H-triazole skeleton, such as tris{2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz\text{-}dmp)_3]$) and tris(5-methyl-3,4-diphenyl-4H-1,2,4-triazolato)iridium(III) (abbreviation: $[Ir(Mptz)_3]$); organometallic iridium complexes having a 1H-triazole skeleton, such as tris[3-methyl-1-(2-methylphenyl)-5-phenyl-1H-1,2,4-triazolato]iridium(III) (abbreviation: $[Ir(Mptz1\text{-}mp)_3]$) and tris(1-methyl-5-phenyl-3-propyl-1H-1,2,4-triazolato)iridium(III) (abbreviation: $[Ir(Prptz1\text{-}Me)_3]$); organometallic iridium complexes having an imidazole skeleton, such asfac-tris[1-(2,6-diisopropylphenyl)-2-phenyl-1H-imidazole]iridium(III) (abbreviation: $[Ir(iPrpim)_3]$), tris[3-(2,6-dimethylphenyl)-7-methylimidazo[1,2-f]phenanthridinato]iridium(III) (abbreviation: $[Ir(dmpimpt\text{-}Me)_3]$), and tris(2-[1-{2,6-bis(1-methylethyl)phenyl}-1H-imidazol-2-yl-κ$N^3$]-4-cyanophenyl-κC)iridium(III) (abbreviation: CNImIr); organometallic complexes having a benzimidazolidene skeleton, such as tris[(6-tert-butyl-3-phenyl-2H-imidazo[4,5-b]pyrazin-1-yl-κ$C^2$)phenyl-κC]iridium(III) (abbreviation: $[Ir(cb)_3]$); and organometallic iridium complexes in which a phenylpyridine derivative including an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$I]iridium(III) picolinate (abbreviation: FIrpic), bis{2-[3',5'-bis(trifluoromethyl)phenyl]pyridinato-N,CCT}iridium(III) picolinate (abbreviation: $[Ir(CF3_ppy)_2(pic)]$), and bis[2-(4',6'-difluorophenyl)pyridinato-N,$C^{2'}$]iridium(III) acetylacetonate (abbreviation: FIr(acac)). These compounds exhibit blue phosphorescence and have an emission peak in the wavelength range from 440 nm to 520 nm.

Other examples include organometallic iridium complexes having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbomyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), and (acetylacetonato)bis(4,6-diphenylpyrimidinato)iridium(III) (abbreviation: $[Ir(dppm)_2(acac)]$); organometallic iridium complexes having a pyrazine skeleton, such as (acetylacetonato)bis(3,5-dimethyl-2-phenylpyrazinato)iridium(III) (abbreviation: $[Ir(mppr\text{-}Me)_2(acac)]$) and (acetylacetonato)bis(5-isopropyl-3-methyl-2-phenylpyrazinato)iridium(III) (abbreviation: $[Ir(mppr\text{-}iPr)_2(acac)]$); organometallic iridium complexes having a pyridine skeleton, such as tris(2-phenylpyridinato-N,CT)iridium(III) (abbreviation: $[Ir(ppy)_3]$), bis(2-phenylpyridinato-N,$C^2$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo [h]quinolinato)iridium(III) (abbreviation: $[Ir(bzq)_3]$), tris(2-phenylquinolinato-N,C$^{2'}$)iridium(III) (abbreviation: $[Ir(pq)_3]$), bis(2-phenylquinolinato-N,C$^{2'}$)iridium(III) acetylacetonate (abbreviation: $[Ir(pq)_2(acac)]$), [2-d3-methyl-8-(2-pyridinyl-KN)benzofuro[2,3-b]pyridine-κC]bis[2-(5-d3-methyl-2-pyridinyl-κN2)phenyl-κC]iridium(III) (abbreviation: $[Ir(5mppy\text{-}d3)_2(mbfpypy\text{-}d3)]$), [2-(methyl-d3)-8-[4-(1-methylethyl-1-d)-2-pyridinyl-κN]benzofuro[2, 3-b]pyridin-7-yl-κC]bis[5-(methyl-d3)-2-[5-(methyl-d3)-2-pyridinyl-KN]phenyl-κC]iridium(III) (abbreviation: $Ir(5mtpy\text{-}d6)_2(mbfpypy\text{-}iPr\text{-}d4)$), [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$ (mbfpypy-d3)), [2-(4-d3-methyl-5-phenyl-2-pyridinyl-1N$^2$) phenyl-κC]bis[2-(5-d3-methyl-2-pyridinyl-κN$^2$)phenyl-κC] iridium(III) (abbreviation: $[Ir(5mppy\text{-}d3)_2(mdppy\text{-}d3)]$), [2-methyl-(2-pyridinyl-κN)benzofuro[2,3-b]pyridine-κC] bis[2-(2-pyridinyl-KM)phenyl-κC]iridium(III) (abbreviation: $[Ir(ppy)_2(mbfpypy)]$), and [2-(4-methyl-5-phenyl-2-pyridinyl-K)phenyl-κC]bis[2-(2-pyridinyl-κN)phenyl-κC] iridium(III) (abbreviation: $Ir(ppy)_2(mdppy)$); and rare earth metal complexes such as tris(acetylacetonato)(monophenanthroline)terbium(III) (abbreviation: $[Tb(acac)_3$ (Phen)]). These are mainly compounds that exhibit green phosphorescence and have an emission peak in the wavelength range from 500 nm to 600 nm. Note that organometallic iridium complexes having a pyrimidine skeleton have distinctively high reliability and emission efficiency and thus are particularly preferable.

Examples of the TADF material include a fullerene, a derivative thereof, an acridine, a derivative thereof, and an eosin derivative. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structure formulae.

[Chemical Formula 22]

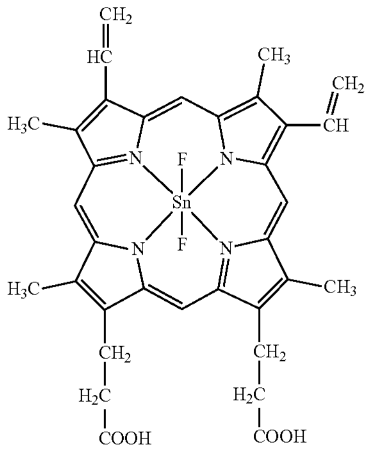

$SnF_2$(Proto IX)

-continued

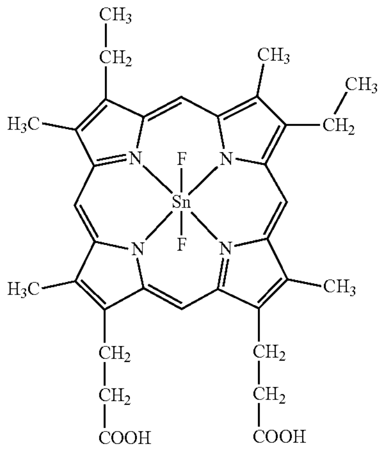

$SnF_2$(Meso IX)

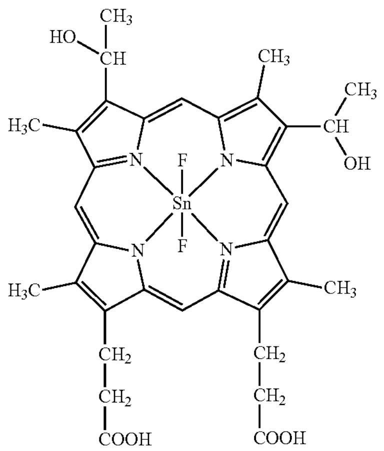

$SnF_2$(Hemato IX)

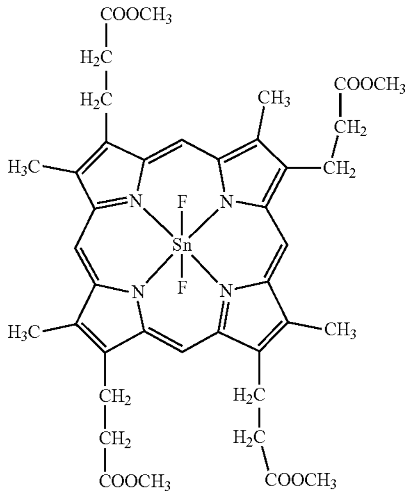

$SnF_2$(Copro III-4Me)

-continued

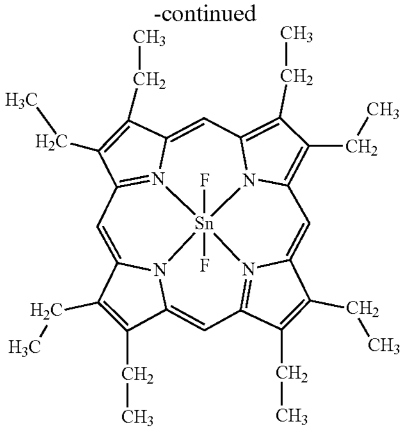

$SnF_2(OEP)$

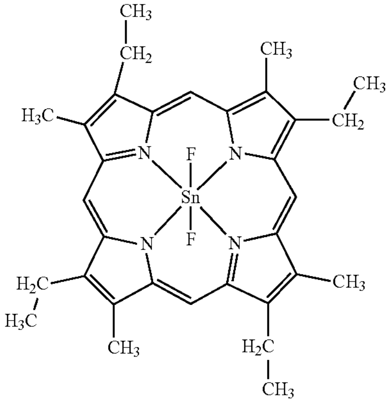

$SnF_2$(Etio I)

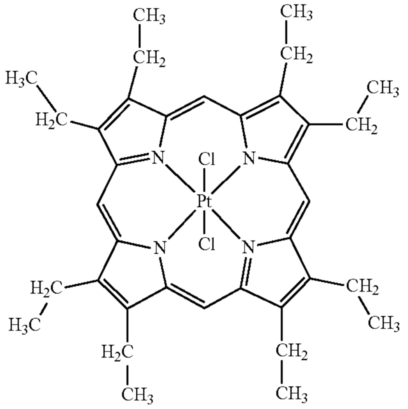

$PtCl_2OEP$

It is also possible to use any of heterocyclic compounds including one or both of a 71-electron rich heteroaromatic ring and a π-electron deficient heteroaromatic ring that are represented by the following structure formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-3,3'-bi-9H-carbazole (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), and 10-phenyl-10H,10'H-spiro[acridin-9,9'-anthracen]-10'-one (abbreviation: ACRSA). Such a heterocyclic compound is preferable because of its excellent electron-transport and hole-transport properties owing to a π-electron rich heteroaromatic ring and a π-electron deficient heteroaromatic ring. Among skeletons including the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons including the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the Si level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring including a cyano group or a nitrile group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 23]
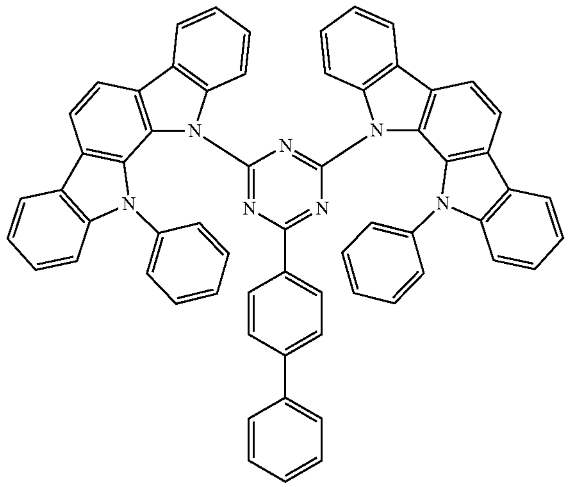
PIC-TRZ
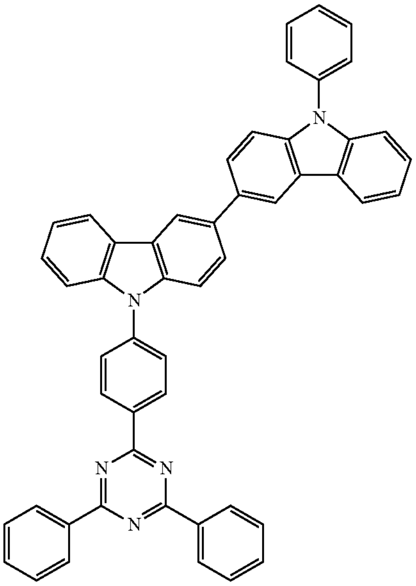
PCCzPTzn
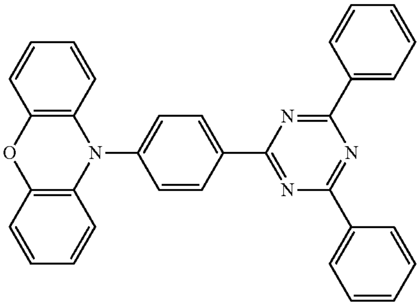
PXZ-TRZ
-continued
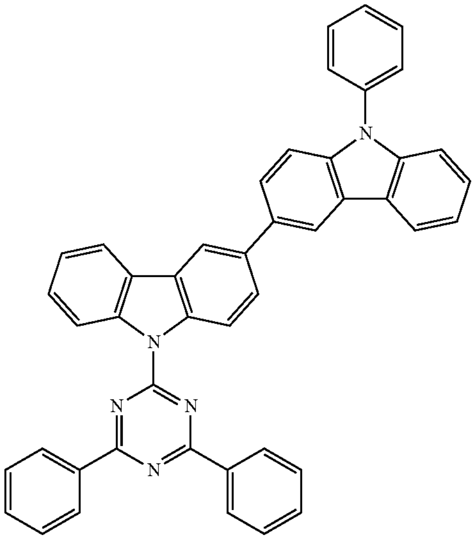
PCCzTzn
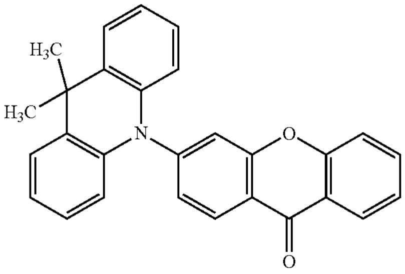
ACRXTN
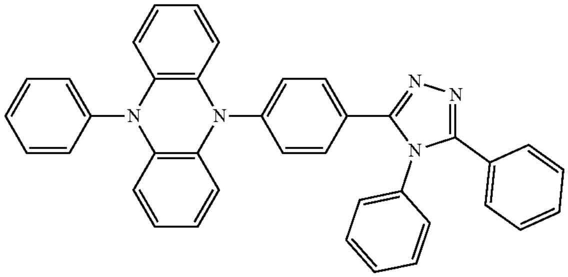
PPZ-3TPT
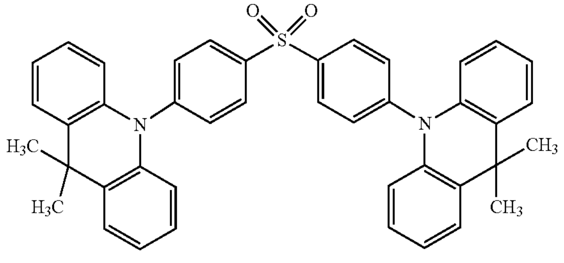
DMAC-DPS -continued

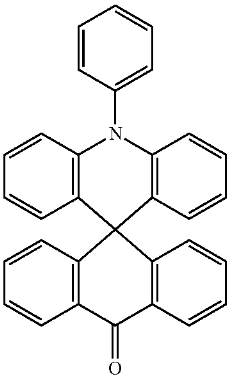

ACRSA

It is also possible to use a TADF material that enables reversible intersystem crossing at extremely high speed and emits light in accordance with a thermal equilibrium model between a singlet-excited state and a triplet-excited state. Since such a TADF material has an extremely short emission lifetime (excitation lifetime), an efficiency decrease of a light-emitting device in a high-luminance region can be inhibited. Specifically, a material having the following molecular structure can be used.

[Chemical Formula 24]

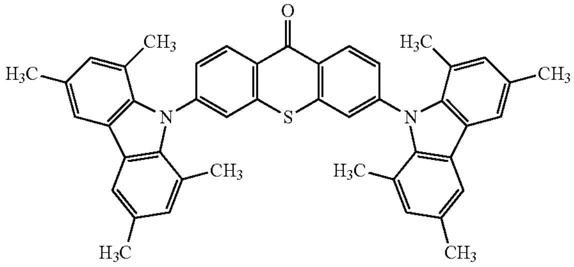

Note that a TADF material is a material having a small difference between the Si level and the T1 level and a function of converting triplet excitation energy into singlet excitation energy by reverse intersystem crossing. Thus, a TADF material can upconvert triplet excitation energy into singlet excitation energy (i.e., reverse intersystem crossing) using a small amount of thermal energy and efficiently generate a singlet-excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the level of energy with a wavelength of the line obtained by extrapolating a tangent to the fluorescent spectrum at a tail on the short wavelength side is the Si level and the level of energy with a wavelength of the line obtained by extrapolating a tangent to the phosphorescent spectrum at a tail on the short wavelength side is the T1 level, the difference between the Si level and the T1 level of the TADF material is preferably smaller than or equal to 0.3 eV, further preferably smaller than or equal to 0.2 eV.

When a TADF material is used as the light-emitting substance, the Si level of a host material is preferably higher than that of the TADF material. In addition, the T1 level of the host material is preferably higher than that of the TADF material.

As an electron-transport material used as the host material, for example, a metal complex such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), or bis[2-(2-benzothiazolyl)phenolato]zinc(II) (abbreviation: ZnBTZ); or an organic compound including a π-electron deficient heteroaromatic ring can be used. Examples of the organic compound including a π-electron deficient heteroaromatic ring include organic compounds including a heteroaromatic ring having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: COil), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); organic compounds including a heteroaromatic ring having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl] dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 2,4-bis[4-(1-naphthyl)phenyl]-6-[4-(3-pyridyl)phenyl]pyrimidine (abbreviation: 2,4NP-6PyPPm), 6-(biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(biphenyl-4-yl)pyrimidine (abbreviation: 6BP-4Cz2PPm), 7-[4-(9-phenyl-9H-carbazol-2-yl)quinazolin-2-yl]-7H-dibenzo[c,g]carbazole (abbreviation: PC-cgDBCzQz), 11-[(3'-dibenzothiophen-4-yl)biphenyl-3-yl]phenanthro[9', 10': 4,5]furo[2,3-b]pyrazine (abbreviation: 11mDBtBPPnfpr), 11-[(3'-dibenzothiophen-4-yl)biphenyl-4-yl]phenanthro[9', 10': 4.5]furo[2,3-b]pyrazine, 11-[3'-(9H-carbazol-9-yl)biphenyl-3-yl]phenanthro[9', 10': 4,5]furo[2,3-b]pyrazine, 12-(9'-phenyl-3,3'-bi-9H-carbazol-9-yl) phenanthro[9', 10': 4,5]furo[2,3-b]pyrazine (abbreviation: 12PCCzPnfpr), 9-[(3'-9-phenyl-9H-carbazol-3-yl)biphenyl-4-yl]naphtho[1', 2': 4,5]furo[2,3-b]pyrazine (abbreviation: 9pmPCBPNfpr), 9-(9'-phenyl-3,3'-bi-9H-carbazol-9-yl) naphtho[1',2':4,5]furo[2,3-b]pyrazine (abbreviation: 9PCCzNfpr), 10-(9'-phenyl-3,3'-bi-9H-carbazol-9-yl)naphtho[1',2':4,5]furo[2,3-b]pyrazine (abbreviation: 10PCCzNfpr), 9-[3'-(6-phenylbenzo[b]naphtho[1,2-d] furan-8-yl)biphenyl-3-yl]naphtho[1', 2': 4,5]furo[2,3-b] pyrazine (abbreviation: 9mBnfBPNfpr), 9-{3-[6-(9,9-dimethylfluoren-2-yl)dibenzothiophen-4-yl]phenyl}naphtho[1', 2': 4,5]furo[2,3-b]pyrazine (abbreviation: 9mFDBtPNfpr), 9-[3'-(6-phenyldibenzothiophen-4-yl)biphenyl-3-yl]naphtho[1', 2': 4,5]furo[2,3-b]pyrazine (abbreviation: 9mDBtBPNfpr-02), 9-[3-(9'-phenyl-3,3'-bi-9H-carbazol-9-yl)phenyl]naphtho[1', 2': 4,5]furo[2,3-b]pyrazine (abbreviation: 9mPCCzPNfpr), 9-[3'-(2,8-diphenyldibenzothiophen-4-yl)biphenyl-3-yl]naphtho[1', 2': 4,5]furo[2,3-b]pyrazine, and 11-[3'-(2,8-diphenyldibenzothiophen-4-yl)biphenyl-3-yl]phenanthro[9', 10': 4,5]furo[2,3-b]pyrazine; organic compounds including a heteroaromatic ring having a pyridine skeleton, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB); and organic compounds including a heteroaromatic ring having a triazine skeleton, such as 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), and 2-(biphenyl-3-yl)-4-phenyl-6-{8-[(1,1': 4', 1"-terphenyl)-4-yl]-1-dibenzofuranyl}-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine or pyrazine) skeleton and the organic compound including a heteroaromatic ring having a triazine skeleton have a high electron-transport property to contribute to a reduction in driving voltage.

As a hole-transport material used as the host material, an organic compound having an amine skeleton or a π-electron rich heteroaromatic ring can be used. Examples of the organic compound having an amine skeleton or a π-electron rich heteroaromatic ring include compounds having an aromatic amine skeleton, such as 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N'-bis(9,9'-spirobi[9H-fluoren]-2-yl)-N,N'-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), N-[4-(9-phenyl-9H-carbazol-3-yl)phenyl]bis(9,9-dimethyl-9H-fluoren-2-yl)amine (abbreviation: PCBFF), N-(1,1'-biphenyl-4-yl)-N-[4-(9-phenyl-9H-carbazol-3-yl)phenyl]-9,9-dimethyl-9H-fluoren-4-amine, N-[4-(9-phenyl-9H-carbazol-3-yl)phenyl]-(9,9-dimethyl-9H-fluoren-2-yl)-9,9-dimethyl-9H-fluoren-4-amine, N-(1,1'-biphenyl-4-yl)-N-[4-(9-phenyl-9H-carbazol-3-yl)phenyl]-9,9-diphenyl-9H-fluoren-2-amine, N-(1,1'-biphenyl-4-yl)-N-[4-(9-phenyl-9H-carbazol-3-yl)phenyl]-9,9-diphenyl-9H-fluoren-4-amine, N-(biphenyl-4-yl)-N-[4-(9-phenyl-9H-carbazol-3-yl)phenyl]-9,9'-spirobi[9H-fluoren]-4-amine (abbreviation: PCBBiSF), N-(1,1'-biphenyl-4-yl)-N-[4-(9-phenyl-9H-carbazol-3-yl)phenyl]-9,9'-spirobi(9H-fluoren)-4-amine, N-[4-(9-phenyl-9H-carbazol-3-yl)phenyl]-N-(1,1': 3', 1"-terphenyl-4-yl)-9,9-dimethyl-9H-fluoren-2-amine, N-[4-(9-phenyl-9H-carbazol-3-yl)phenyl]-N-(1,1': 4', 1"-terphenyl-4-yl)-9,9-dimethyl-9H-fluoren-2-amine, N-[4-(9-phenyl-9H-carbazol-3-yl)phenyl]-N-(1,1': 3', 1"-terphenyl-4-yl)-9,9-dimethyl-9H-fluoren-4-amine, and N-[4-(9-phenyl-9H-carbazol-3-yl)phenyl]-N-(1,1': 4', 1"-terphenyl-4-yl)-9,9-dimethyl-9H-fluoren-4-amine; compounds having a thiophene skeleton, such as 4,4', 4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the material having a hole-transport property that can be used for the hole-transport layer 112 can also be used as the hole-transport material that is the host material.

By mixing the electron-transport material with the hole-transport material, the transport property of the light-emitting layer 113 can be easily adjusted and a recombination region can be easily controlled. The TADF material can be used as the electron-transport material or the hole-transport material.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of an organic EL device can be increased. Here, the TADF material functions as an energy donor, and the light-emitting substance functions as an energy acceptor.

This is very effective in the case where the light-emitting substance is a fluorescent substance. In that case, the Si level of the TADF material is preferably higher than that of the fluorescent substance in order that high emission efficiency can be achieved. Furthermore, the T1 level of the TADF material is preferably higher than the Si level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably includes a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance including any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. Among the substances having an anthracene skeleton, a substance having a diphenylanthracene skeleton, in particular, a substance having a 9,10-diphenylanthracene skeleton, is chemically stable and thus is preferably used as the host material. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV and thus holes enter the host material easily, the hole-transport property is improved, and the heat resistance is increased. Accordingly, a substance that has both a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-[4'-(9-phenyl-9H-fluoren-9-yl)biphenyl-4-yl]anthracene (abbreviation: FLPPA), 9-(1-naphthyl)-10-[4-(2-naphthyl) phenyl]anthracene (abbreviation: aN-PNPAnth), 9-(1-naphthyl)-10-(2-naphthyl)anthracene (abbreviation: α,β-ADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: PN-mPNPAnth), 1-[4-(10-(biphenyl-4-yl)-9-anthracenyl)phenyl]-2-ethyl-1H-benzimidazole (abbreviation: EtBImPBPhA), 2,9-di(1-naphthyl)-10-phenylanthracene (abbreviation: 2αN-αNPhA), 9-(1-naphthyl)-10-[3-(1-naphthyl)phenyl]anthracene (abbreviation: αN-mαNPAnth), 9-(2-naphthyl)-10-[3-(1-naphthyl)phenyl] anthracene (abbreviation: βN-mαNPAnth, 9-(1-naphthyl)-10-[4-(1-naphthyl)phenyl]anthracene (abbreviation: αN-αNPAnth), 9-(2-naphthyl)-10-[4-(2-naphthyl)phenyl] anthracene (abbreviation: βN-βNPAnth), and 2-(1-naphthyl)-9-(2-naphthyl)-10-phenylanthracene (abbreviation: 2αN-βNPhA). In particular, CzPA, cgDBCzPA, 2mBnfPPA, and PCzPA have excellent characteristics and thus are preferably selected.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of the mixed materials. These mixed materials are preferably selected so as to form an exciplex that exhibits light emission whose wavelength overlaps with the wavelength on a lowest-energy-side absorption band of the light-emitting substance, in which case energy can be transferred smoothly and light emission can be obtained efficiently. The use of such a structure is preferable because the driving voltage can also be reduced.

Note that at least one of the materials forming an exciplex may be a phosphorescent substance. In this case, triplet excitation energy can be efficiently converted into singlet excitation energy by reverse intersystem crossing.

Combination of a material having an electron-transport property and a material having a hole-transport property whose HOMO level is higher than or equal to that of the material having an electron-transport property is preferable for forming an exciplex efficiently. In addition, the lowest unoccupied molecular orbital (LUMO) level of the material having a hole-transport property is preferably higher than or equal to that of the material having an electron-transport property. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

In the case where a hole-blocking layer is provided, the hole-blocking layer is in contact with the light-emitting layer 113, and is formed to contain an organic compound having an electron-transport property and being capable of blocking holes. As the organic compound in the hole-blocking layer, a material having a high electron-transport property, a low hole-transport property, and a deep HOMO level is suitably used. Specifically, it is preferable to use a substance having a deeper HOMO level than the material contained in the light-emitting layer 113 by 0.5 eV or more and having an electron mobility of $1\times10^{-6}$ $cm^2/Vs$ or higher when the square root of the electric field strength [V/cm]is 600.

In particular, 2-{3-[3-(N-phenyl-9H-carbazol-3-yl)-9H-carbazol-9-yl]phenyl}dibenzo[f,h]quinoxaline (abbreviation: 2mPCCzPDBq), 2-{3-[2-(N-phenyl-9H-carbazol-3-yl)-9H-carbazol-9-yl]phenyl}dibenzo[f,h]quinoxaline (abbreviation: 2mPCCzPDBq-02), 2-{3-[3-(N-phenyl-9H-carbazol-2-yl)-9H-carbazol-9-yl]phenyl}dibenzo[f,h]quinoxaline (abbreviation: 2mPCCzPDBq-03), 2-{3-[3-(N-(3,5-di-tert-butylphenyl-9H-carbazol-3-yl)-9H-carbazol-9-yl]phenyl}dibenzo[f,h]quinoxaline, 9-[3-(4,6-diphenyl-1,3,5-triazin-2-yl)phenyl]-9'-phenyl-3,3'-bi-9H-carbazole (abbreviation: mPCCzPTzn), 9-[3-(4,6-diphenyl-1,3,5-triazin-2-yl)phenyl]-9'-phenyl-2,3'-bi-9H-carbazole (abbreviation: mPCCzPTzn-02), 9-[4-(4,6-diphenyl-1,3,5-triazin-2-yl)phenyl]-9'-phenyl-3,3'-bi-9H-carbazole (abbreviation: PCCzPTzn), 9-(4,6-diphenyl-1,3,5-triazin-2-yl)-9'-phenyl-3,3'-bi-9H-carbazole (abbreviation: PCCzTzn(CzT)), 9-[3-(4,6-diphenyl-pyrimidin-2-yl)phenyl]-9'-phenyl-3,3'-bi-9H-carbazole (abbreviation: 2PCCzPPm), 9-(4,6-diphenyl-pyrimidin-2-yl)-9'-phenyl-3,3'-bi-9H-carbazole (abbreviation: 2PCCzPm), 4-[2-(N-phenyl-9H-carbazol-3-yl)-9H-carbazol-9-yl]benzofuro[3,2-d]pyrimidine (abbreviation: 4PCCzBfpm-02), 4-{3-[3-(N-phenyl-9H-carbazol-3-yl)-9H-carbazol-9-yl]phenyl}benzo[h]quinazoline, and 9-[3-(2,6-diphenyl-pyridin-4-yl)phenyl]-9'-phenyl-3,3'-bi-9H-carbazole are preferable because of their high heat resistance.

In the case of using other materials for the hole-blocking layer, an organic compound having a deeper HOMO level than the material contained in the light-emitting layer 113 is selected from materials that can be used for a hole-transport layer, which will be described later.

For the electron-transport layer 114, it is preferable to use an organic compound with an electron mobility of $1\times10^{-6}$ $cm^2/Vs$ or higher when the square root of the electric field strength [V/cm]is 600. Note that any other substance can also be used as long as the substance has an electron-transport property higher than a hole-transport property. An organic compound including a π-electron deficient heteroaromatic ring is preferable as the above organic compound. The organic compound including a π-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton.

Specific examples of the organic compound including a π-electron deficient heteroaromatic ring that can be used for the above electron-transport layer include organic compounds having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: C011), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs); organic compounds including a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 3,5-bis[3-(9H-carbazol-9-yl)phenyl]pyridine (abbreviation: 35DCzPPy), bathophenanthroline (abbreviation: BPhen), bathocuproine (abbreviation: BCP), and 2,9-di(naphthalen-2-yl)-4,7-diphenyl-1,10-phenanthroline (abbreviation: NBPhen); organic compounds having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[3'-(dibenzothiophen-4-yl)biphenyl-3-yl]naphtho[1', 2': 4,5]furo[2,3-b]pyrazine (abbreviation: 9mDBtBPNfpr), 9-[(3'-dibenzothiophen-4-yl)biphenyl-4-yl]naphtho[1', 2': 4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl]pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(biphenyl-4-yl)-4-[3-(dibenzothiophen-4-yl)phenyl]-[1]benzofuro[3,2-d]pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(biphenyl-3-yl)]naphtho[1', 2': 4,5]furo[3,2-d]pyrimidine (abbreviation: 8mDBtBPNfpm), 8-[(2,2'-binaphthalen)-6-yl]-4-[3-(dibenzothiophen-4-yl)phenyl]-[1]benzofuro[3,2-d]pyrimidine (abbreviation: 8(PN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl)bis{4-[4-(2-naphthyl)phenyl]-6-phenylpyrimidine}(abbreviation: 2,6(NP-PPm)2Py), 6-(biphenyl-3-yl)-4-[3,5-bis(9H-carbazol-9-yl)phenyl]-2-phenylpyrimidine (abbreviation: 6mBP-4Cz2PPm), 2,4-bis[4-(1-naphthyl)

phenyl]-6-[4-(3-pyridyl)phenyl]pyrimidine (abbreviation: 2,4NP-6PyPPm), 4-[3,5-bis(9H-carbazol-9-yl)phenyl]-2-phenyl-6-(biphenyl-4-yl)pyrimidine (abbreviation: 6BP-4Cz2PPm), 7-[4-(9-phenyl-9H-carbazol-2-yl)quinazolin-2-yl]-7H-dibenzo[c,g]carbazole (abbreviation: PC-cgDBCzQz), 8-(1,1': 4', 1"-terphenyl-3-yl)-4-[3-(dibenzothiophen-4-yl)phenyl]-[1]benzofuro[3,2-d]pyrimidine (abbreviation: 8mpTP-4mDBtPBfpm), 4,8-bis[3-(dibenzofuran-4-yl)phenyl]benzofuro[3,2-d]pyrimidine, 8-(1,1': 4', 1"-terphenyl-3-yl)-4-[3-(dibenzothiophen-4-yl)biphenyl-4-yl]-benzofuro[3,2-d]pyrimidine, 4,8-bis[3-(9H-carbazol-9-yl)phenyl]benzofuro[3,2-d]pyrimidine (abbreviation: 4,8mCzP2Bfpm), 8-(1,1': 4,1"-terphenyl-3-yl)-4-[3-(9-phenyl-9H-carbazol-3-yl)phenyl]-benzofuro[3,2-d]pyrimidine, 8-(1,1'-biphenyl-4-yl)-4-[3-(9-phenyl-9H-carbazol-3-yl)biphenyl-3-yl]-benzofuro[3,2-d]pyrimidine, 8-(1,1'-biphenyl-4-yl)-4-{3-[2-(N-phenyl-9H-carbazol-3-yl)-9H-carbazol-9-yl]phenyl}benzofuro[3,2-d]pyrimidine, 8-phenyl-4-{3-[2-(N-phenyl-9H-carbazol-3-yl)-9H-carbazol-9-yl] phenyl}benzofuro[3,2-d]pyrimidine, and 8-(1,1'-biphenyl-4-yl)-4-(3,5-di-9H-carbazol-9-yl-phenyl)benzofuro[3,2-d] pyrimidine; and organic compounds having a triazine skeleton, such as 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl) phenyl]phenyl}-4,6-diphenyl-1,3,5-triazine (abbreviation: mBnfBPTzn-02), 9-[4-(4,6-diphenyl-1,3,5-triazin-2-yl)phenyl]-9'-phenyl-3,3'-bi-9H-carbazole (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthryl)phenyl]-4,6-diphenyl-1,3,5-triazine (abbreviation: mPn-mDMePyPTzn), 11-[4-(biphenyl-4-yl)-6-phenyl-1,3,5-triazin-2-yl]-11,12-dihydro-12-phenylindolo[2,3-a] carbazole (abbreviation: BP-Icz(II)Tzn), 2-[3'-(triphenylen-2-yl)biphenyl-3-yl]-4,6-diphenyl-1,3,5-triazine (abbreviation: mTpBPTzn), 3-[9-(4,6-diphenyl-1,3,5-triazin-2-yl)-2-dibenzofuranyl]-9-phenyl-9H-carbazole (abbreviation: PCDBfTzn), and 2-(biphenyl-3-yl)-4-phenyl-6-{8-[(1,1':4',1"-terphenyl)-4-yl]-1-dibenzofuranyl}-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine or pyrazine) skeleton and the organic compound including a heteroaromatic ring having a triazine skeleton have high electron-transport properties to contribute to a reduction in driving voltage.

Note that the electron-transport layer 114 having this structure also serves as the electron-injection layer 115 in some cases.

A layer containing an alkali metal, an alkaline earth metal, a compound thereof, or a complex thereof such as lithium fluoride (LiF), cesium fluoride (CsF), calcium fluoride ($CaF_2$), or 8-quinolinolato-lithium (abbreviation: Liq) is preferably provided as the electron-injection layer 115 between the electron-transport layer 114 and the second electrode 102 that is a common electrode (cathode). Alternatively, a film formed by co-evaporation of ytterbium (Yb) and lithium is preferably provided. As the electron-injection layer 115, an electride or a layer that is formed using a substance having an electron-transport property and that contains an alkali metal, an alkaline earth metal, or a compound thereof may be used. Examples of the electride include a substance in which electrons are added at high concentration to calcium oxide-aluminum oxide.

Note that as the electron-injection layer 115, it is possible to use a layer containing a substance that has an electron-transport property (preferably an organic compound having a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, an organic EL device including the layer can have high external quantum efficiency.

For the cathode, a metal, an alloy, an electrically conductive compound, a mixture thereof each having a low work function (specifically, lower than or equal to 3.8 eV), or the like can be used. Specific examples of such a cathode material include elements belonging to Group 1 or 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode and the electron-transport layer, a variety of conductive materials such as Al, Ag, ITO, and indium oxide-tin oxide containing silicon or silicon oxide can be used for the cathode regardless of the work function.

Films of these conductive materials can be formed by a dry process such as a vacuum evaporation method or a sputtering method, an ink-jet method, a spin coating method, or the like. Alternatively, a wet process using a sol-gel method or a wet process using a paste of a metal material may be employed.

Furthermore, any of a variety of methods can be used for forming the EL layer 103, regardless of a dry process or a wet process. For example, a vacuum evaporation method, a gravure printing method, an offset printing method, a screen printing method, an ink-jet method, a spin coating method, or the like may be used.

Different methods may be used to form the electrodes or the layers described above.

The structure of the layers provided between the anode and the cathode is not limited to the above-described structure. Preferably, a light-emitting region where holes and electrons recombine is positioned away from the anode and the cathode so as to inhibit quenching due to the proximity of the light-emitting region and a metal used for electrodes and carrier-injection layers.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a substance having a wider band gap than the light-emitting material of the light-emitting layer or the light-emitting material contained in the light-emitting layer.

Note that the structure described in this embodiment can be used in combination with any of the structures described in the other embodiments as appropriate.

Embodiment 5

Figure 11A:
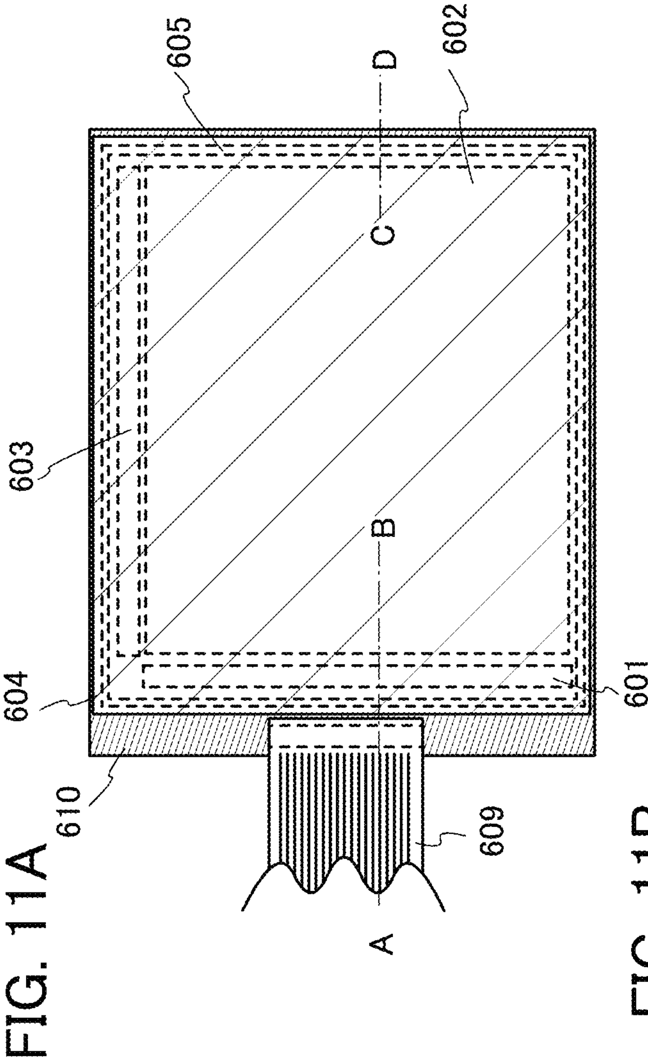
FIGS. 11A and 11B illustrate an active matrix light-emitting apparatus.
Figure 11B:
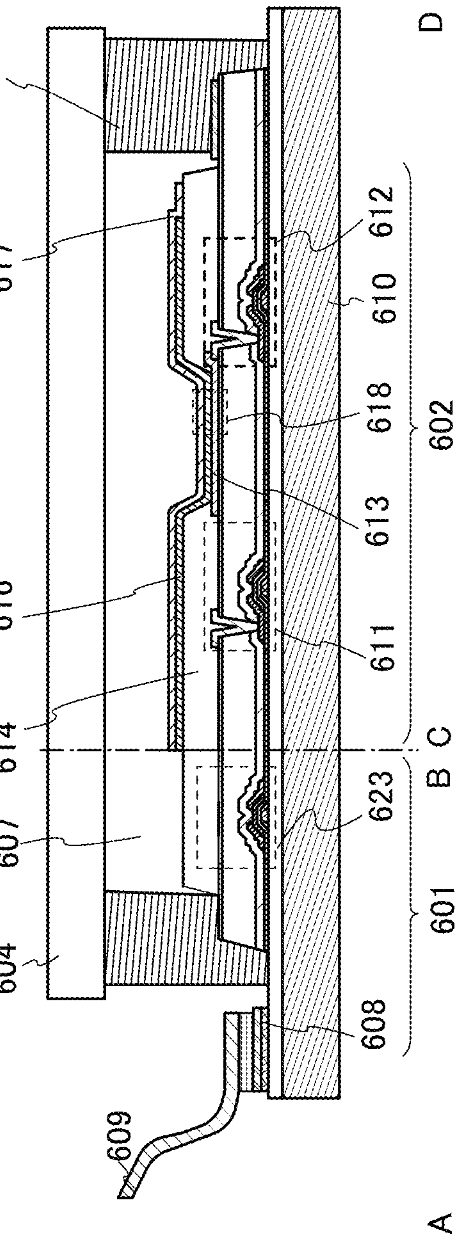

In this embodiment, a light-emitting apparatus that includes an organic EL device manufactured by the method for manufacturing the organic EL device described in Embodiments 2 and 3 is described with reference to FIGS. 11A and 111B. Note that FIG. 11A is a top view of the light-emitting apparatus and FIG. 11B is a cross-sectional view taken along the dashed-dotted lines A-B and C-D in FIG. 11A. This light-emitting apparatus includes a driver circuit portion (source line driver circuit portion) 601, a pixel portion 602, and a driver circuit portion (gate line driver circuit) 603, which are to control light emission of an organic EL device and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit portion 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 11B. The driver circuit portions and the pixel portion are formed over an element substrate 610; here, the source line driver circuit portion 601, which is a driver circuit portion, and one pixel in the pixel portion 602 are illustrated.

The element substrate 610 may be a substrate containing glass, quartz, an organic resin, a metal, an alloy, a semiconductor, or the like or a plastic substrate formed of fiber reinforced plastic (FRP), poly(vinyl fluoride) (PVF), polyester, acrylic resin, or the like.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because deterioration of the transistor characteristics can be inhibited.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (Mrepresents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic apparatus with extremely low power consumption can be obtained.

For stable characteristics or the like of the transistor, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a CVD method (e.g., a plasma CVD method, a thermal CVD method, or an MOCVD method), an ALD method, a coating method, a printing method, or the like. Note that the base film is not necessarily provided.

Note that an FET 623 is illustrated as a transistor formed in the source line driver circuit portion 601. The driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve the coverage with an EL layer or the like that is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, the first electrode 613 serves as an anode. A material having a high work function is preferably used as a material of the anode. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of any of these films and a film containing silver as its main component, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiments 1 and 3.

As a material used for the second electrode 617, which is formed over the EL layer 616, a material having a low work function (e.g., Al, Mg, Li, or Ca, or an alloy or a compound thereof, such as MgAg, MgIn, or AlLi) is preferably used. In the case where light generated in the EL layer 616 passes through the second electrode 617, a stack of a thin metal or alloy film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the organic EL device is formed with the first electrode 613, the EL layer 616, and the second electrode 617. The organic EL device is manufactured by the method for manufacturing the organic EL device described in Embodiments 2 and 3. In the light-emitting apparatus of this embodiment, the pixel portion, which includes a plurality of organic EL devices, may include both the organic EL device manufactured by the method for manufacturing the organic EL device described in Embodiments 2 and 3 and an organic EL device having a different structure. In that case, in the light-emitting apparatus of one embodiment of the present invention, a common hole-transport layer can be used for organic EL devices that emit light with different wavelengths, allowing the light-emitting apparatus to be manufactured in a simple process at low costs.

The sealing substrate 604 is attached to the element substrate 610 with the sealing material 605, so that an organic EL device 618 is provided in the space 607 surrounded by the element substrate 610, the sealing substrate 604, and the sealing material 605. The space 607 is filled with a filler, and may be filled with an inert gas (such as nitrogen or argon), or the sealing material. It is preferable that the sealing substrate be provided with a recessed portion and a drying agent be provided in the recessed portion, in which case deterioration due to influence of moisture can be inhibited.

An epoxy resin or glass frit is preferably used for the sealing material 605. It is preferable that such a material transmit moisture or oxygen as little as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 11A and 11B, a protective film may be provided over the cathode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an ALD method. A material that can be deposited by an ALD method is preferably used for the protective film. A dense protective film having reduced defects such as cracks and pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus that includes the organic EL device manufactured by the method for manufacturing the organic EL device described in Embodiments 2 and 3 can be obtained.

The light-emitting apparatus in this embodiment includes the organic EL device manufactured by the method for manufacturing the organic EL device described in Embodiments 2 and 3 and thus can have favorable characteristics.

Figure 13A:
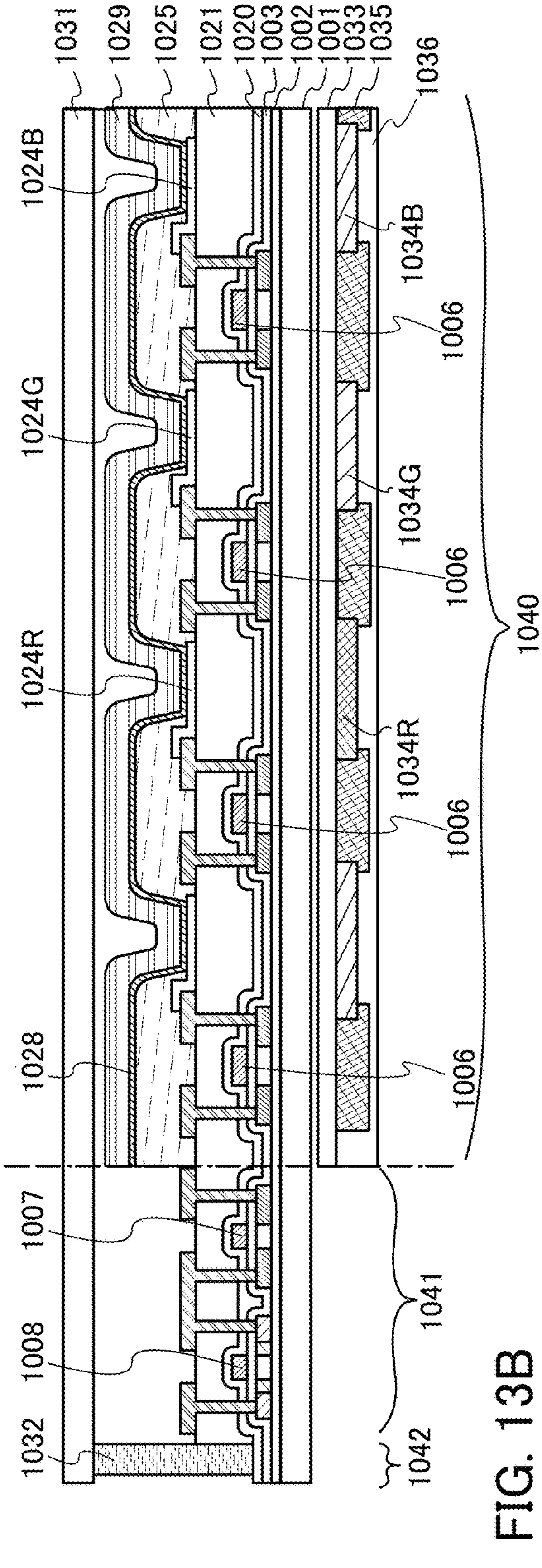
FIGS. 13A and 13B each illustrate an active matrix light-emitting apparatus.
Figure 13B:
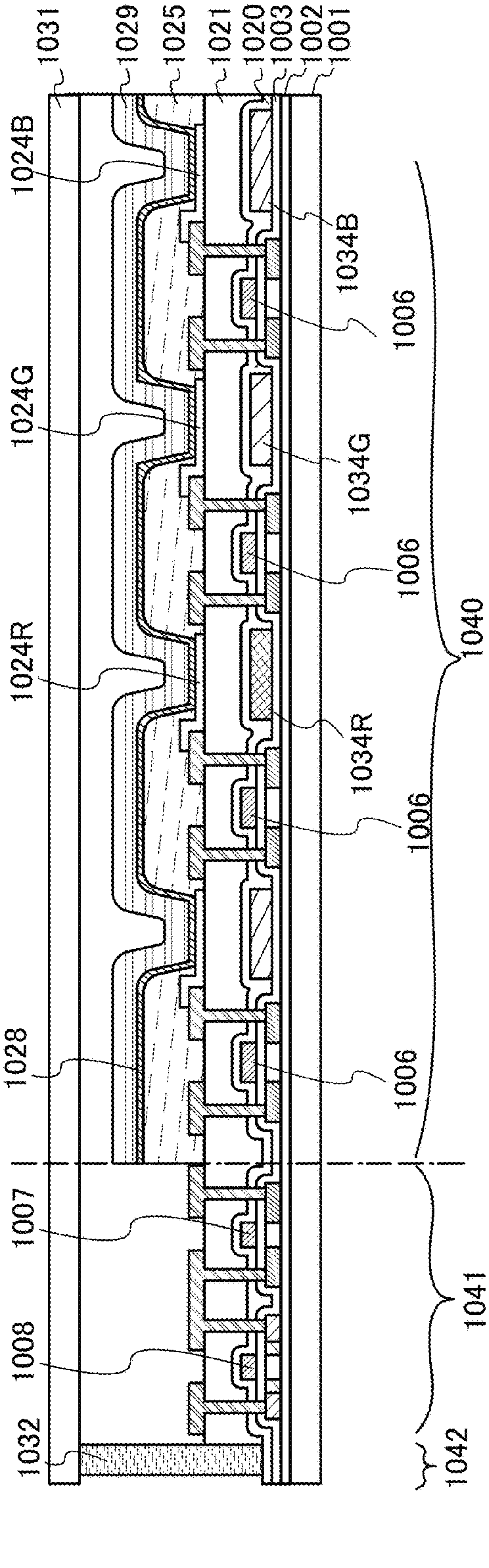

FIGS. 13A and 13B each illustrate an example of a light-emitting apparatus that includes coloring layers (color filters) and the like to improve color purity. FIG. 13A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of organic EL devices, a partition 1025, an EL layer 1028, a common electrode (cathode) 1029 of the organic EL devices, a sealing substrate 1031, a sealing material 1032, and the like.

In FIG. 13A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 13B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 12:
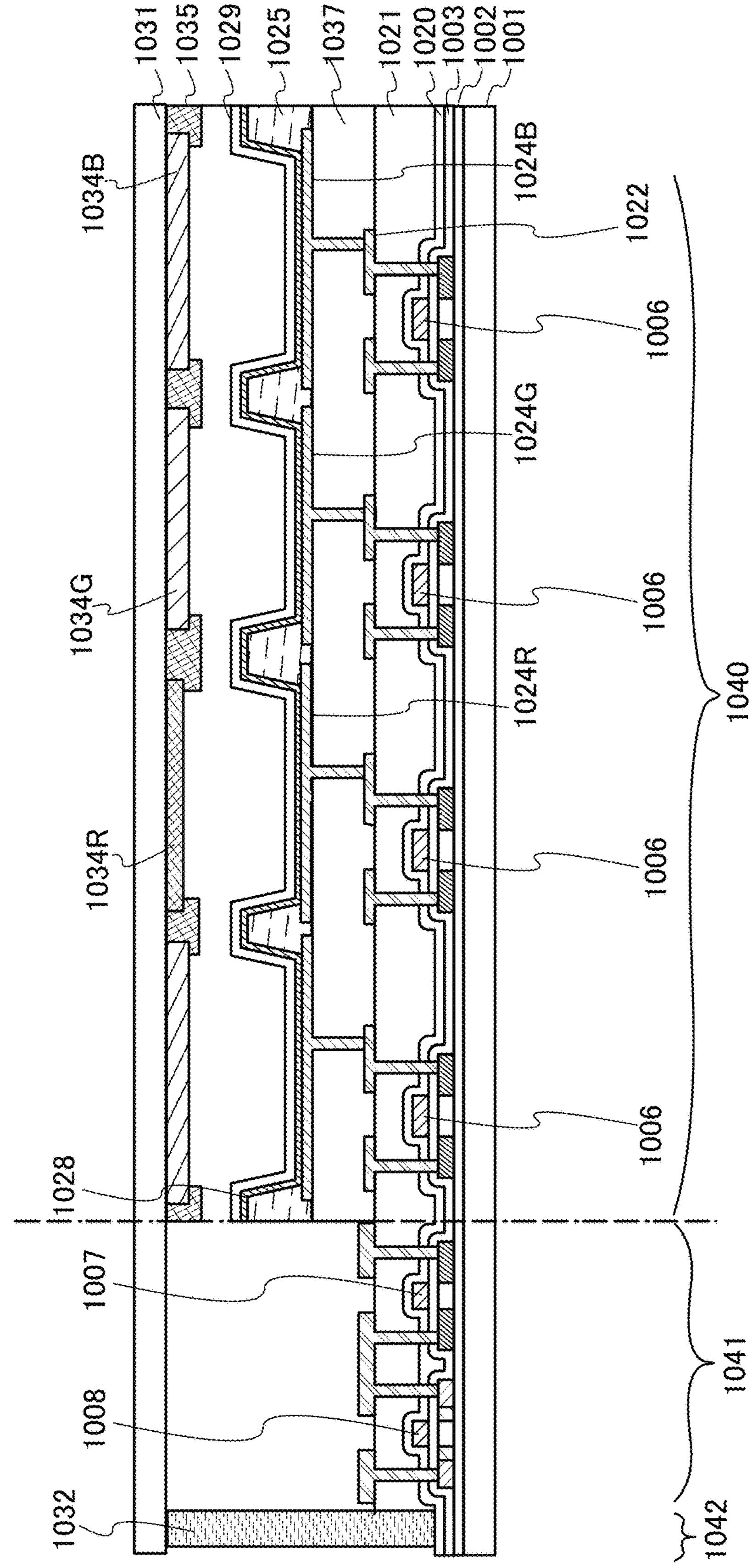
FIG. 12 illustrates an active matrix light-emitting apparatus.

The above-described light-emitting apparatus has a structure in which light is extracted to the substrate 1001 side where FETs are formed (a bottom emission structure), but may have a structure in which light is extracted to the sealing substrate 1031 side (a top emission structure). FIG. 12 is a cross-sectional view of a light-emitting apparatus having a top emission structure. In this case, a substrate that does not transmit light can be used as the substrate 1001. The process up to the step of forming a connection electrode that connects the FET and the anode of the organic EL device is performed in a manner similar to that of the light-emitting apparatus having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024R, 1024G, and 1024B of the organic EL devices each serve as an anode here, but may serve as a cathode. Furthermore, in the case of a light-emitting apparatus having a top emission structure as illustrated in FIG. 12, the anodes are preferably reflective electrodes. The EL layer 1028 is formed to have a structure similar to the structure of the EL layer 103 described in Embodiment 4.

In the case of the top emission structure as illustrated in FIG. 12, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) and the black matrix 1035 may be covered with an overcoat layer (not illustrated). Note that a light-transmitting substrate is used as the sealing substrate 1031.

In the light-emitting apparatus having a top emission structure, a microcavity structure can be favorably employed. An organic EL device with a microcavity structure is formed with the use of an electrode including a reflective electrode as one of the electrodes and a transflective electrode as the other electrode. At least an EL layer is positioned between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the organic EL device, by changing thicknesses of the transparent conductive film, the composite material, the carrier-transport material, and the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or more and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem organic EL device described above may be combined with a plurality of EL layers; for example, an organic EL device may have a structure in which a plurality of EL layers are provided with a charge-generation layer provided therebetween, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is manufactured including the organic EL device manufactured by the method for manufacturing the organic EL device described in Embodiments 2 and 3 and thus can have favorable characteristics. In the light-emitting apparatus described above, many minute organic EL devices arranged in a matrix can each be controlled; thus, the light-emitting apparatus can be suitably used as a display apparatus for displaying images.

This embodiment can be freely combined with any of the other embodiments.

Embodiment 6

In this embodiment, examples of electronic apparatuses each including an organic EL device manufactured by the method for manufacturing the organic EL device described in Embodiments 2 and 3 are described.

Examples of the electronic apparatus including the above organic EL device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic apparatuses are shown below.

Figure 14A:
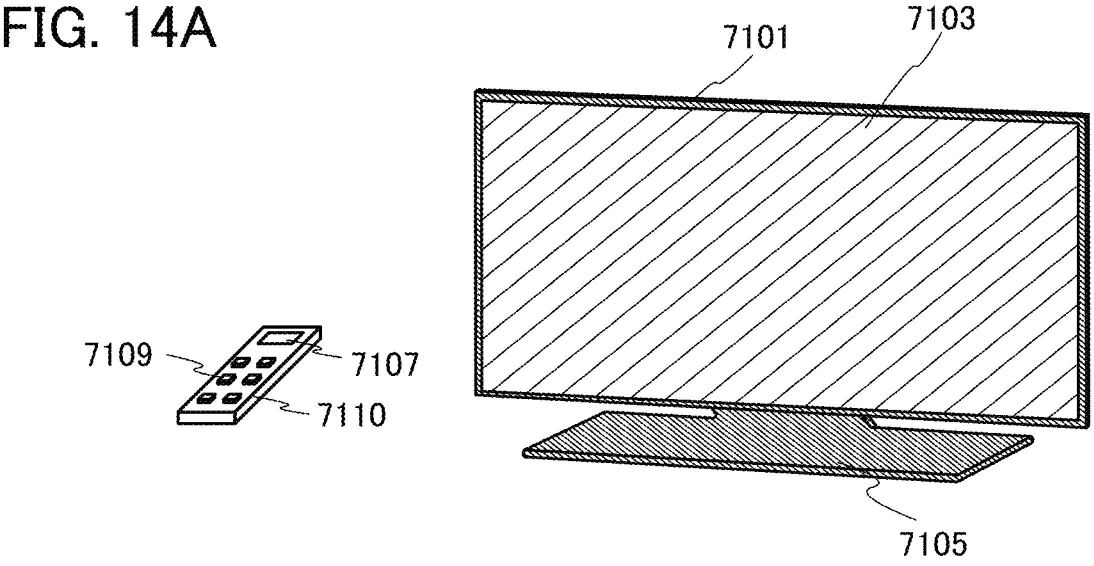
Figure 14A:
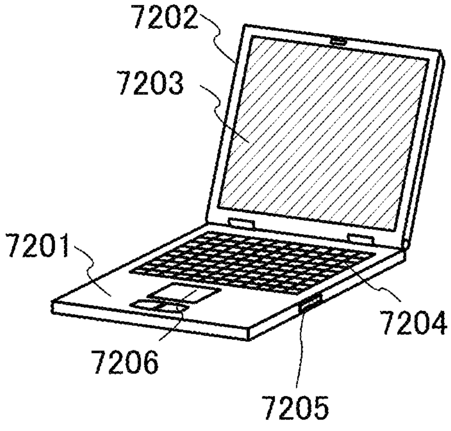
Figure 14A:
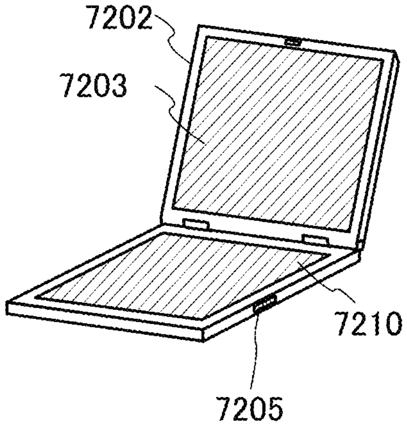

FIG. 14A illustrates an example of a television device. In the television device, a display portion 7103 is incorporated in a housing 7101. Here, the housing 7101 is supported by a stand 7105. Images can be displayed on the display portion 7103, and in the display portion 7103, the organic EL devices manufactured by the method for manufacturing the organic EL device described in Embodiments 2 and 3 are arranged in a matrix.

The television device can be operated with an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110. The organic EL devices manufactured by the method for manufacturing the organic EL device described in Embodiments 2 and 3 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) data communication can be performed.

Figure 1A:
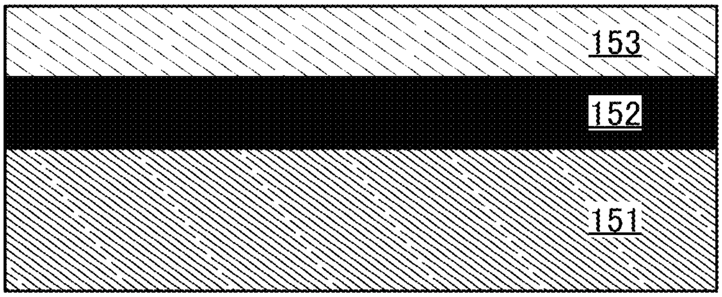
FIGS. 1A to 1C each illustrate one embodiment of the present invention.
Figure 1B:
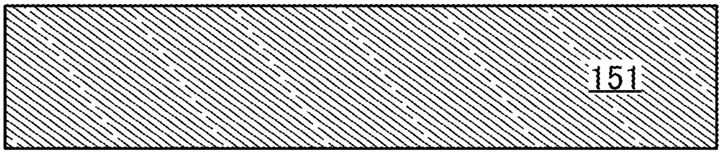
Figure 1C:
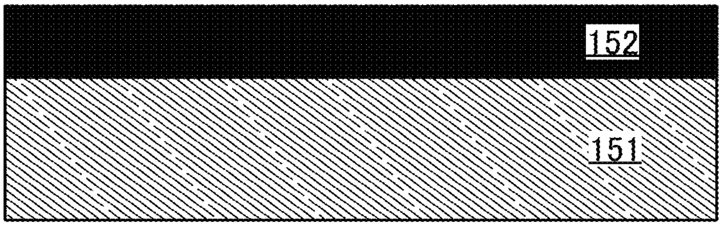

FIG. 14B1 illustrates a computer, which includes a main body 7201, a housing 7202, a display portion 7203, a keyboard 7204, an external connection port 7205, a pointing device 7206, and the like. Note that this computer includes organic EL devices manufactured by the method for manufacturing the organic EL device described in Embodiments 2 and 3 and arranged in a matrix in the display portion 7203. The computer illustrated in FIG. 14B1 may have a structure illustrated in FIG. 14B2. A computer illustrated in FIG. 14B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 14C:
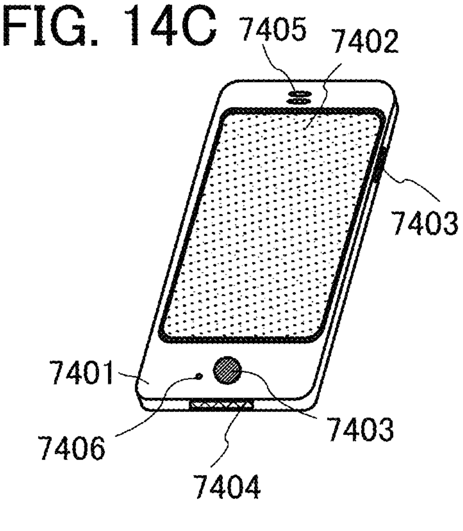

FIG. 14C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone includes the display portion 7402 in which the organic EL devices manufactured by the method for manufacturing the organic EL device described in Embodiments 2 and 3 are arranged in a matrix.

When the display portion 7402 of the portable terminal illustrated in FIG. 14C is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be captured.

As described above, the application range of the light-emitting apparatus including the organic EL device manufactured by the method for manufacturing the organic EL device described in Embodiments 2 and 3 is extremely wide, and thus the light-emitting apparatus can be applied to electronic apparatuses in a variety of fields.

Figure 15A:
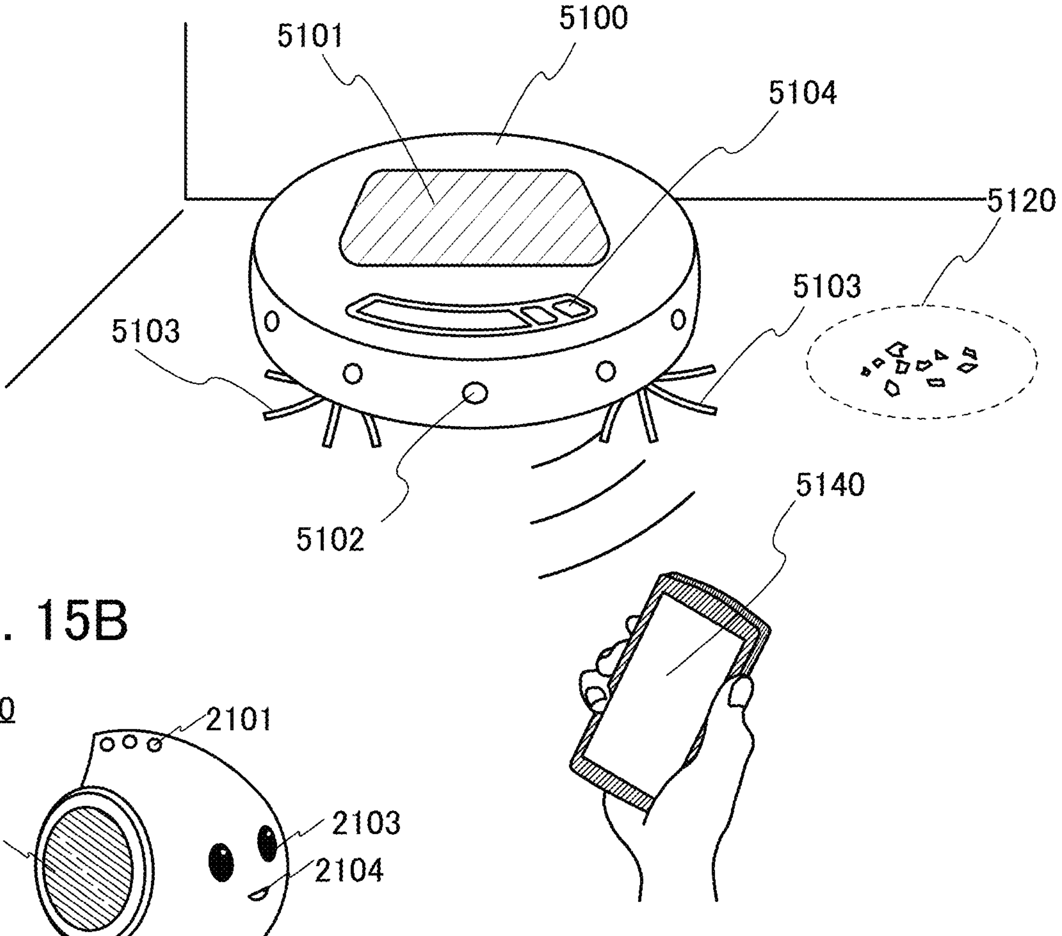
FIGS. 15A to 15C illustrate electronic apparatuses.

FIG. 15A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic apparatus 5140 such as a smartphone. Images taken by the cameras 5102 can be displayed on the portable electronic apparatus 5140. Accordingly, an owner of the cleaning robot 5100 can monitor his/her room even when the owner is not at home. The owner can also check the display on the display 5101 by the portable electronic apparatus 5140 such as a smartphone.

The light-emitting apparatus of one embodiment of the present invention can be used for the display 5101.

Figure 15B:
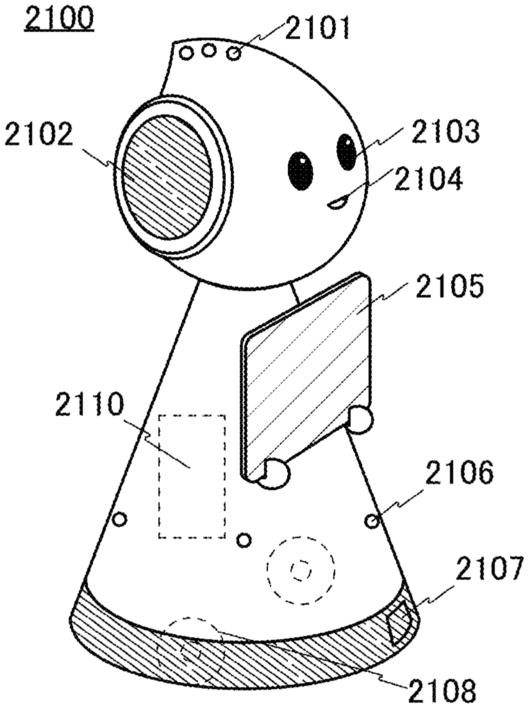

A robot 2100 illustrated in FIG. 15B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 15C:
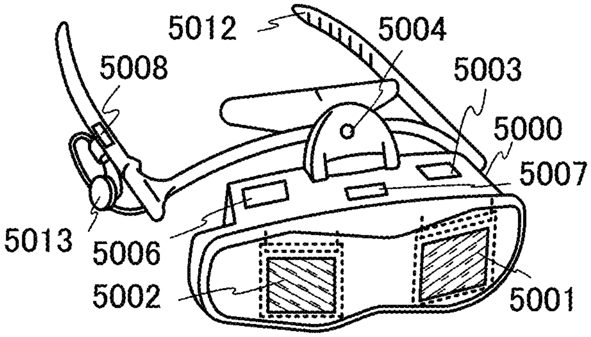

FIG. 15C illustrates an example of a goggles-type display. The goggles-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 16:
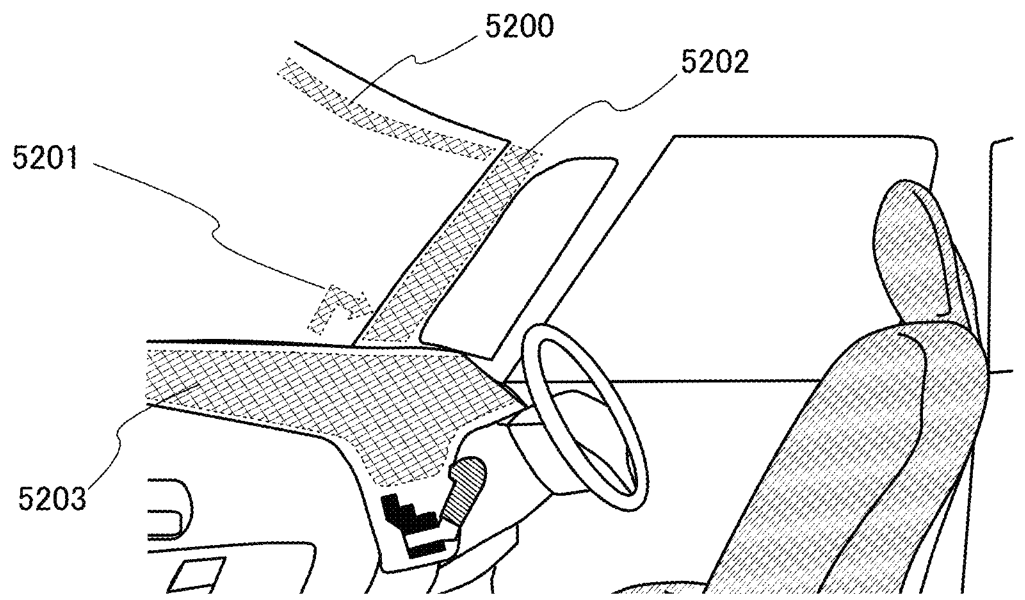
FIG. 16 illustrates in-vehicle display apparatuses and lighting devices.

The organic EL device manufactured by the method for manufacturing the organic EL device described in Embodiments 2 and 3 can also be used for an automobile windshield or an automobile dashboard. FIG. 16 illustrates one mode in which the organic EL devices manufactured by the method for manufacturing the organic EL device described in Embodiments 2 and 3 are used for an automobile windshield and an automobile dashboard. Display regions 5200 to 5203 each include the organic EL device manufactured by the method for manufacturing the organic EL device described in Embodiments 2 and 3.

The display regions 5200 and 5201 are display apparatuses which are provided in the automobile windshield and include the organic EL device manufactured by the method for manufacturing the organic EL device described in Embodiments 2 and 3. The organic EL device manufactured by the method for manufacturing the organic EL device described in Embodiments 2 and 3 can be formed into what is called a see-through display apparatus, through which the opposite side can be seen, by including an anode and a cathode formed of light-transmitting electrodes. Such see-through display apparatuses can be provided even in the automobile windshield without hindering the view. In the case where a driving transistor or the like is provided, a transistor having a light-transmitting property, such as an organic transistor including an organic compound material or a transistor including an oxide semiconductor, is preferably used.

The display region 5202 is a display apparatus which is provided in a pillar portion and includes the organic EL device manufactured by the method for manufacturing the organic EL device described in Embodiments 2 and 3. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can provide a variety of kinds of information such as navigation data, the speed, the number of rotations, air-condition setting, and the like. The content or layout of the display can be changed as appropriate according to the user's preference. Note that such information can also be displayed on the display regions 5200 to 5202. The display regions 5200 to 5203 can also be used as lighting devices.

Figure 17A:
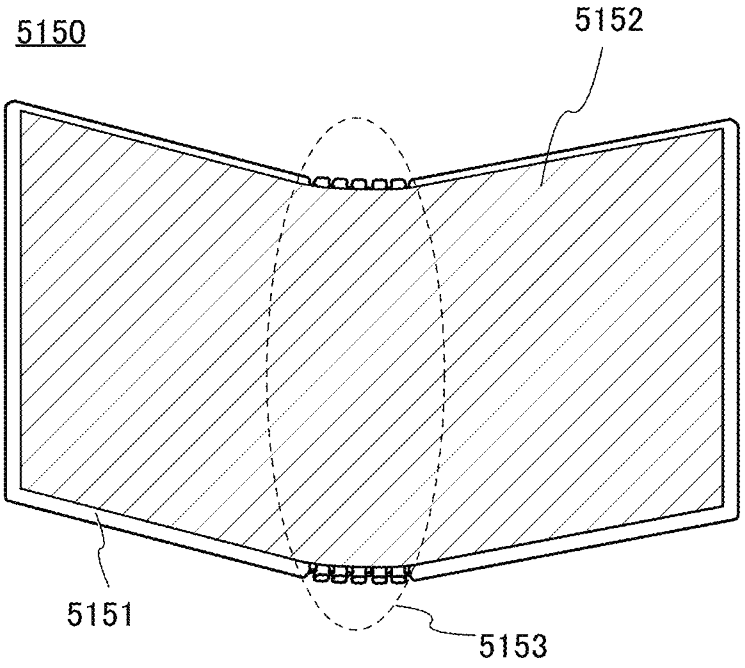
FIGS. 17A and 17B illustrate an electronic apparatus.
Figure 17B:
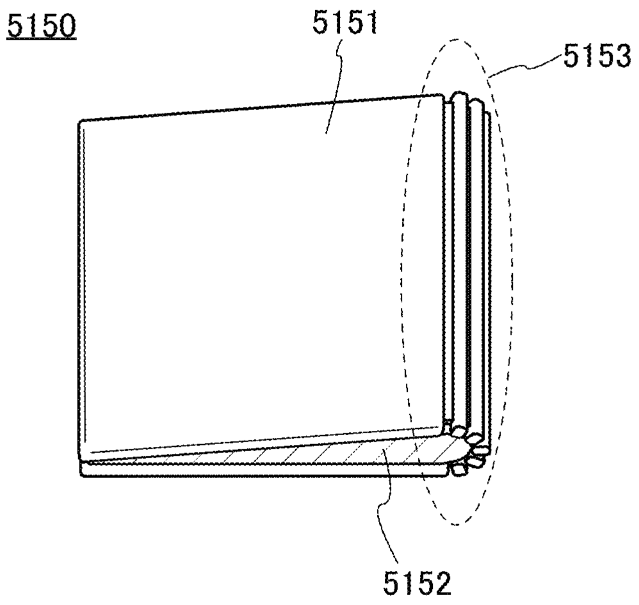

FIGS. 17A and 17B illustrate a foldable portable information terminal 5150. The foldable portable information terminal 5150 includes a housing 5151, a display region 5152, and a bend portion 5153. FIG. 17A illustrates the portable information terminal 5150 that is opened. FIG. 17B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands and the bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 18A:
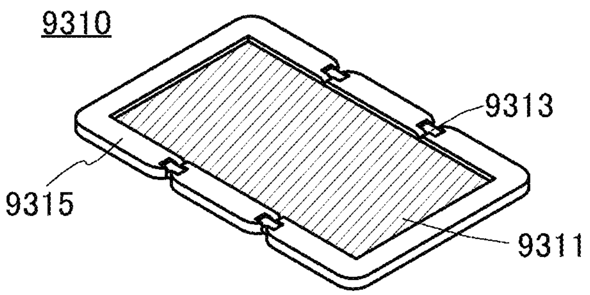
FIGS. 18A to 18C illustrate an electronic apparatus.
Figure 18B:
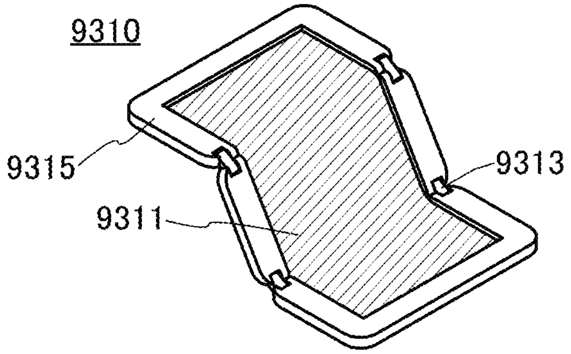
Figure 18C:
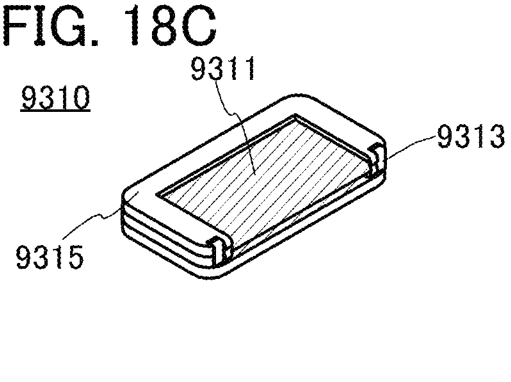

FIGS. 18A to 18C illustrate a foldable portable information terminal 9310. FIG. 18A illustrates the portable information terminal 9310 that is opened. FIG. 18B illustrates the portable information terminal 9310 that is being opened or being folded. FIG. 18C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

At least part of any of the structure examples, the drawings corresponding thereto, and the like described in this embodiment can be implemented in combination with any of the other structure examples, the other drawings corresponding thereto, and the like as appropriate.

At least part of this embodiment can be implemented in combination with any of the other embodiments described in this specification, as appropriate.

Example 1

In this example, a stacked-layer structure including the organic compound that can be used for the light-emitting device of one embodiment of the present invention was formed and observed. As samples of the stacked-layer structure including the organic compound, Samples 1A to 1D were fabricated.

Structure formulae of organic compounds used for Samples 1A to 1D are shown below.

[Chemical Formula 25]

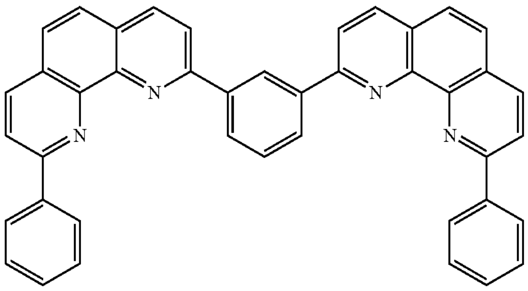

(117)
mPPhen2P

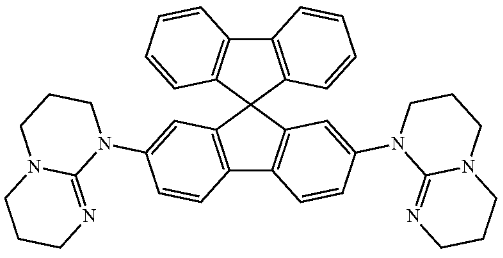

(108)
2,7hpp2SF

-continued

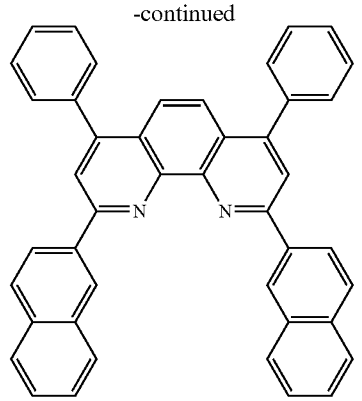

NBPhen

<Method for Fabricating Samples>

Samples 1A and 1C each have a stacked-layer structure with an area of 9 $cm^2$ (3 cm×3 cm) in which, over a silicon substrate, a film of indium tin oxide containing silicon oxide (ITSO) and a first organic compound layer were formed in this order. Samples 1B and 1D each have a stacked-layer structure in which a second organic compound layer was formed over the first organic compound layer of Sample 1A or 1C.

<Sample 1A>

First, over a silicon substrate, indium tin oxide containing silicon oxide (ITSO) was deposited to a thickness of 10 nm by a sputtering method. Then, as the first organic compound layer, 2,9-di(naphthalen-2-yl)-4,7-diphenyl-1,10-phenanthroline (abbreviation: NBPhen) was deposited by evaporation to a thickness of 20 nm, the atmosphere was replaced with a nitrogen atmosphere, and heat treatment was performed at a substrate temperature of 80° C. under vacuum for one hour.

<Sample 1B>

First, over a silicon substrate, indium tin oxide containing silicon oxide (ITSO) was deposited to a thickness of 10 nm by a sputtering method. Then, as the first organic compound layer, 2,9-di(naphthalen-2-yl)-4,7-diphenyl-1,10-phenanthroline (abbreviation: NBPhen) was deposited by evaporation to a thickness of 20 nm.

Then, as the second organic compound layer, 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) was deposited by evaporation to a thickness of 20 nm, the atmosphere was replaced with a nitrogen atmosphere, and heat treatment was performed at a substrate temperature of 80° C. under vacuum for one hour.

<Sample 1C>

First, over a silicon substrate, indium tin oxide containing silicon oxide (ITSO) was deposited to a thickness of 10 nm by a sputtering method. Then, as the first organic compound layer, 2,2'-(1,3-phenylene)bis(9-phenyl-1,10-phenanthroline) (abbreviation: mPPhen2P) was deposited by evaporation to a thickness of 20 nm, and aluminum oxide ($AlO_x$) was deposited to a thickness of 30 nm by an ALD method at a substrate temperature set to 80° C.

<Sample 1D>

First, over a silicon substrate, indium tin oxide containing silicon oxide (ITSO) was deposited to a thickness of 10 nm by a sputtering method. Then, as the first organic compound layer, 2,2'-(1,3-phenylene)bis(9-phenyl-1,10-phenanthroline) (abbreviation: mPPhen2P) was deposited by evaporation to a thickness of 20 nm.

Then, as the second organic compound layer, 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) was deposited by evaporation to a thickness of 20 nm, and aluminum oxide ($AlO_x$) was deposited to a thickness of 30 nm by an ALD method at a substrate temperature set to 80° C.

A table below shows the materials used for the organic compound layers of the stacked-layer structures in Samples.

TABLE 1

| | Film thickness | Sample 1A | Sample 1B | Sample 1C | Sample 1D |
|---|---|---|---|---|---|
| Second organic compound layer | 20 nm | — | 2,7hpp2SF | — | 2,7hpp2SF |
| First organic compound layer | 20 nm | NBPhen | NBPhen | mPPhen2P | mPPhen2P |

Through the above steps, Samples TA to 1D were fabricated.

<Observation of Samples with Optical Microscope>

Samples TA to 1D were observed with an optical microscope. FIG. 19 shows the results.

Figure 19A:
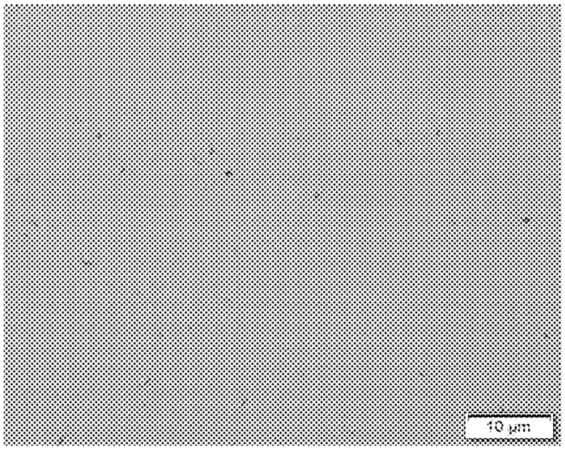
FIGS. 19A to 19D show observation results of samples of Example obtained with an optical microscope.
Figure 19B:
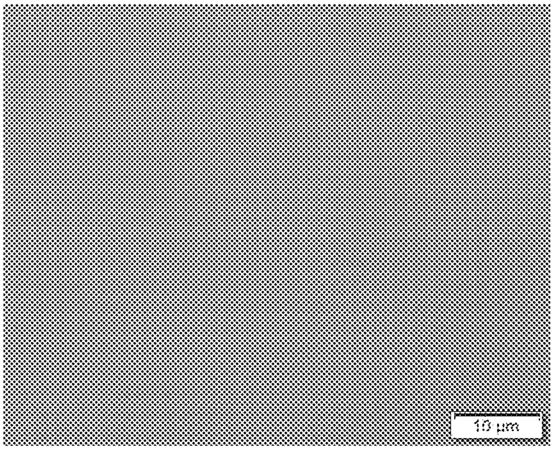

As shown in FIG. 19A, cord-like defects derived from 2,9-di(naphthalen-2-yl)-4,7-diphenyl-1,10-phenanthroline (abbreviation: NBPhen) were caused in Sample TA. In contrast, as shown in FIG. 19B, no defect was seen in Sample 1B.

The defects were caused in Sample 1A by the heat treatment probably because of low heat resistance of NBPhen. In contrast, it is considered that 2,7hpp2SF deposited over NBPhen functioned as a protective film in Sample 1B and thus no defect was caused by the heat treatment.

Figure 19C:
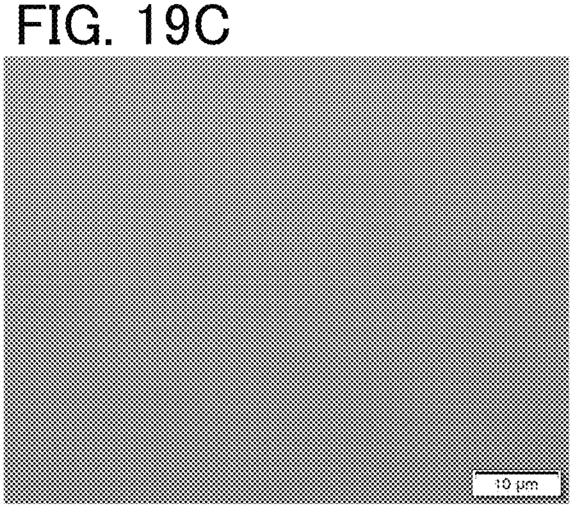
Figure 19D:
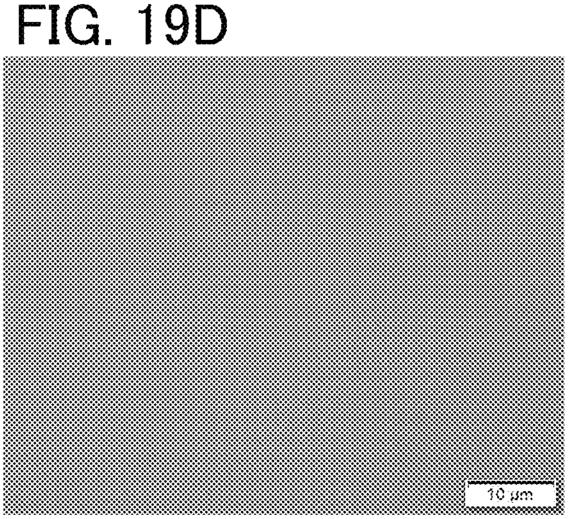
Figure 20A:
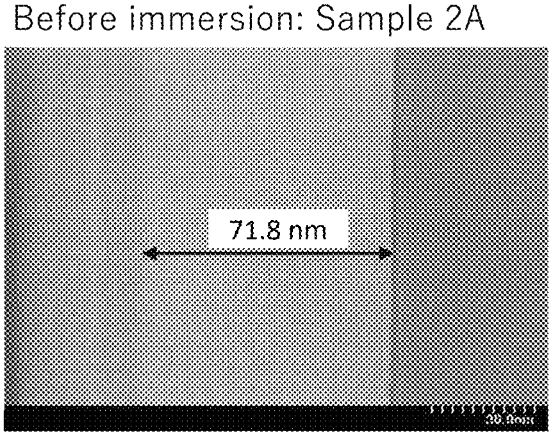
FIGS. 20A to 20D are cross-sectional views of samples of Example.
Figure 20B:
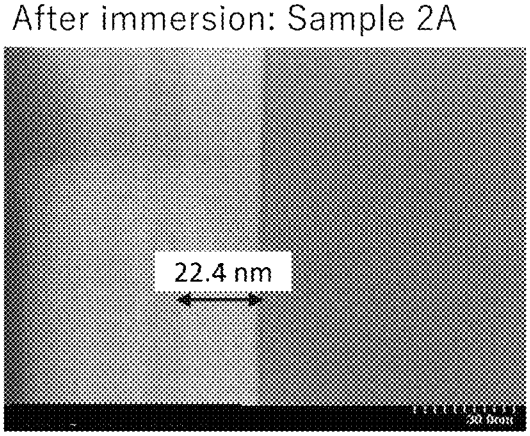
Figure 20C:
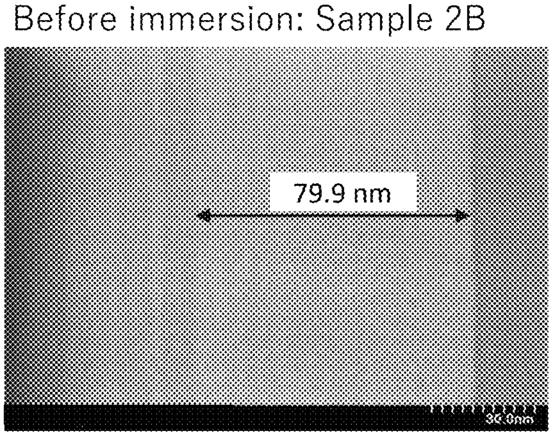
Figure 20D:
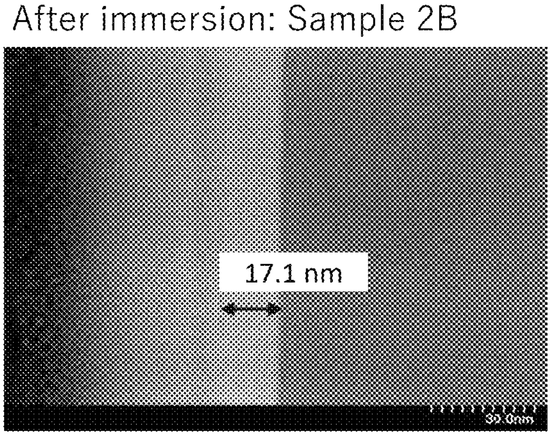

As shown in FIGS. 19C and 19D, no defect was observed in Samples 1C and 1D. No defect was caused by the heat treatment and the deposition of aluminum oxide by an ALD method because of high heat resistance of mPPhen2P. In addition, from the result of Sample 1D, it is found that even when 2,7hpp2SF is deposited in an upper layer, the deposition of aluminum oxide by an ALD method does not adversely affect lower components.

Accordingly, it is found that heat resistance of lower layers can be improved with the use of one embodiment of the present invention. It is also found that the conventional steps can be used.

Example 2

In this example, a stacked-layer structure including the organic compound that can be used for the light-emitting device of one embodiment of the present invention was formed and observed. As samples of the stacked-layer structure including the organic compound, Samples 2A and 2B were fabricated.

Structure formulae of organic compounds used for Samples 2A and 2B are shown below.

[Chemical Formula 26]

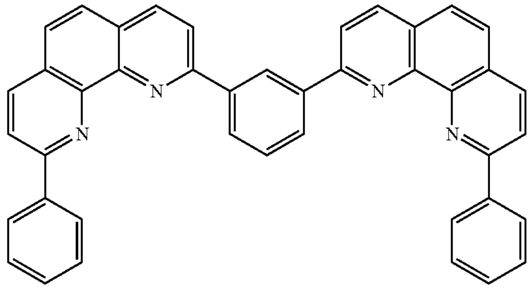

(117)
mPPhen2P

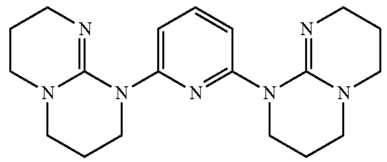

hpp2Py
(100)

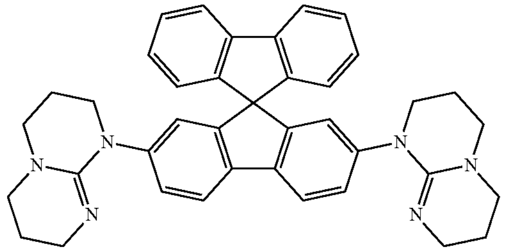

(108)
2,7hpp2SF

<Method for Fabricating Samples>

Samples 2A and 2B were fabricated by film deposition by an evaporation method over a glass substrate. Each sample has a stacked-layer structure in which 2,2'-(1,3-phenylene)bis(9-phenyl-1,10-phenanthroline) (abbreviation: mPPhen2P) and an organic compound layer were deposited in this order. Note that the area of the stacked-layer structure of each sample was 9 $cm^2$ (3 cm×3 cm).

First, in Samples 2A and 2B, mPPhen2P was deposited by evaporation to a thickness of 20 nm over a glass substrate.

<Sample 2A>

In Sample 2A, over mPPhen2P, 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) was deposited by evaporation to a thickness of 50 nm.

<Sample 2B>

In Sample 2B, over mPPhen2P, 1,1'-pyridine-2,6-diyl-bis(1,3,4,6,7,8-hexahydro-2H-pyrimido[1,2-a]pyrimidine) (abbreviation: hpp2Py) was deposited by evaporation to a thickness of 50 nm.

A table below shows the materials used for the organic compound layers in Samples.

TABLE 2

| | Sample 2A | Sample 2B |
|---|---|---|
| Organic compound layer | 2,7hpp2SF | hpp2Py |

Then, fabricated Samples 2A and 2B were immersed in water for five minutes.

Through the above steps, Samples 2A and 2B were fabricated.

<Cross-Sectional Observation of Samples>

Cross sections of Samples 2A and 2B were observed with a scanning transmission electron microscope (STEM) before and after Samples were immersed in water. A STEM HD-2700 manufactured by Hitachi, Ltd. was used and the acceleration voltage was set to 200 kV. The results of Samples are shown in FIGS. 20A to 20D.

As shown in FIGS. 20A to 20D, the organic compound layers over mPPhen2P of both Samples were able to be removed completely by being immersed in water.

Accordingly, it is found that owing to one embodiment of the present invention, the lower layers are not affected.

Thus, the organic compound of the present invention can be removed easily by water or a liquid including water as a solvent. Therefore, with the use of one embodiment of the present invention, damage to a lower layer in a heating step can be inhibited and a layer including the organic compound of the present invention can be removed rapidly after the heating step. Moreover, damage to a lower layer can be reduced in removal. Thus, without a change in a structure of a device to be fabricated, the resistance to heat in the process can be increased; accordingly, it is found that one embodiment of the present invention has a wide application range and is a useful invention.

Example 3

This example describes evaluation results of the characteristics of fabricated light-emitting devices (Devices 3A to 3D) of embodiments of the present invention described in the above embodiments.

Structure formulae of organic compounds used for Devices 3A to 3D are shown below.

[Chemical Formula 27]

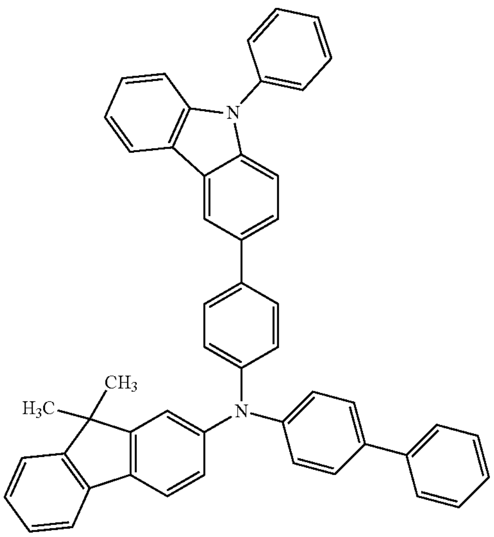

PCBBiF

-continued

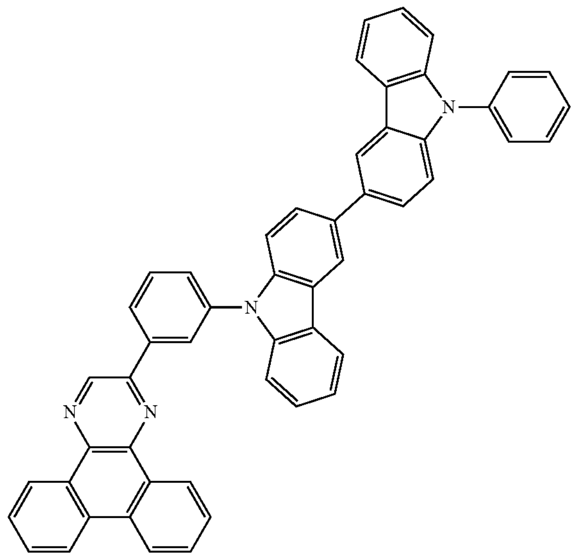

2mPCCzPDBq

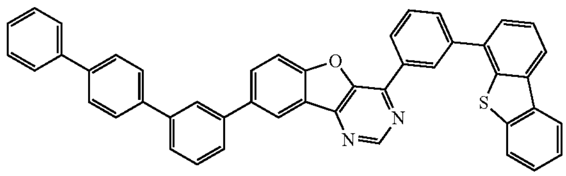

8mpTP-4mDBtPBfpm

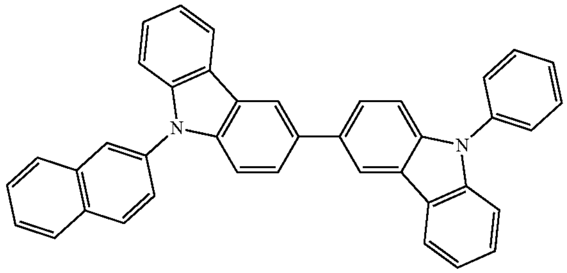

β NCCP

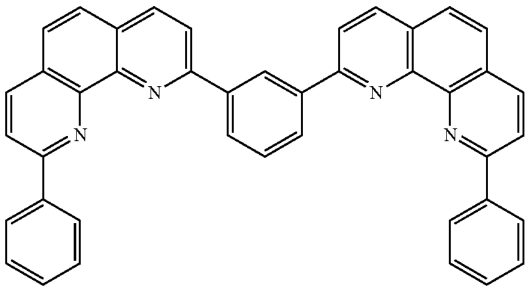

mPPhen2P

-continued

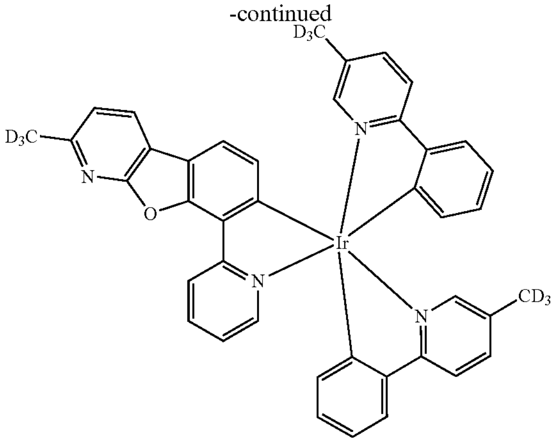

Ir(5mppy-d3)$_2$(mbfpypy-d3)

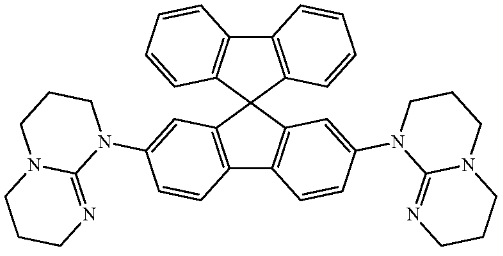

(108)
2,7hpp2SF

Figure 21:
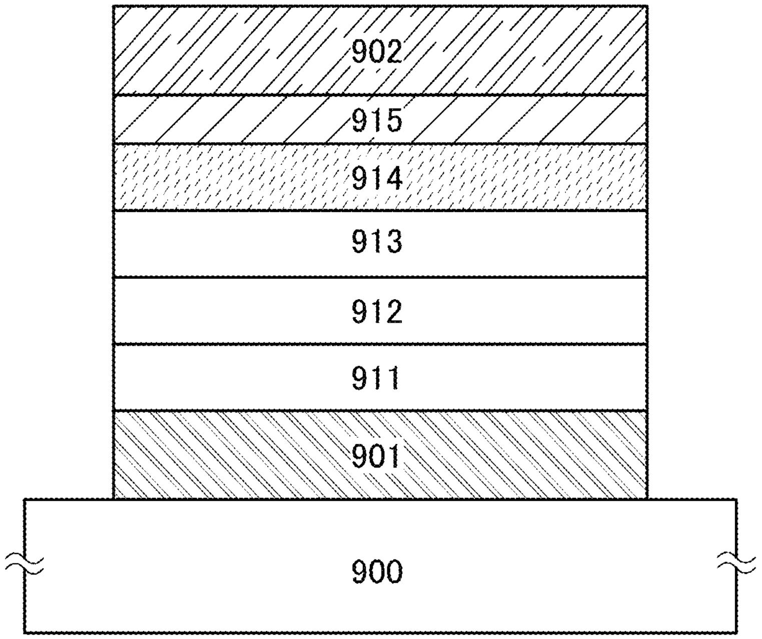
FIG. 21 is a cross-sectional view of a device of Example.

In each Device, as illustrated in FIG. 21, a hole-injection layer 911, a hole-transport layer 912, a light-emitting layer 913, an electron-transport layer 914, and an electron-injection layer 915 are stacked in this order over a first electrode 901 formed over a glass substrate 900, and a second electrode 902 is stacked over the electron-injection layer 915.

<Method for Fabricating Devices 3A to 3D>

First, over the glass substrate 900, titanium (Ti), aluminum (Al), and titanium (Ti) were deposited sequentially in this order by a sputtering method, whereby the first electrode which was a reflective electrode layer was formed. The deposition was performed such that the thickness of titanium was 50 nm, that of aluminum was 70 nm, and that of titanium was 6 nm. After the deposition of titanium, heating was performed at 300° C. for one hour, whereby a layer containing titanium oxide was formed. Then, indium tin oxide containing silicon oxide (ITSO) was deposited to a thickness of 10 nm to form a thickness adjustment layer. Note that the electrode area is 6.42 μm×1.14 μm, and a light-emitting apparatus includes 3840×2880 pixels in a display region of 30.41 mm×22.81 mm, which corresponds to a pixel density of 3207 ppi.

Next, in pretreatment for forming the light-emitting device over the substrate, a surface of the substrate was washed with water and baking was performed at 200° C. for one hour. Then, the substrate was transferred into a vacuum evaporation apparatus where the pressure was reduced to approximately $10^{-4}$ Pa, and vacuum baking was performed at 180° C. for 60 minutes in a heating chamber of the vacuum evaporation apparatus. After that, natural cooling was performed to 30° C. or lower.

Then, the substrate provided with the first electrode 901 was fixed to a substrate holder provided in the vacuum evaporation apparatus such that the surface on which the first electrode 901 was formed faced downward. On the first electrode 901, N-(biphenyl-4-yl)-N-[4-(9-phenyl-9H-carbazol-3-yl)phenyl]-9,9-dimethyl-9H-fluoren-2-amine (abbreviation: PCBBiF) and a fluorine-containing electron acceptor material with a molecular weight of 672 (OCHD-003) were deposited by co-evaporation using a resistance-heating method to a thickness of 10 nm such that the weight ratio of PCBBiF to OCHD-003 was 1:0.03, whereby the hole-injection layer 911 was formed.

Next, PCBBiF was deposited by evaporation to a thickness of 10 nm on the hole-injection layer 911, whereby the hole-transport layer 912 was formed.

Next, on the hole-transport layer 912, 8-(1,1':4',1"-terphenyl-3-yl)-4-[3-(dibenzothiophen-4-yl)phenyl]-[1]benzofuro[3,2-d]pyrimidine (abbreviation: 8mpTP-4*m*DBtPBfpm), 9-(2-naphthyl)-9'-phenyl-9H,9'H-3,3'-bicarbazole (abbreviation: PNCCP), and [2-d3-methyl-8-(2-pyridinyl-JN)benzofuro[2,3-b]pyridine-κC]bis[2-(5-d3-methyl-2-pyridinyl-1N$^2$)phenyl-κC]iridium(III) (abbreviation: Ir(5mppy-d3)$_2$(mbfpypy-d3)) were deposited by co-evaporation using a resistance-heating method to a thickness of 40 nm such that the weight ratio of 8mpTP-4mDBtPBfpm to βNCCP and Ir(5mppy-d3)$_2$(mbfpypy-d3) was 0.5:0.5:0.1, whereby the light-emitting layer 913 was formed.

After that, on the light-emitting layer 913, 2-{3-[3-(N-phenyl-9H-carbazol-3-yl)-9H-carbazol-9-yl]phenyl} dibenzo[f,h]quinoxaline (abbreviation: 2mPCCzPDBq) was deposited by evaporation to a thickness of 10 nm, and then 2,2'-(1,3-phenylene)bis(9-phenyl-1,10-phenanthroline) (abbreviation: mPPhen2P) was deposited by evaporation, whereby the electron-transport layer 914 was formed.

Next, in Devices 3A to 3C, an organic mask layer formed of an organic compound was formed on the electron-transport layer 914. As the organic mask layer, 1,1'-(9,9'-spirobi[9H-fluorene]-2,7-diyl)bis(1,3,4,6,7,8-hexahydro-2H-pyrimido[1,2-a]pyrimidine) (abbreviation: 2,7hpp2SF) was deposited by evaporation. The thickness of the organic mask layer in Device 3A was 10 nm, that in Device 3B was 20 nm, and that in Device 3C was 50 nm. Device 3D was not provided with the organic mask layer.

Then, Devices 3A to 3D were taken out to be exposed to the atmosphere containing oxygen. After that, in Devices 3A to 3C, an aluminum oxide ($AlO_x$) film was deposited to a thickness of 30 nm by an ALD method as an inorganic mask layer over the organic mask layer.

In contrast, in Device 3D, an aluminum oxide ($AlO_x$) film was deposited to a thickness of 30 nm by an ALD method as an inorganic layer over the electron-transport layer 914.

Next, the aluminum oxide film was removed. The aluminum oxide film was removed by wet etching using an acidic chemical solution. Part or the whole of the organic mask layer was removed in this removal step.

Next, Devices 3A to 3D were taken out to be exposed to the atmosphere containing oxygen. Then, vacuum baking at 70° C. for 90 minutes was performed under a reduced pressure of approximately 10-4 Pa.

Next, lithium fluoride (LiF) was deposited by evaporation to a thickness of 1 nm over the electron-transport layer 914, whereby the electron-injection layer 915 was formed.

Subsequently, over the electron-injection layer 915, Ag and Mg were deposited by co-evaporation to a thickness of 25 nm in a volume ratio of Ag:Mg=1:0.1, whereby the second electrode 902 was formed. Note that the second electrode 902 is a transflective electrode having functions of transmitting light and reflecting light.

In the above manner, Devices 3A to 3D were fabricated. The structures of Devices 3A to 3D are listed in the following table.

TABLE 3

| | Film thickness [nm] | Device 3A | Device 3B | Device 3C | Device 3D |
|---|---|---|---|---|---|
| Cap layer | 80 | DBT3P-II | | | |
| Second electrode | 25 | Ag:Mg (1:0.1) | | | |
| Electron-injection layer | 1 | LiF | | | |
| Organic mask layer | — | 2,7hpp2SF | | | |
| | | 10 nm | 20 nm | 50 nm | 0 nm |
| Electron-transport layer | 15 | mPPhen2P | | | |
| | 10 | 2mPCCzPDBq | | | |
| Light-emitting layer | 40 | 8mpTP-4mDBtPBfpm:βNCCP: Ir(5mppy-d3)$_2$(mbfpypy-d3) (0.5:0.5:0.1) | | | |
| Hole-transport layer | 10 | PCBBiF | | | |
| Hole-injection layer | 10 | PCBBiF:OCHD-003 (1:0.03) | | | |
| First electrode | 10 | ITSO | | | |
| | 50\70\6 | Ti\Al\Ti | | | |

<Method for Fabricating Comparative Device 3>

For reference, Comparative device 3 was fabricated in a continuous vacuum process. Note that Comparative device 3 was fabricated using the same materials as Devices 3A to 3D, and was provided with neither the organic mask layer nor the inorganic mask layer. Accordingly, Comparative device 3 did not go through the exposure to the air, and the steps of depositing, etching, and removing the mask layers.

Specifically, Comparative device 3 was fabricated in a manner similar to that of Devices 3A to 3D up to the step of forming the electron-transport layer 914.

Here, without breaking the vacuum, lithium fluoride (LiF) was deposited by evaporation to a thickness of 1 nm over the electron-transport layer 914, whereby the electron-injection layer 915 was formed.

Next, without breaking the vacuum, over the electron-injection layer 915, Ag and Mg were deposited by co-evaporation to a thickness of 25 nm in a volume ratio of Ag:Mg=1:0.1, whereby the second electrode 902 was formed. Note that the second electrode 902 is a transflective electrode having functions of transmitting light and reflecting light.

Then, as a cap layer, 4,4',4''-(benzene-1,3,5-triyl)tri(dibenzothiophene) (abbreviation: DBT3P-II) was formed by evaporation to a thickness of 80 nm.

Comparative device 3 was fabricated through the above steps.

<Device Characteristics>

Devices 3A to 3D and Comparative device 3 were sealed using a glass substrate in a glove box containing a nitrogen atmosphere so as not to be exposed to the air (a sealing material was applied to surround Device and UV treatment and heat treatment at 80° C. for one hour were performed at the time of sealing). Then, the initial characteristics of the light-emitting devices were measured.

Figure 22:
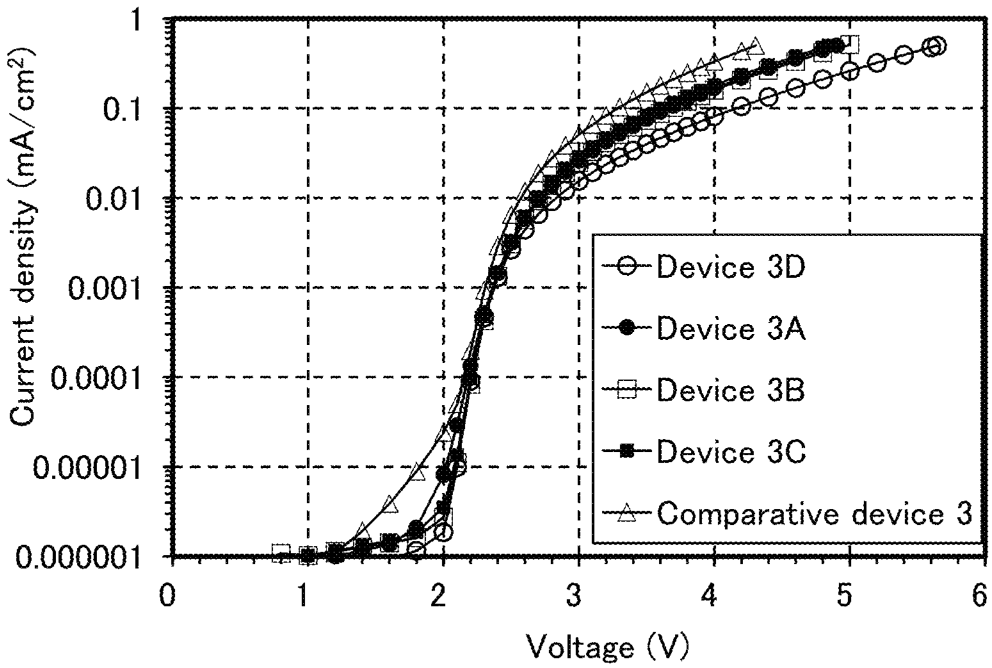
FIG. 22 shows current density-voltage characteristics of devices of Example.
Figure 23:
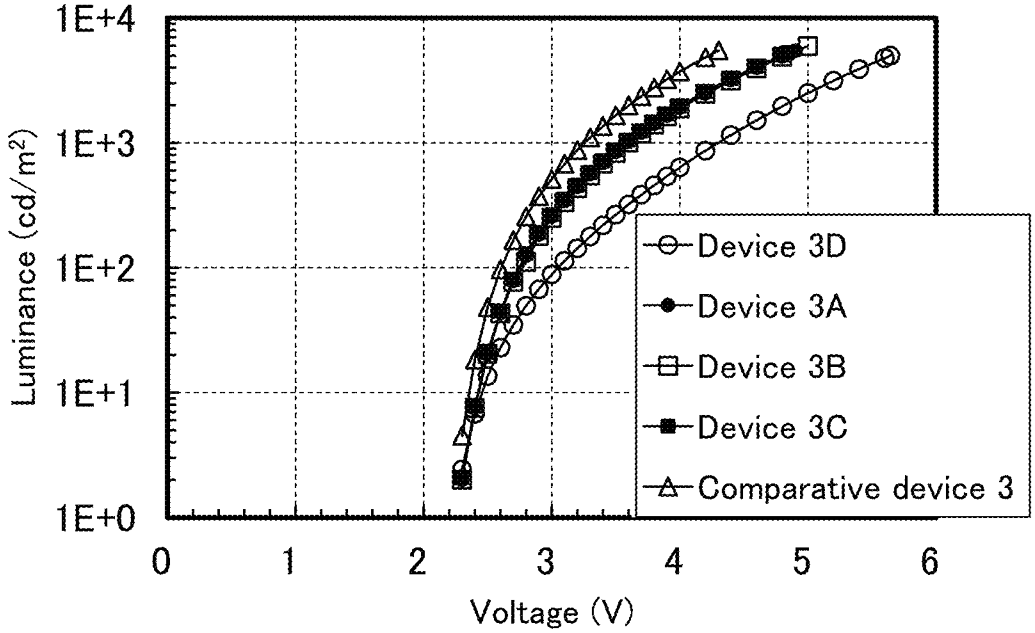
FIG. 23 shows luminance-voltage characteristics of the devices of Example.
Figure 24:
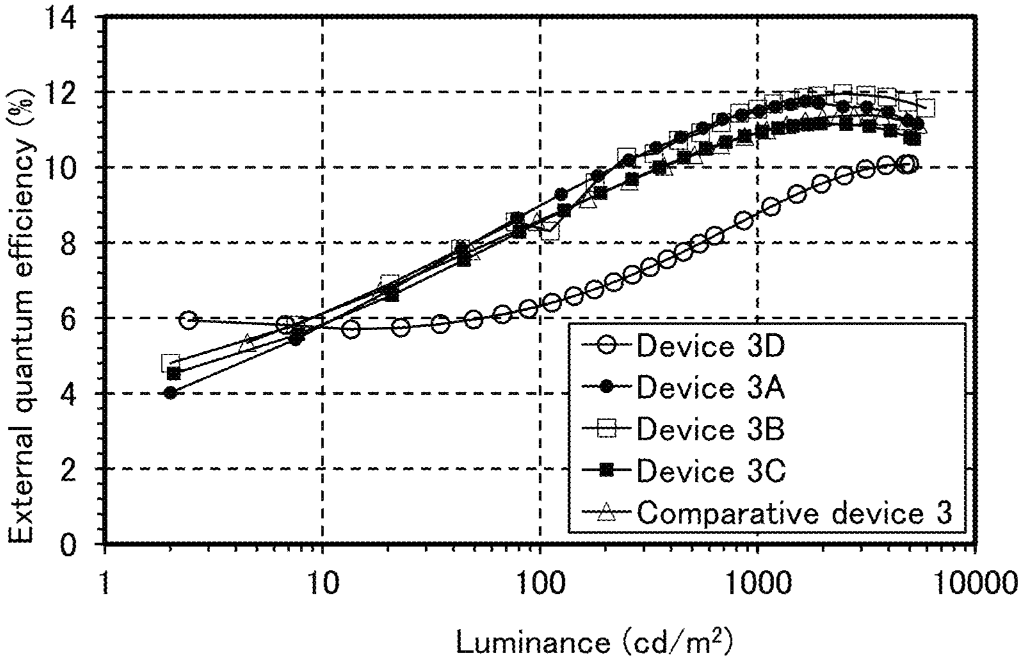
FIG. 24 shows external quantum efficiency-luminance characteristics of the devices of Example.
Figure 25:
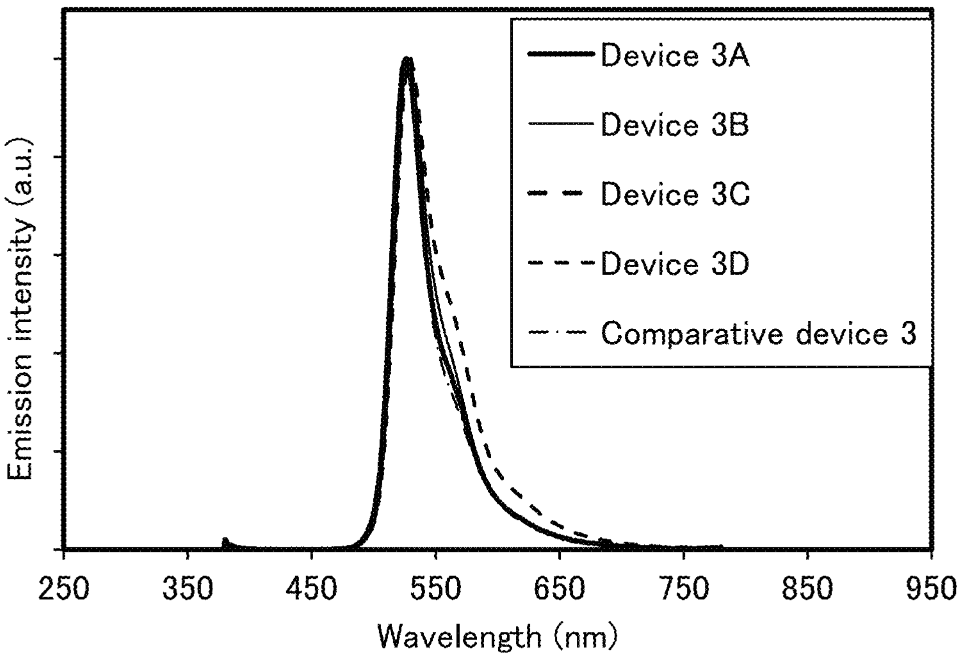
FIG. 25 shows emission spectra of the devices of Example.
Figure 26A:
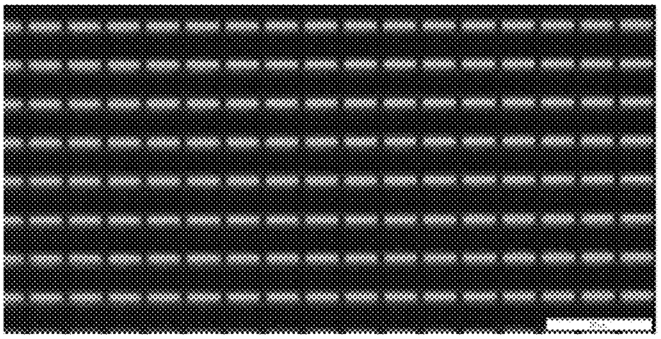
FIGS. 26A to 26D show observation results of samples of Example obtained with an optical microscope.
Figure 26B:
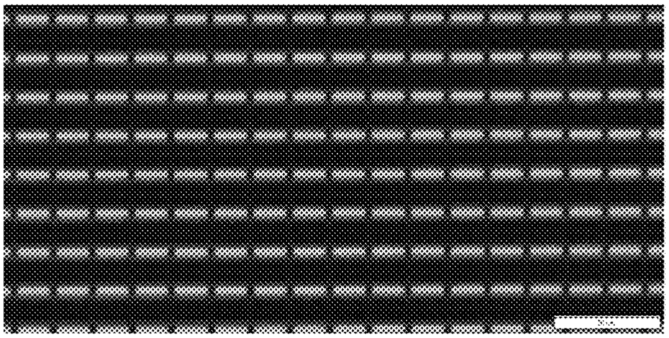
Figure 26C:
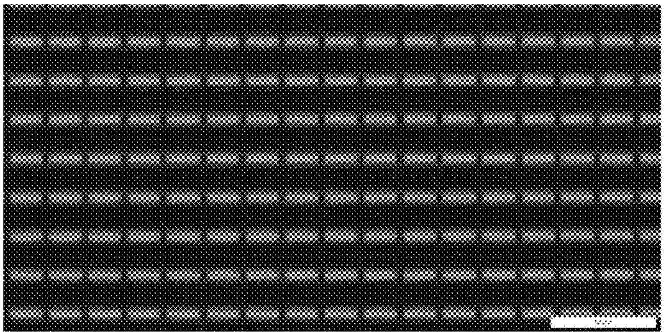
Figure 26D:
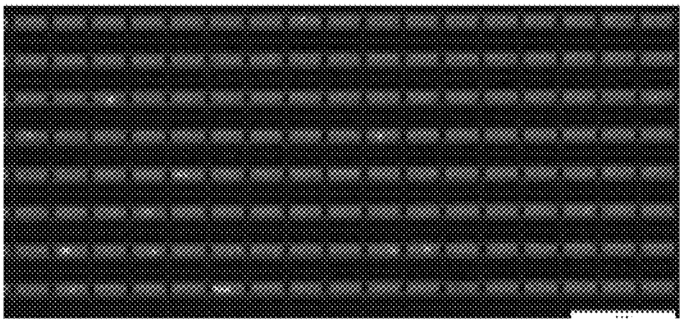

FIG. 22 shows current density-voltage characteristics of Devices 3A to 3D and Comparative device 3, FIG. 23 shows luminance-voltage characteristics thereof, FIG. 24 shows external quantum efficiency-luminance characteristics thereof, and FIG. 25 shows emission spectra thereof. The following table shows the main characteristics of the light-emitting devices at a luminance of approximately 1000 cd/m$^2$. Note that luminance, CIE chromaticity, and emission spectra were measured with a spectroradiometer (SR-UL1R manufactured by TOPCON TECHNOHOUSE CORPORATION). The external quantum efficiency was calculated from the luminance and the emission spectra measured with the spectroradiometer, on the assumption that the light-emitting devices had Lambertian light-distribution characteristics.

TABLE 4

| | Voltage (V) | Current (mA) | Current density (mA/cm$^2$) | Luminance (cd/m$^2$) | Chromaticity x | Chromaticity y | Current efficiency (cd/A) |
|---|---|---|---|---|---|---|---|
| Device 3A | 3.60 | 0.09874 | 2.4684 | 1016.0 | 0.295 | 0.667 | 44.598 |
| Device 3B | 3.60 | 0.09113 | 2.2781 | 1000.0 | 0.301 | 0.666 | 45.725 |
| Device 3C | 3.60 | 0.08748 | 2.1870 | 1048.0 | 0.294 | 0.668 | 42.456 |
| Device 3D | 4.20 | 0.10494 | 2.6234 | 864.3 | 0.332 | 0.640 | 32.946 |
| Comparative device 3 | 3.30 | 0.10279 | 2.5697 | 1101.0 | 0.295 | 0.669 | 42.845 |

It is found from FIG. 22, FIG. 23, and FIG. 24 that Devices 3A to 3C have the luminance efficiency characteristics equivalent to those of Comparative device 3 fabricated in a continuous vacuum process. In contrast, it is confirmed that Device 3D without the organic mask layer has the characteristics deterioration. In addition, as shown in FIG. 25, Devices 3A to 3D have emission spectra equivalent to that of Comparative device 3 fabricated in a continuous vacuum process.

It is found from the above that with the organic mask layer, effects of contamination due to the exposure to the air and processing with an etching solution or the like can be reduced in the MML process and a device can have characteristics equivalent to those of a device fabricated in a continuous vacuum process.

<Observation of Devices with Optical Microscope>

Devices 3A to 3D were observed with an optical microscope. FIGS. 26A, 26B, 26C, and 26D show results of Device 3A, Device 3B, Device 3C, and Device 3D, respectively.

As shown in FIGS. 26A to 26D, no defect was observed in Devices 3A to 3C, while defective light emission occurred in a test piece of Device 3D with no organic mask layer.

<Result of Reliability Test>

Figure 27:
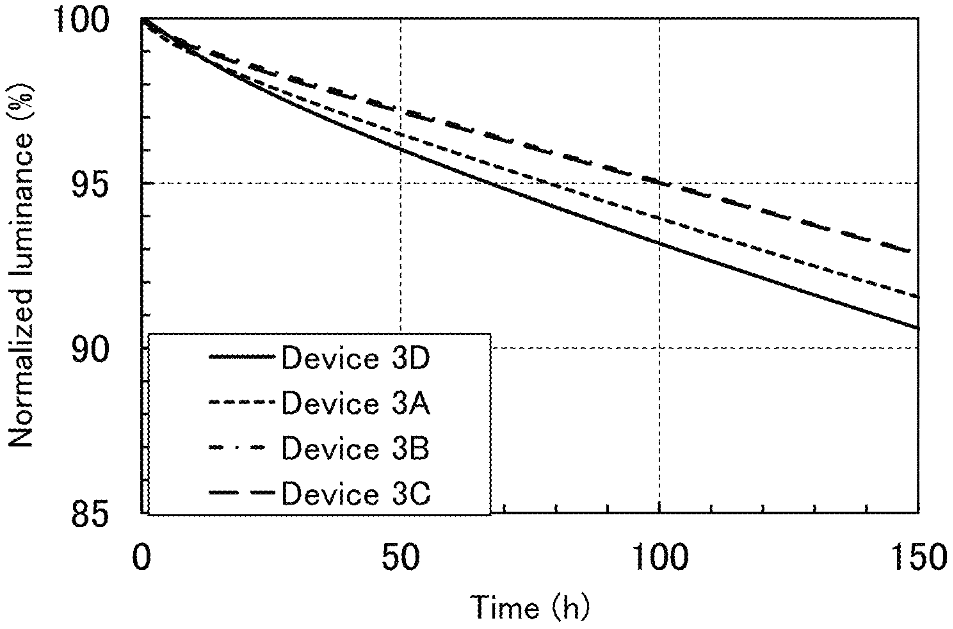
FIG. 27 shows changes in luminance of the devices of Example over time.

Furthermore, a reliability test was conducted using reliability test samples (with an electrode area of 4 mm$^2$ (2 mm×2 mm)) of Devices 3A to 3D fabricated through the above process. FIG. 27 shows a time-dependent change in normalized luminance at the time of constant current density driving (50 [mA/cm$^2$]). In FIG. 27, the vertical axis represents normalized luminance (%), and the horizontal axis represents time (h). The values of LT95(h), which is a time taken until the measurement luminance reduces to 95% of the initial luminance, of Device 3A, Device 3B, Device 3C, and Device 3D were 78 hours, 101 hours, 100 hours, and 67 hours, respectively.

Accordingly, it is found that Devices 3A to 3C each with the organic mask layer have higher reliability than Device 3D without the organic mask layer. It is also found that the organic mask layer used in this example is effective regardless of its thickness. That is, an organic mask layer even with a large thickness is found to be able to be removed easily. In addition, an organic mask layer even with a small thickness is found to have a sufficient effect of inhibiting deterioration.

Reference Synthesis Example

Methods for synthesizing the organic compounds used in embodiments and examples of this specification are described below.

Reference synthesis example 1

In this reference synthesis example, a specific method for synthesizing 2,9-bis(1,3,4,6,7,8-hexahydro-2H-pyrimido[1,2-a]pyrimidin-1-yl)-1,10-phenanthroline (abbreviation: 2,9hpp2Phen) represented by Structure Formula (114) below is described. The structure of 2,9hpp2Phen is shown below.

[Chemical Formula 28]

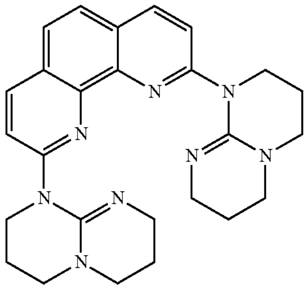

(114)
2,9hpp2Phen

<Synthesis of 2,9hpp2Phen>

Into a 200 mL three-neck flask, 6.3 g (19 mmol) of 2,9-dibromo-1,10-phenanthroline, 5.7 g (41 mmol) of 1,3,4,6,7,8-hexahydro-2H-pyrimido[1,2-a]pyrimidine, 12.6 g (112 mmol) of potassium tert-butoxide, and 93 mL of toluene were put, and the mixture in the flask was degassed by being stirred under reduced pressure. After the mixture was stirred at 60° C., 0.43 g (1.9 mmol) of palladium(II) acetate (abbreviation: $Pd(OAc)_2$) and 2.3 g (3.7 mmol) of (±)-2,2'-bis(diphenylphosphino)-1,1'-binaphthyl (abbreviation: rac-BINAP) were added and stirring was performed at 90° C. for four hours.

After a predetermined time, 50 mL of tetrahydrofuran was added to the obtained mixture and suction filtration was performed. The obtained filtrate was concentrated to give a brown oily substance. Methanol was added to the obtained oily substance, and an insoluble matter was removed by suction filtration. After the obtained filtrate was concentrated, ethyl acetate was added and suction filtration was performed, whereby 3.8 g of a brown sold was obtained. Then, 400 mL of toluene was added to 2.1 g of the obtained solid and the mixture was heated. The heated solution was subjected to hot filtration, whereby an insoluble matter was removed. The obtained filtrate was concentrated to give a solid. Ethyl acetate was added to the obtained solid, and suction filtration was carried out, whereby 0.75 g of a yellow solid was obtained in a yield of 9%.

By a train sublimation method, 0.73 g of the obtained solid was purified. The purification by sublimation was conducted by heating at 235° C. under a pressure of 4.6 Pa with an argon flow rate of 10 mL/min for 15.5 hours. After the purification by sublimation, 0.16 g of a yellow solid was obtained at a collection rate of 27%. Synthesis scheme (s1-1) is shown below.

[Chemical Formula 29]

(s1-1)

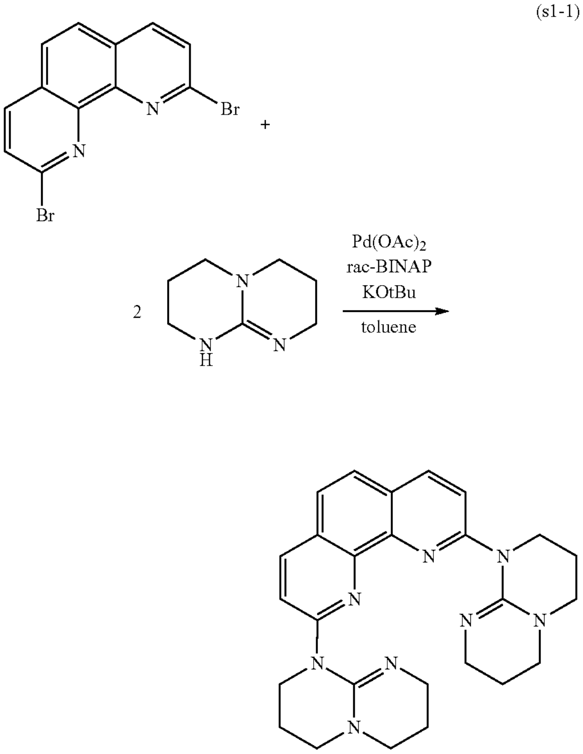

2, 9hpp2Phen
(114)

The protons ($^1H$) of the yellow solid of 2,9hpp2Phen obtained by Synthesis scheme (s1-1) above were measured by nuclear magnetic resonance (NMR) spectroscopy. The obtained values are shown below.

$^1H$ NMR. $\delta(CDCl_3$, 500 MHz): 1.90-1.95 (m, 4H), 2.10-2.15 (m, 4H), 3.24-3.30 (m, 8H), 3.46 (t, J=5.73 Hz, 4H), 4.34 (t, J=5.73 Hz, 4H), 7.49 (s, 2H), 7.91 (d, J=9.16 Hz, 2H), 8.02 (d, J=8.59 Hz, 2H).

Reference synthesis example 2

In this reference synthesis example, a specific method for synthesizing 4,7-bis(1,3,4,6,7,8-hexahydro-2H-pyrimido[1,2-a]pyrimidin-1-yl)-1,10-phenanthroline (abbreviation: 4,7hpp2Phen) represented by Structure Formula (115) below is described. The structure of 4,7hpp2Phen is shown below.

[Chemical Formula 30]

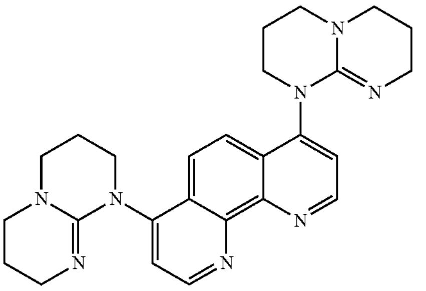

(115)
4,7hpp2Phen

<Synthesis of 4,7hpp2Phen>

Into a 200 mL three-neck flask, 5.5 g (16 mmol) of 4,7-dibromo-1,10-phenanthroline, 5.0 g (36 mmol) of 1,3,4,6,7,8-hexahydro-2H-pyrimido[1,2-a]pyrimidine, 11 g (98 mmol) of potassium tert-butoxide, and 81 mL of toluene were put, and the mixture in the flask was degassed by being stirred under reduced pressure. After the mixture was stirred at 60° C., 0.37 g (1.7 mmol) of palladium(II) acetate (abbreviation: $Pd(OAc)_2$) and 2.0 g (3.2 mmol) of (±)-2,2'-bis(diphenylphosphino)-1,1'-binaphthyl (abbreviation: rac-BINAP) were added and stirring was performed at 90° C. for five hours.

After a predetermined time, 50 mL of tetrahydrofuran was added to the obtained mixture and suction filtration was performed. The obtained filtrate was concentrated to give a brown oily substance. Ethyl acetate was added to the obtained oily substance and suction filtration was performed, whereby a solid was obtained. Methanol was added to the solid, and an insoluble matter was removed by suction filtration. After the obtained filtrate was concentrated, ethyl acetate was added and suction filtration was performed, whereby a brown sold was obtained. Then, 600 mL of toluene was added to 1.5 g of the obtained solid and the mixture was heated. The heated solution was subjected to hot filtration, whereby an insoluble matter was removed. The obtained filtrate was concentrated to give a solid. Ethyl acetate was added to the obtained solid, and suction filtration was carried out, whereby 0.92 g of a yellow solid was obtained in a yield of 12%.

By a train sublimation method, 0.88 g of the obtained solid was purified. In the purification by sublimation, the yellow solid was heated at 260° C. under a pressure of $1.9\times10^{-3}$ Pa for 23 hours. After the purification by sublimation, 39 mg of a yellow solid was obtained at a collection rate of 5%. Synthesis scheme (s2-1) is shown below.

[Chemical Formula 31]

(s2-1)

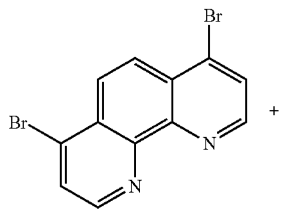

-continued

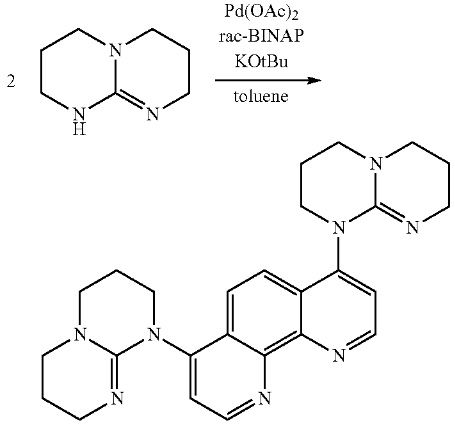

4, 7hpp2Phen
(115)

The protons ($^1H$) of the yellow solid of 4,7hpp2Phen obtained by Synthesis scheme (s2-1) above were measured by nuclear magnetic resonance (NMR) spectroscopy. The obtained values are shown below.

$^1H$ NMR. δ($CDCl_3$, 500 MHz): 1.86-1.91 (m, 4H), 2.21 (s, 4H), 3.21 (t, J=5.73 Hz, 4H), 3.28 (t, J=5.73 Hz, 4H), 3.36 (t, J=6.30 Hz, 4H), 3.66 (s, 4H), 7.37 (d, J=5.15 Hz, 2H), 7.81 (s, 2H), 9.06 (d, J=5.15, 2H).

Reference Synthesis Example 3

In this reference synthesis example, a specific method for synthesizing 2-(1,3,4,6,7,8-hexahydro-2H-pyrimido[1,2-a]pyrimidin-1-yl)-9-phenyl-1,10-phenanthroline (abbreviation: 9Ph-2hppPhen) represented by Structure Formula (116) below is described. The structure of 9Ph-2hppPhen is shown below.

[Chemical Formula 32]

(116)

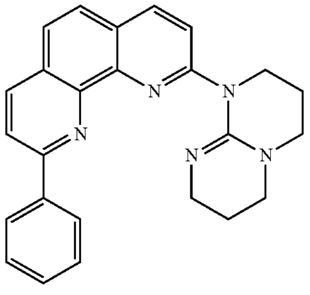

9Ph-2hppPhen

<Synthesis of 9Ph-2hppPhen>

Into a 200 mL three-neck flask, 6.1 g (21 mmol) of 2-chloro-9-phenyl-1,10-phenanthroline, 6.7 g (48 mmol) of 1,3,4,6,7,8-hexahydro-2H-pyrimido[1,2-a]pyrimidine, and 100 mL of toluene were put, and stirring was performed at 100° C. for 11 hours under a nitrogen atmosphere. After a predetermined time, the reaction solution was concentrated, methanol was added to the solid, and an insoluble matter was removed by suction filtration. After the obtained filtrate was concentrated, toluene was added and heating was performed. The heated solution was subjected to hot filtration, whereby an insoluble matter was removed. The obtained filtrate was concentrated to give a solid. Ethyl acetate was added to the obtained solid, and suction filtration was carried out, whereby 5.3 g of a yellowish white solid was obtained in a yield of 64%. By a train sublimation method, 5.0 g of the obtained solid was purified. The purification by sublimation was performed by heating at 220° C. under a pressure of 3.0 Pa with an argon flow rate of 12 mL/min for 18 hours. After the purification by sublimation, 2.54 g of a yellowish white solid was obtained at a collection rate of 51%. Synthesis scheme (s3-1) is shown below.

[Chemical Formula 33]

(s3-1)

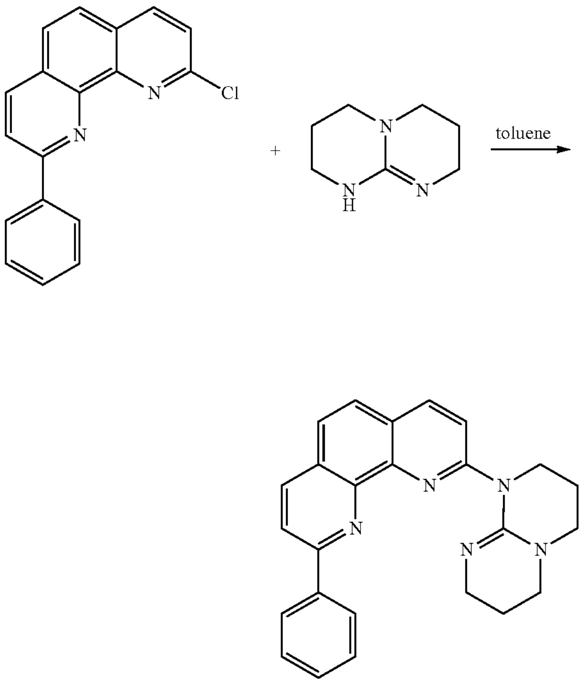

(116)
9Ph-2hppPhen

The protons (H) of the yellowish white solid of 9Ph-2hppPhen obtained by Synthesis scheme (s3-1) above were measured by nuclear magnetic resonance (NMR) spectroscopy. The obtained values are shown below.

$^1$H NMR. δ($CDCl_3$, 500 MHz): 1.92-1.96 (m, 2H), 2.16-2.21 (m, 2H), 3.28-3.32 (m, 4H), 3.49 (t, J=5.73 Hz, 2H), 4.34 (t, J=5.73 Hz, 2H), 7.46 (t, J=7.45 Hz, 1H), 7.55 (d, J=7.45 Hz, 2H), 7.61 (d, J=8.59 Hz, 1H), 7.68 (d, J=8.59 Hz, 1H), 7.97 (d, J=9.16 Hz, 1H), 8.06 (d, J=8.02 Hz, 1H), 8.17 (d, J=9.16 Hz, 1H), 8.25 (d, J=8.02 Hz, 1H), 8.39 (d, J=6.87 Hz, 2H).

Reference Synthesis Example 4

In this reference synthesis example, a method for synthesizing 8,8'-pyridin-2,6-diyl-bis(5,6,7,8-tetrahydroimidazo[1,2-a]pyrimidine) (abbreviation: 2,6tip2Py) represented by Structure Formula (112) below is described. The structure of 2,6tip2Py is shown below.

[Chemical Formula 34]

(112)

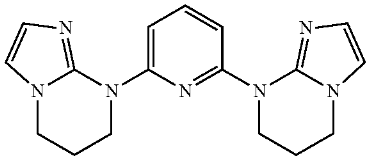

2,6tip2Py

<Synthesis of 2,6tip2Py>

To 1.3 g (5.5 mmol) of 2,6-dibromopyridine, 1.7 g (16 mmol) of potassium tert-butoxide (abbreviation: KOtBu), 0.21 g (0.33 mmol) of (±)-2,2'-bis(diphenylphosphino)-1,1'-binaphthyl (abbreviation: rac-BINAP), and 50 mg (0.22 mol) of palladium(II) acetate (abbreviation: $Pd(OAc)_2$) in a 200 mL three-neck flask, 1.5 g (12 mmol) of 5,6,7,8-tetrahydroimidazo[1,2-a]pyrimidine was added, and the air in the flask was replaced with nitrogen. To this mixture, 19 mL of dehydrated toluene was added, the mixture in the flask was degassed under reduced pressure, and then the air in the flask was replaced with nitrogen. This mixture was stirred for eight hours while heated at 90° C., and then cooled down to room temperature. After the reaction, this reaction mixture was subjected to suction filtration to give a residue. Ethyl acetate was added to the obtained solid, and heating at 70° C. and stirring were performed for two hours. Then, an insoluble matter was removed by suction filtration, and the filtrate was concentrated under reduced pressure. The obtained solid was recrystallized from a mixed solvent of ethyl acetate and hexane to give a gray solid (1.1 g, in a yield of 64%). Synthesis scheme (s4-1) of 2,6tip2Py is shown below.

[Chemical Formula 35]

(s4-1)

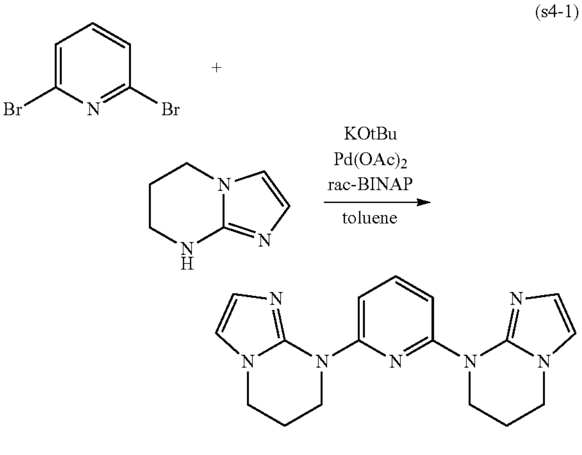

2, 6tip2Py
(112)

By a train sublimation method, 1.1 g of the obtained gray solid was purified by heating at 190° C. under a pressure of 2.9 Pa with an argon flow rate of 5 mL/min for 24 hours. As a result, a target white solid (0.64 g, at a collection rate of 56%) was obtained.

The protons ($^1$H) of the obtained white solid of 2,6tip2Py were measured by nuclear magnetic resonance (NMR) spectroscopy. The obtained values are shown below.

$^1$H NMR ($CDCl_3$, 300 MHz): δ=8.02 (d, J=8.1 Hz, 2H), 7.61 (t, J=8.1 Hz, 1H), 6.84 (d, J=1.5 Hz, 2H), 6.65 (d, J=1.5 Hz, 2H), 4.22-4.18 (m, 4H), 4.01 (t, J=6.0 Hz, 4H), 2.26-2.16 (m,4 H).

Reference Synthesis Example 5

In this reference synthesis example, a method for synthesizing 8,8'-(9,9'-spirobi[9H-fluoren]-2,7-diyl)bis(5,6,7,8-tetrahydroimidazo[1,2-a]pyrimidine) (abbreviation: 2,7tip2SF) represented by Structure Formula (113) below is described. The structure of 2,7tip2SF is shown below.

[Chemical Formula 36]

(113)

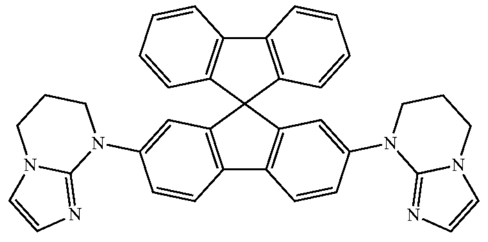

2,7tip2SF

<Synthesis of 2,7tip2SF>

To 2.6 g (5.5 mmol) of 2,7-dibromo-9,9'-spirobi-9H-fluorene, 1.7 g (16 mmol) of potassium tert-butoxide (abbreviation: KOtBu), 0.20 g (0.33 mmol) of (±)-2,2'-bis(diphenylphosphino)-1,1'-binaphthyl (abbreviation: rac-BINAP), and 52 mg (0.22 mol) of palladium(II) acetate (abbreviation: $Pd(OAc)_2$) in a 200 mL three-neck flask, 1.5 g (12 mmol) of 5,6,7,8-tetrahydroimidazo[1,2-a]pyrimidine was added, and the air in the flask was replaced with nitrogen. To this mixture, 19 mL of dehydrated toluene was added, the mixture in the flask was degassed under reduced pressure, and then the air in the flask was replaced with nitrogen. This mixture was stirred for eight hours while heated at 90° C., and then cooled down to room temperature. After the reaction, this reaction mixture was subjected to suction filtration to give a solid. The obtained solid was washed with methanol and chloroform for removing an insoluble matter. The obtained filtrate was concentrated under reduced pressure. The obtained solid was recrystallized from ethyl acetate and methanol to give a gray solid (1.2 g, in a yield of 39%). Synthesis scheme (s5-1) of 2,7tip2SF is shown below.

[Chemical Formula 37]

(s5-1)

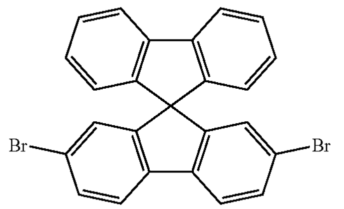

+

-continued

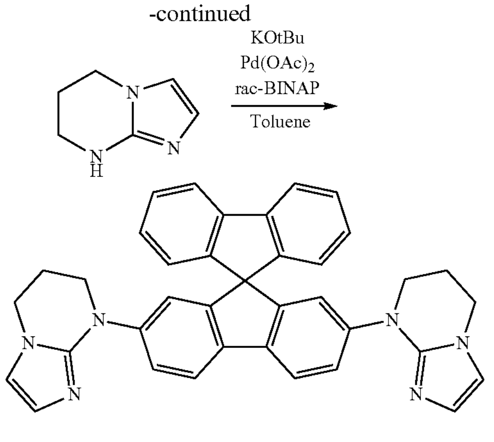

2, 7tip2SF
(113)

By a train sublimation method, 1.2 g of the obtained gray solid was purified by heating at 285° C. under a pressure of 3.1 Pa with an argon flow rate of 5 mL/min for 17 hours. As a result, a target pale yellow solid (0.33 g, at a collection rate of 28%) was obtained.

The protons ($^1$H) of the obtained pale yellow solid were measured by nuclear magnetic resonance (NMR) spectroscopy. The obtained values are shown below.

$^1$H NMR ($CDCl_3$, 300 MHz): δ=7.84-7.81 (m, 4H), 7.73 (d, J=7.9 Hz, 2H), 7.34 (td, J=7.5, 1.1 Hz, 2H), 7.10 (td, J=7.5, 1.1 Hz, 2H), 6.79 (d, J=7.9 Hz, 2H), 6.66 (d, J=2.0 Hz, 2H), 6.50 (d, J=1.5 Hz, 2H), 6.39 (d, J=2.0 Hz, 2H), 3.87 (t, J=6.0 Hz, 4H), 3.48 (t, J=5.7 Hz, 4H), 2.13-2.05 (m, 4H).

Reference Synthesis Example 6

In this reference synthesis example, a method for synthesizing an organic compound that can be used for one embodiment of the present invention is described. Specifically, a method for synthesizing 1,1'-(2',7'-di-tert-butyl-9,9'-spirobi[9H-fluorene]-2,7-diyl)bis(1,3,4,6,7,8-hexahydro-2H-pyrimido[1,2-a]pyrimidine) (abbreviation: 2',7'tBu-2,7hpp2SF) represented by Structure Formula (110) below is described. The structure of 2',7'tBu-2,7hpp2SF is shown below.

[Chemical Formula 38]

(110)

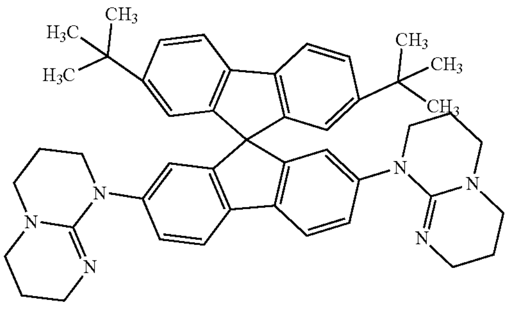

2',7'tBu-2,7hpp2SF

<Step 1: Synthesis of 2',7'tBu-2,7hpp2SF>

Into a 500 mL three-neck flask, 5.0 g (8.5 mmol) of 2,7-dibromo-2',7'-di-tert-butyl-9,9'-spirobi-9H-fluorene, 2.8 g (20 mmol) of 1,3,4,6,7,8-hexahydro-2H-pyrimido[1,2-a] pyrimidine, and 2.5 g (22 mmol) of potassium tert-butoxide were put, and the air in the flask was replaced with nitrogen. To this mixture, 200 mL of toluene was added, the mixture was degassed under reduced pressure, 0.50 g (0.80 mmol) of (±)-2,2'-bis(diphenylphosphino)-1,1'-binaphthyl (abbreviation: rac-BINAP) and 50 mg (0.22 mmol) of palladium(II) acetate were added to the mixture, and the mixture was stirred at 110° C. for seven hours under a nitrogen stream.

After stirring, 500 mL of toluene was added to the obtained mixture, heating was performed, and suction filtration was performed, whereby a filtrate was obtained. The obtained filtrate was concentrated to give a yellowish white solid. Ethyl acetate was added to this solid, and the mixture was irradiated with ultrasonic waves and then suction filtered to give 4.0 g of a target white solid as a residue in a yield of 66%. Synthesis scheme (s6-1) of Step 1 is shown below.

[Chemical Formula 39]

(s6-1)

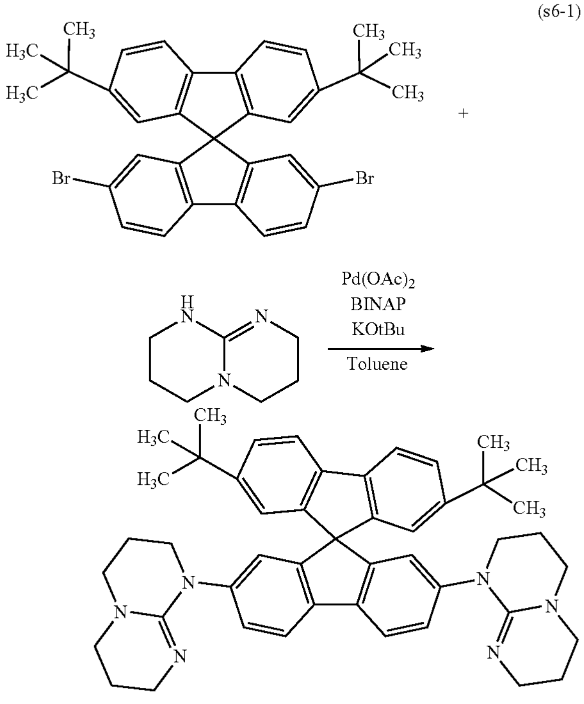

2', 7'tBu-2, 7 hpp2SF
(110)

By a train sublimation method, 3.8 g of the obtained white solid was purified. In the purification by sublimation, the white solid was heated at 285° C. under a pressure of 3.9 Pa for 15 hours. After the purification by sublimation, 2.8 g of a target white solid was obtained at a collection rate of 74%.

The protons ($^1H$) of the obtained white solid of 2',7'tBu-2,7hpp2SF were measured by nuclear magnetic resonance (NMR) spectroscopy. The obtained values are shown below.

$^1H$ NMR ($CD_2Cl_2$, 300 MHz): σ=7.74 (s, 2H), 7.72 (s, 2H), 7.43 (dd, J=1.8 Hz, 7.8 Hz, 2H), 7.34 (m, 2H), 6.75 (d, J=1.5 Hz, 2H), 6.40 (d, J=1.5 Hz, 2H), 3.31 (m, 4H), 3.14 (m, 12H), 1.96 (m, 4H), 1.79 (m, 4H), 1.17 (s, 18H).

Reference Synthesis Example 7

In this reference synthesis example, a method for synthesizing 8-(9,9'-spirobi[9H-fluoren]-2-yl)-5,6,7,8-tetrahydroimidazo[1,2-a]pyrimidine (abbreviation: tipSF) represented by Structure Formula (118) in Embodiment 1 is described. The structure of tipSF is shown below.

[Chemical Formula 40]

(118)

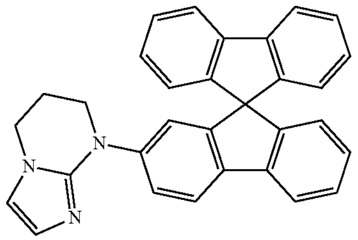

<Synthesis of tipSF>

Into a 300 mL three-neck flask, 18 g (46 mmol) of 2-bromo-9,9'-spirobi[9H-fluorene], 13 g (0.12 mol) of potassium tert-butoxide (abbreviation: KOtBu), 1.7 g (2.7 mmol) of (±)-2,2'-bis(diphenylphosphino)-1,1'-binaphthyl (abbreviation: rac-BINAP), and 7.0 g (57 mmol) of 5,6,7,8-tetrahydroimidazo[1,2-a]pyrimidine were put, and the air in the flask was replaced with nitrogen. To the mixture, 150 mL of dehydrated toluene was added, and this mixture was degassed by being stirred under reduced pressure. To this mixture, 0.41 g (1.8 mmol) of palladium(II) acetate (abbreviation: $Pd(OAc)_2$) was added, and the mixture was stirred at 90° C. for eight hours under a nitrogen stream. After stirring, the mixture was cooled down to room temperature. An insoluble matter was removed from the mixture by suction filtration, and the obtained filtrate was subjected to extraction with toluene. After that, the extracted solution was concentrated to give a residue. A small amount of toluene was added to the obtained residue, the mixture was irradiated with ultrasonic waves, and a solid was collected by suction filtration, whereby a target pale yellow solid (11 g, in a yield of 55%) was obtained. Synthesis scheme (s7-1) of tipSF is shown below.

[Chemical Formula 41]

(s7-1)

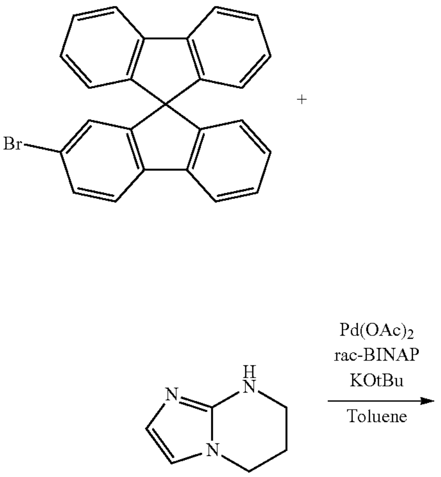

-continued

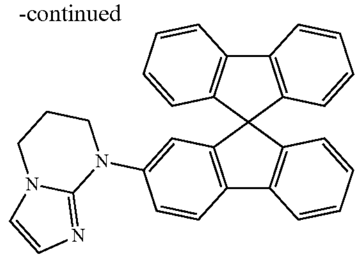

(118)

By a train sublimation method, 11 g of the obtained pale yellow solid was purified. In the purification by sublimation, the pale yellow solid was heated at 225° C. under a pressure of 6.0 Pa with an argon flow rate of 10 mL/min for 48 hours. As a result, a target white solid (6.7 g, at a collection rate of 61%) was obtained.

The $^{1}H$ NMR measurement result of tipSF after purification by sublimation is shown below. It is confirmed from the result that tipSF was obtained.

$^{1}H$ NMR ($CDCl_3$, 300 MHz): δ=7.92 (dd, J=8.4, J=2.4 Hz, 1H), 7.84-7.76 (m, 4H), 7.38-7.29 (m, 3H), 7.10 (td, J=7.5, J=0.9 Hz, 2H), 7.02 (td, J=7.5, J=0.6 Hz, 1H), 6.76 (d, J=7.2 Hz, 2H), 6.67-6.64 (m, 2H), 6.51 (sd, J=1.5 Hz, 1H), 6.45 (sd, J=1.8 Hz, 1H), 3.87 (t, J=6.15 Hz, 2H), 3.50 (t, J=5.7 Hz, 2H), 2.14-2.06 (m, 2H).

This application is based on Japanese Patent Application Serial No. 2022-075595 filed with Japan Patent Office on Apr. 29, 2022 and Japanese Patent Application Serial No. 2022-195407 filed with Japan Patent Office on Dec. 7, 2022, the entire contents of which are hereby incorporated by reference.

What is claimed is:

1. A method for manufacturing an organic EL device, comprising the steps of:

forming an organic compound film over a first electrode;

forming an organic mask film comprising an organic compound over the organic compound film;

forming an inorganic mask layer over the organic mask film;

forming an organic mask layer and an organic compound layer by processing shapes of the organic mask film and the organic compound film with the use of the inorganic mask layer; and removing at least parts of the inorganic mask layer and the organic mask layer with the use of water or a liquid comprising water as a solvent, wherein the organic compound is represented by General Formula (G1):

(G1)

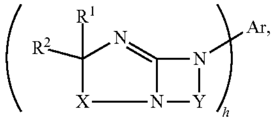

wherein X represents a group represented by General Formula (X1-1), wherein Y represents a group represented by General Formula (Y1-1), wherein each of $R^1$ and $R^2$ independently represents hydrogen, wherein h represents an integer of 1 to 6, and wherein Ar represents a substituted or unsubstituted aryl group having 6 to 75 carbon atoms in a ring or a substituted or unsubstituted heteroaryl group having 1 to 75 carbon atoms in a ring:

(X1-1)

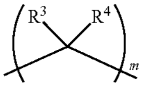

(Y1-1)

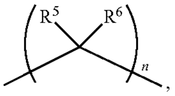

wherein each of $R^3$ to $R^6$ independently represents hydrogen, wherein m represents an integer of 0 to 4, wherein n represents an integer of 1 to 5, and wherein in the case where m or n is 2 or more, $R^3$s are the same or different from each other, and the same applies to $R^4$, $R^5$, and $R^6$.

2. The method for manufacturing an organic EL device according to claim 1, wherein the organic compound is represented by any one of General Formulae (G1-1) to (G1-9):

(G1-1)

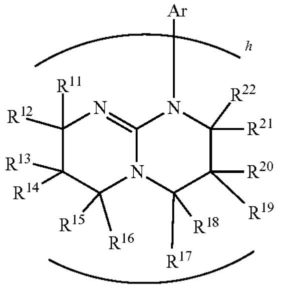

(G1-2)

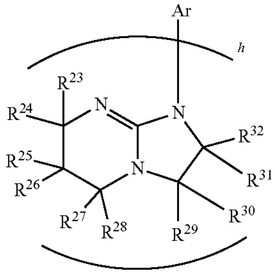

(G1-3)

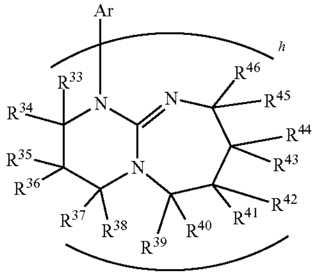

-continued (G1-4)

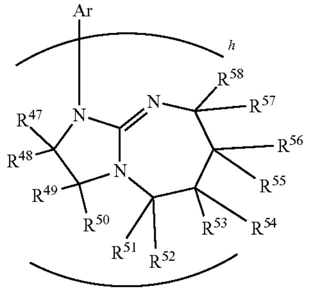

(G1-5)

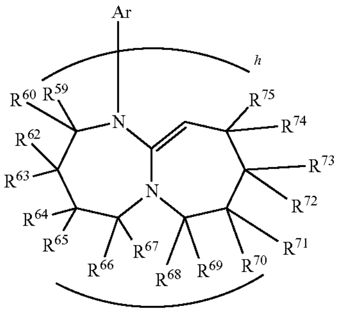

(G1-6)

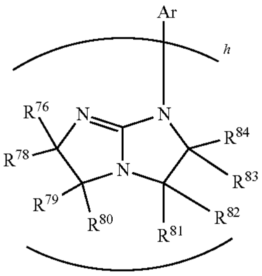

(G1-7)

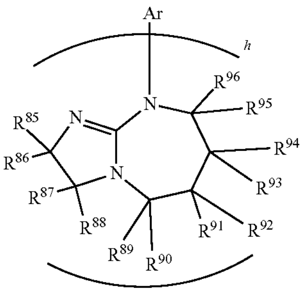

(G1-8)

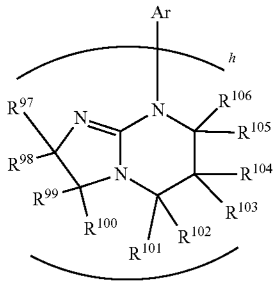

-continued (G1-9)

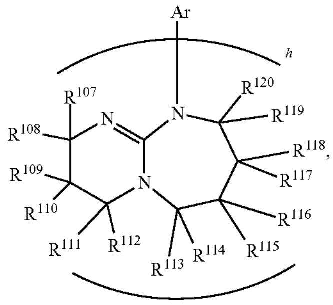

wherein each of $R^{11}$ to $R^{120}$ independently represents hydrogen, wherein h represents an integer of 1 to 6, and wherein Ar represents a substituted or unsubstituted aryl group having 6 to 75 carbon atoms in a ring or a substituted or unsubstituted heteroaryl group having 1 to 75 carbon atoms in a ring.

3. The method for manufacturing an organic EL device, according to claim 1, wherein the inorganic mask layer is formed by an ALD method.

4. The method for manufacturing an organic EL device, according to claim 1, wherein the organic mask layer is formed by a vacuum evaporation method.

5. The method for manufacturing an organic EL device, according to claim 1, wherein the organic compound layer has a stacked-layer structure, and wherein the organic compound layer comprises a hole-injection layer, a hole-transport layer, a light-emitting layer, and an electron-transport layer in this order from the first electrode side.

6. A method for manufacturing an organic EL device, comprising the steps of:

forming an organic compound film over a first electrode;

forming an organic mask film comprising an organic compound over the organic compound film;

forming an inorganic mask layer over the organic mask film;

forming an organic mask layer and an organic compound layer by processing shapes of the organic mask film and the organic compound film with the use of the inorganic mask layer; and removing at least parts of the inorganic mask layer and the organic mask layer with the use of water or a liquid comprising water as a solvent, wherein the organic compound is represented by General Formula (G2):

(G2)

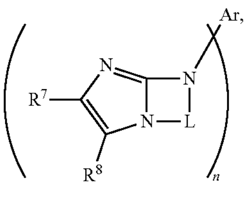

wherein Ar represents a substituted or unsubstituted aryl group having 6 to 30 carbon atoms in a ring or a substituted or unsubstituted heteroaryl group having 2 to 30 carbon atoms in a ring, wherein each of $R^7$ and $R^8$ independently represents any of hydrogen, a substituted or unsubstituted alkyl group having 1 to 6 carbon atoms, a substituted or unsubstituted amino group, a substituted or unsubstituted aryl group having 6 to 13 carbon atoms, and a substituted or unsubstituted heteroaryl group having 2 to 13 carbon atoms, wherein n represents an integer of 1 to 6, and wherein L is a group represented by General Formula (L1-1):

(L1-1)

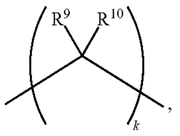

wherein each of $R^9$ and $R^{10}$ independently represents hydrogen or a substituted or unsubstituted alkyl group having 1 to 6 carbon atoms, wherein k represents an integer of 1 to 5, and wherein in the case where k is 2 or more, $R^9$s are the same or different from each other, and the same applies to $R^{10}$.

7. The method for manufacturing an organic EL device according to claim 6, wherein the organic compound is represented by any one of General Formulae (G2-1) to (G2-3):

(G2-1)

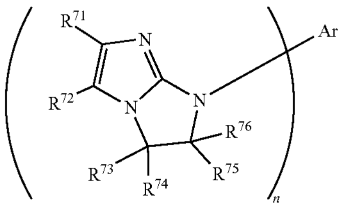

(G2-2)

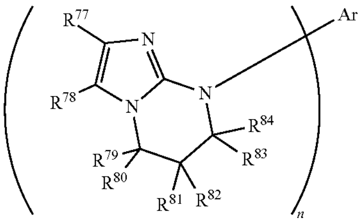

(G2-3)

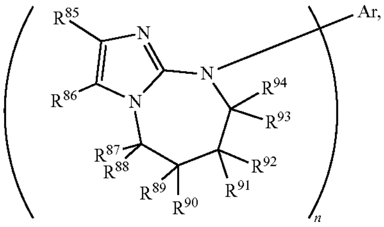

wherein Ar represents a substituted or unsubstituted aryl group having 6 to 30 carbon atoms in a ring or a substituted or unsubstituted heteroaryl group having 2 to 30 carbon atoms in a ring, wherein each of $R^{71}$ to $R^{94}$ independently represents hydrogen or a substituted or unsubstituted alkyl group having 1 to 6 carbon atoms, and wherein n represents an integer of 1 to 6.

8. The method for manufacturing an organic EL device, according to claim 6, wherein the inorganic mask layer is formed by an ALD method.

9. The method for manufacturing an organic EL device, according to claim 6, wherein the organic mask layer is formed by a vacuum evaporation method.

10. The method for manufacturing an organic EL device, according to claim 6, wherein the organic compound layer has a stacked-layer structure, and wherein the organic compound layer comprises a hole-injection layer, a hole-transport layer, a light-emitting layer, and an electron-transport layer in this order from the first electrode side.

11. A method for manufacturing an organic EL device, comprising the steps of:

forming an organic compound film over a first electrode;

forming an organic mask film comprising an organic compound over the organic compound film;

forming an inorganic mask film over the organic mask film;

forming a hard mask film over the inorganic mask film;

forming a hard mask layer and an inorganic mask layer by processing shapes of the hard mask film and the inorganic mask film by a lithography method;

forming an organic mask layer and an organic compound layer by processing shapes of the organic mask film and the organic compound film with the use of the hard mask layer and the inorganic mask layer;

removing the hard mask layer and at least part of the inorganic mask layer;

exposing the organic compound layer by removing at least parts of the organic mask layer and the inorganic mask layer with the use of water or a liquid comprising water as a solvent; and forming a second electrode over the organic compound layer, wherein the organic compound is represented by General Formula (G1):

(G1)

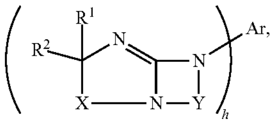

wherein X represents a group represented by General Formula (X1-1), wherein Y represents a group represented by General Formula (Y1-1), wherein each of $R^1$ and $R^2$ independently represents hydrogen, wherein h represents an integer of 1 to 6, and wherein Ar represents a substituted or unsubstituted heteroaryl group having 1 to 75 carbon atoms in a ring or a substituted or unsubstituted aryl group having 6 to 75 carbon atoms in a ring:

(X1-1)

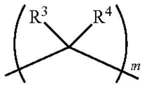

(Y1-1)

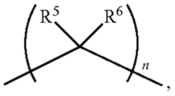

wherein each of $R^3$ to $R^6$ independently represents hydrogen, wherein m represents an integer of 0 to 4, wherein n represents an integer of 1 to 5, and wherein in the case where m or n is 2 or more, $R^3$s are the same or different from each other, and the same applies to $R^4$, $R^5$, and $R^6$.

12. The method for manufacturing an organic EL device according to claim 11, wherein the organic compound is represented by General Formula (G2):

(G2)

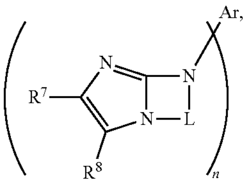

wherein Ar represents a substituted or unsubstituted aryl group having 6 to 30 carbon atoms in a ring or a substituted or unsubstituted heteroaryl group having 2 to 30 carbon atoms in a ring, wherein each of $R^7$ and $R^8$ independently represents hydrogen, a substituted or unsubstituted alkyl group having 1 to 6 carbon atoms, a substituted or unsubstituted amino group, a substituted or unsubstituted aryl group having 6 to 13 carbon atoms, or a substituted or unsubstituted heteroaryl group having 2 to 13 carbon atoms, wherein n represents an integer of 1 to 6, and wherein L represents a group represented by General Formula (L1-1):

(L1-1)

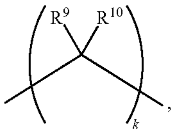

wherein each of $R^9$ and $R^{10}$ independently represents hydrogen or a substituted or unsubstituted alkyl group having 1 to 6 carbon atoms, wherein k represents an integer of 1 to 5, and wherein in the case where k is 2 or more, $R^9$s are the same or different from each other, and the same applies to $R^{10}$.

13. The method for manufacturing an organic EL device, according to claim 11, wherein the hard mask layer is formed by a sputtering method.

14. The method for manufacturing an organic EL device, according to claim 11, wherein the inorganic mask layer is formed by an ALD method.

15. The method for manufacturing an organic EL device, according to claim 11, wherein the organic mask layer is formed by a vacuum evaporation method.

16. The method for manufacturing an organic EL device, according to claim 11, wherein the organic compound layer has a stacked-layer structure, and wherein the organic compound layer comprises a hole-injection layer, a hole-transport layer, a light-emitting layer, and an electron-transport layer in this order from the first electrode side.

* * * * *